United States Patent [19]

Nishimura et al.

[11] Patent Number: 5,004,671
[45] Date of Patent: Apr. 2, 1991

[54] OPTICAL RECORDING MEDIUM AND OPTICAL RECORDING METHOD

[75] Inventors: Yukuo Nishimura, Sagamihara; Ken Eguchi, Atsugi; Haruki Kawada, Atsugi; Yoshinori Tomida, Atsugi; Takashi Nakagiri, Tokyo; Kenji Saito, Tokyo; Toshiaki Kimura, Sagamihara; Hiroshi Matsuda, Atsugi; Kunihiro Sakai, Yamato; Toshihiko Miyazaki, Atsugi, all of Japan

[73] Assignee: Canon Kabushiki Kaisha, Tokyo, Japan

[21] Appl. No.: 287,551

[22] Filed: Dec. 20, 1988

Related U.S. Application Data

[63] Continuation of Ser. No. 899,909, Aug. 25, 1986, abandoned.

[30] Foreign Application Priority Data

| Aug. 27, 1985 | [JP] | Japan | 60-187735 |
|---|---|---|---|
| Aug. 27, 1985 | [JP] | Japan | 60-187737 |
| Aug. 27, 1985 | [JP] | Japan | 60-187739 |
| Dec. 3, 1985 | [JP] | Japan | 60-270786 |
| Dec. 3, 1985 | [JP] | Japan | 60-270789 |
| Dec. 4, 1985 | [JP] | Japan | 60-271349 |
| Dec. 13, 1985 | [JP] | Japan | 60-281636 |
| Dec. 13, 1985 | [JP] | Japan | 60-281637 |
| Dec. 13, 1985 | [JP] | Japan | 60-281638 |
| Dec. 16, 1985 | [JP] | Japan | 60-282211 |
| Dec. 16, 1985 | [JP] | Japan | 60-282213 |
| Dec. 25, 1985 | [JP] | Japan | 60-290483 |
| Dec. 25, 1985 | [JP] | Japan | 60-290484 |
| Dec. 25, 1985 | [JP] | Japan | 60-290487 |
| Dec. 25, 1985 | [JP] | Japan | 60-290488 |
| Dec. 26, 1985 | [JP] | Japan | 60-291902 |
| Dec. 26, 1985 | [JP] | Japan | 60-291904 |
| Dec. 26, 1985 | [JP] | Japan | 60-291905 |
| Jan. 8, 1986 | [JP] | Japan | 61-675 |
| Jan. 9, 1986 | [JP] | Japan | 61-1332 |
| Jan. 13, 1986 | [JP] | Japan | 61-3675 |
| Jan. 14, 1986 | [JP] | Japan | 61-4175 |
| Jan. 20, 1986 | [JP] | Japan | 61-7839 |
| Jan. 20, 1986 | [JP] | Japan | 61-7840 |
| Jan. 29, 1986 | [JP] | Japan | 61-15859 |

[51] Int. Cl.$^5$ .................. G03F 7/025; G03C 1/72; G03C 5/16

[52] U.S. Cl. .................. 430/286; 430/944; 430/945; 430/495; 430/281; 430/327; 430/270; 430/394; 369/284; 369/285; 346/76 R; 346/76 PH; 346/76 L; 346/135.1

[58] Field of Search ............... 430/944, 945, 495, 286, 430/281, 327, 270, 394; 369/284, 285; 346/76 R, 76 PH, 76 L, 135.1

[56] References Cited

U.S. PATENT DOCUMENTS

| 3,772,028 | 11/1973 | Fico et al. | 430/495 |
|---|---|---|---|
| 4,215,208 | 7/1980 | Yee et al. | 526/285 |
| 4,247,613 | 1/1981 | Ott | 430/286 X |
| 4,439,514 | 3/1984 | Garito | 430/272 |
| 4,536,450 | 8/1985 | Garito | 428/411.1 |
| 4,547,444 | 10/1985 | Bell et al. | 430/945 X |
| 4,562,141 | 12/1985 | Tieke | 430/281 |
| 4,565,761 | 1/1986 | Katagiri et al. | 430/945 X |
| 4,678,736 | 7/1987 | Hanamura et al. | 430/21 X |

FOREIGN PATENT DOCUMENTS

| 0125246 | 7/1983 | Japan | 430/945 X |
|---|---|---|---|
| 0217391 | 12/1983 | Japan | 430/945 X |

Primary Examiner—Cynthia Hamilton
Attorney, Agent, or Firm—Fitzpatrick, Cella, Harper & Scinto

[57] ABSTRACT

An optical recording medium is provided which comprises a diacetylene derivative compound and at least one compound selected from the group consisting of azulenium salt compounds, pyrylium dyes, diene compounds, croconic methines, and polymethine compounds. An optical recording method is also provided which comprises a step of writing by irradiating with a radiation ray corresponding to a recording information an optical recording medium comprising a polydiacetylene derivative compound and a compound selected from the above-mentioned group.

52 Claims, 3 Drawing Sheets

OPTICAL RECORDING MEDIUM AND OPTICAL RECORDING METHOD

This application is a continuation of application Ser. No. 899,909 filed Aug. 25, 1986, abandoned.

BACKGROUND OF THE INVENTION

1. Field of the Invention

This invention relates to an optical recording medium containing a diacetylene compound and at least one compound selected from the group consisting of auzlenium salt compounds, pyrylium dyes, diene compounds, croconic methine compounds, and polymethine compounds, and to a recording method employing said optical recording medium, particularly to an optical recording medium suitable for optical writing with a radiation and further to an optical recording method by use thereof.

2. Description of the Related Art

Recently, optical discs are of interest among office automations. Since optical discs are capable of recording and storing a large amount of documents and literature in one sheet, documents in an office can be pigeonholed or managed with good efficiency. Various recording media have been investigated for such an optical disc, and those utilizing organic materials are attracting attention because of low price and ease in manufacture.

As such an organic material for recording medium, a diacetylene compound has been known and a recording technique employing said compound for a laser recording medium by utilizing the thermal color change property of said compound is disclosed in Japanese Laid-open Patent Publication No. 14780/1981. However, in this specification, there is no description about what kind of laser has been employed or has to be used, but there is only a description that recording was performed by use of a laser.

The present inventors have investigated about laser recording of the diacetylene compound by use of various kinds of laser and consequently confirmed that, while thermal color change recording may be feasible by use of a large scale and high output laser such as argon laser, etc., no laser recording is practicable when a semiconductor laser of small model and relatively low output (wavelength: 800 to 850 nm) was used. However, a practical recording medium of an optical disc, etc. is desired to have a capability of optical writing with a semiconductor laser of small size and low output.

Further, the recording layer of the prior art comprising the diacetylene compound as described above is formed by use of fine crystalline powder of the diacetylene compound, and hence the molecules of the diacetylene compound are randomly oriented within the recording layer, whereby such inconveniences may be caused that light transmittance or reflectivity may vary the degree of the chemical reactions may vary depending on the position on the medium. Thus, it cannot necessarily be suitable for high density recording of good quality.

SUMMARY OF THE INVENTION

The present invention has been accomplished for solving the problems of the prior art as described above, and an object of the present invention is to provide an optical recording medium and an optical recording medium capable of optical recording with a small scale and light weight semiconductor laser.

Another object of the present invention is to provide an optical recording medium and an optical recording method which enables high speed recording at high density, high sensitivity and high resolution.

Still another object of the present invention is to provide an optical recording medium and an optical recording method which can give optically recorded images having excellent stability and high quality.

According to an aspect of the present invention, there is provided an optical recording medium, comprising a diacetylene derivative compound and at least one compound selected from the group consisting of azulenium salt compounds, pyrylium dyes or diene compounds, croconic methines, and polymethine compounds (hereinafter called the group B).

According to another aspect of the present invention, there is provided an optical recording method, comprising a step of writing by irradiating with a radiation ray corresponding to a recording information an optical recording medium comprising a polydiacetylene derivative compound and a compound selected from the group B.

DETAILED DESCRIPTION OF THE EMBODIMENTS OF THE INVENTION

Figure 1:
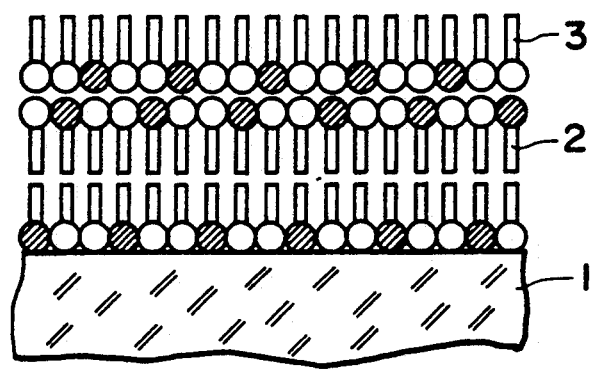
FIG. 1, FIG. 2 and FIG. 3 are schematic sectional views of typical embodiment of the optical recording medium of the present invention.

The optical recording medium of the present invention is an optical recording medium comprising a diacetylene derivative compound and at least one compound selected from the group consisting of azulenium salt compounds or pyrylium dyes, or diene compounds, or croconic methines, or polymethilene compounds. Preferably, an optical recording medium in good condition can be given when the diacetylene derivative compound in a form of a Langmuir-Blodgett film. Also, the present invention resides in an optical recording method, comprising a step of writing by irradiating with radiation corresponding to a recording information the optical recording medium comprising a polydiacetylene derivative which is formed by irradiation of a radiation ray for polymerization on a diacetylene derivative compound or which is originally as such.

The diacetylene derivative compound having a hydrophilic site and a hydrophobic site in combination to be used in the present invention (hereinafter called briefly as DA compound) is a compound capable of 1,4-addition polymerization reaction between the $C\equiv C-C\equiv C-C$ functional groups in the adjacent molecules, and may typically include the compounds represented by the following formula:

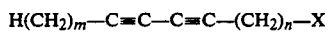

(wherein X represents a hydrophilic radical for forming a hydrophilic site, and m and n represent integers).

Examples of the hydrophilic radical X in the above DA compounds include carboxyl, amino, hydroxyl, nitrile, thioalcohol, imino, sulfonic acid, sulfinyl group or metal salts or amine salts thereof. The alkyl group represented by $H(CH_2)_m-$ for forming the hydrophobic site may preferably a long chain alkyl group having 1 to 30 carbon atoms. Also, n+m may be preferably an integer of 10 to 30.

On the other hand, the above azulenium salt compounds (hereinafter called briefly as AZ compounds) are compounds having absorption spectral peak in the wavelength region of 750 nm or longer and generate heat by infrared light of this wavelength.

The above AZ compounds can be classified broadly into the three kinds as shown below.

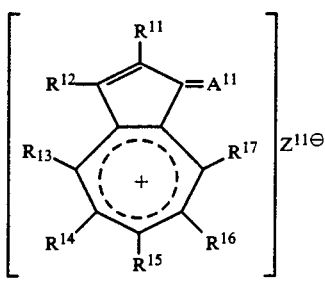
1-1

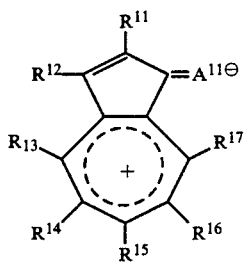
1-2

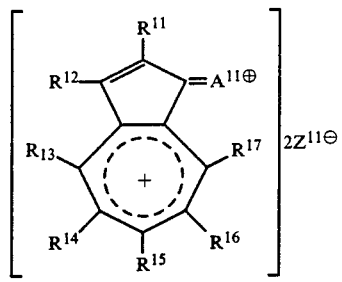
1-3

In the compound shown by the formulae 1-1 to 1-3, each of $R^{11}$ to $R^{17}$ represents a hydrogen atom, a halogen atom or a monovalent organic radical.

Examples of the monovalent organic radical may include alkyl, alkoxy, substituted or unsubstituted aryl, acyl, substituted or unsubstituted amino, nitro, hydroxy, carboxyl, cyano or substituted or unsubstituted arylazo radicals.

$A^{11}$ represents a divalent organic radical bonded through a double bond as shown in the following specific examples.

$Z^{11\ominus}$ represents an amionic radical such as perchlorate, fluoroborate, p-toluenesulfonate, periodide, chloride, bromide or iodide.

Specific examples of the AZ compounds to be used in the present invention are set forth below.

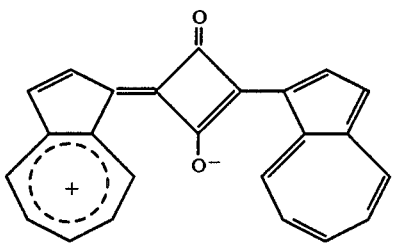
1-4

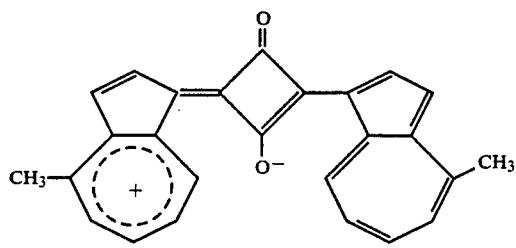
1-5

-continued
1-6
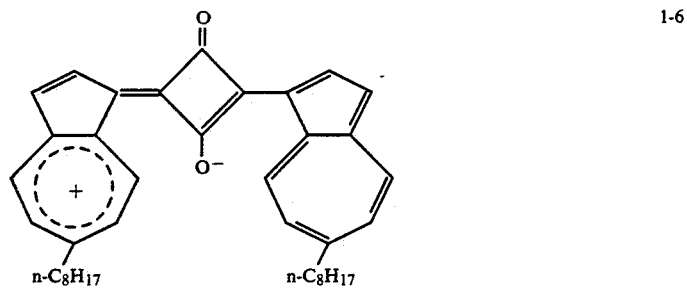
1-7
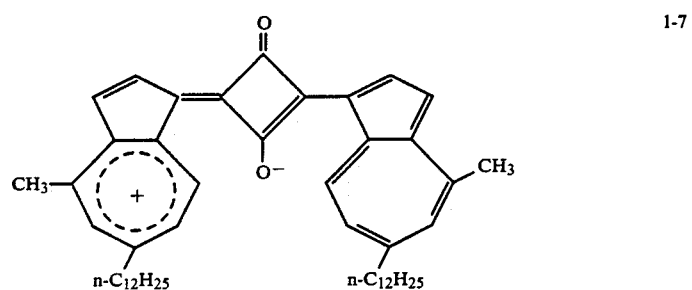
1-8
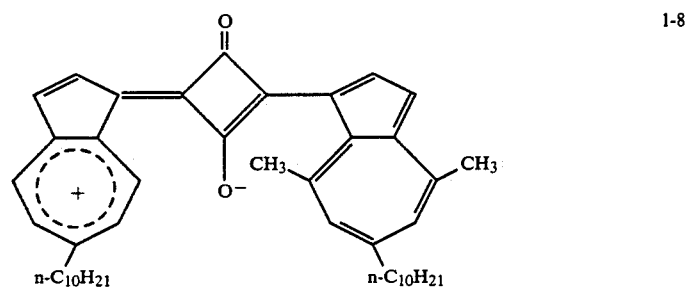
1-9
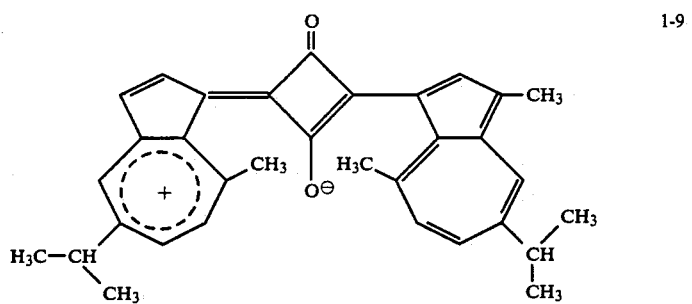
1-10
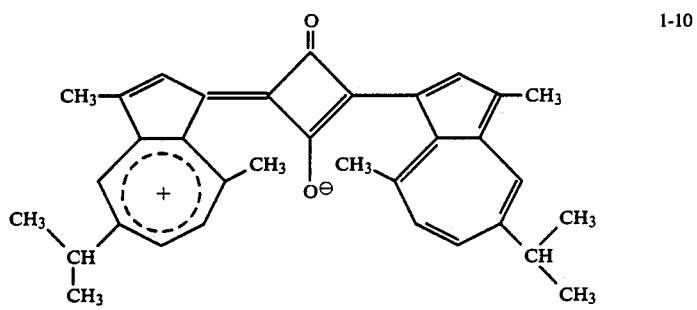

-continued
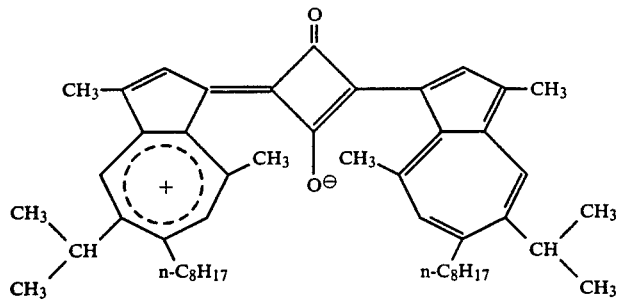
1-11
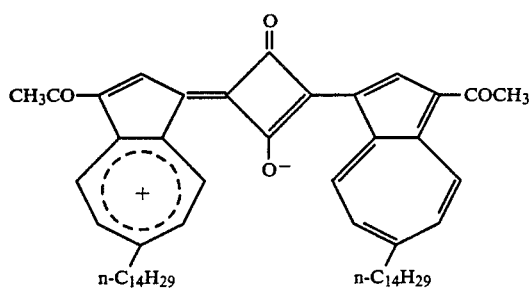
1-12
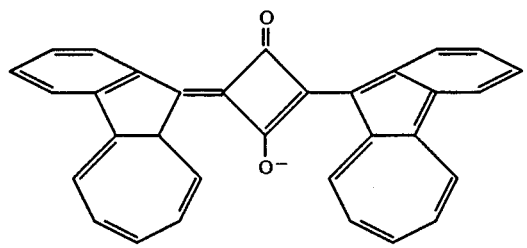
1-13
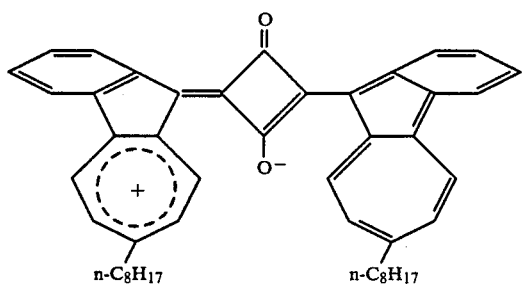
1-14
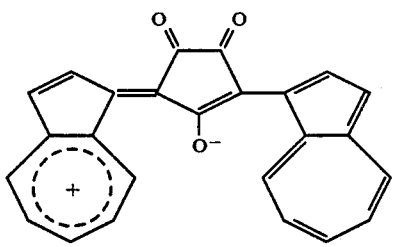
1-15
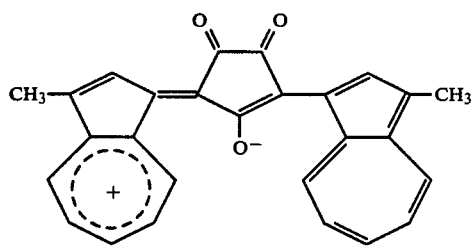
1-16

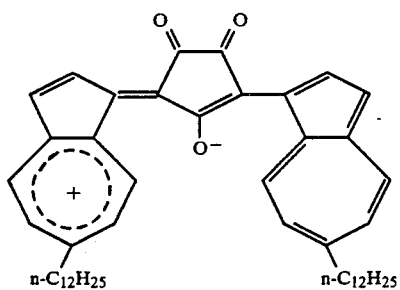
1-17
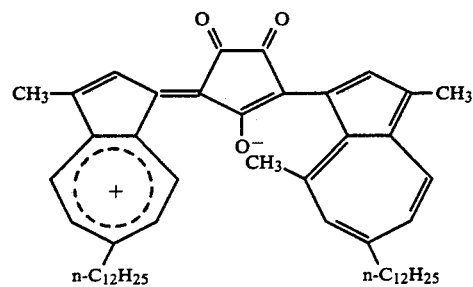
1-18
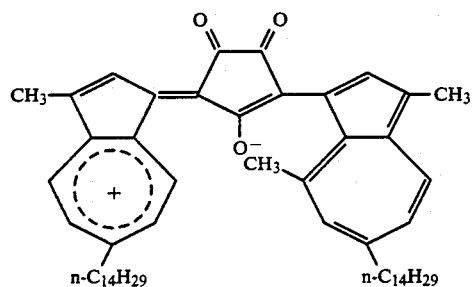
1-19
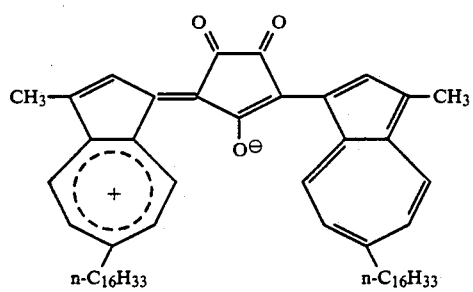
1-20
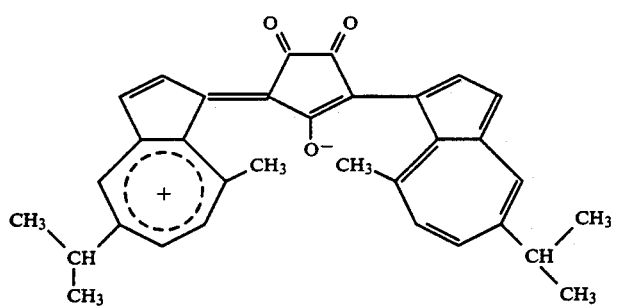
1-21
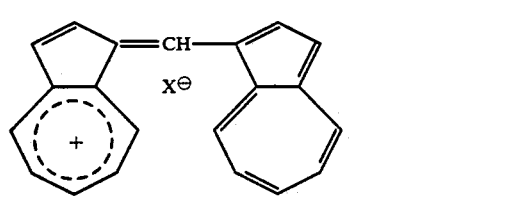
1-22
($X^\ominus$ may be $ClO_4^\ominus$ or $I^\ominus$)

-continued
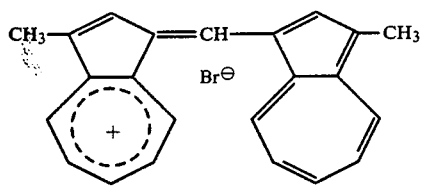
1-23
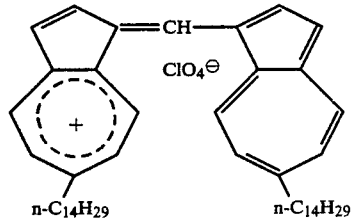
1-24
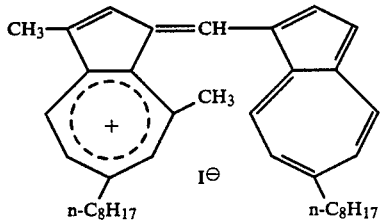
1-25
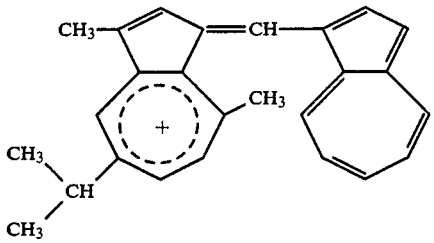
1-26
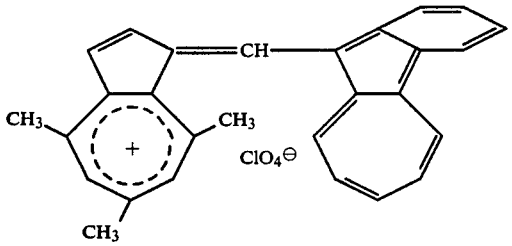
1-27
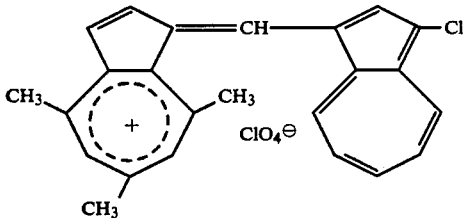
1-28
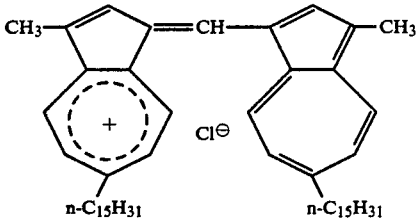
1-29

-continued
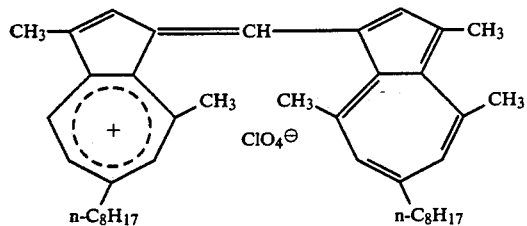
1-30
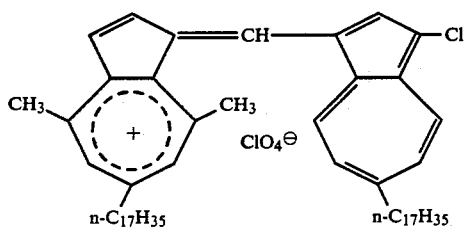
1-31
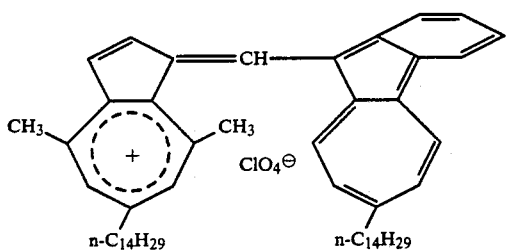
1-32
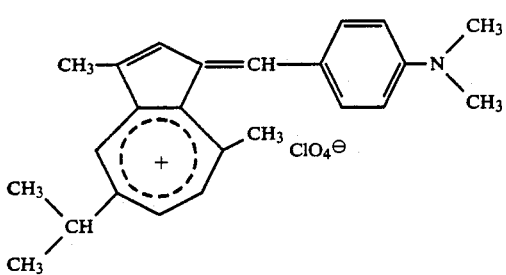
1-33
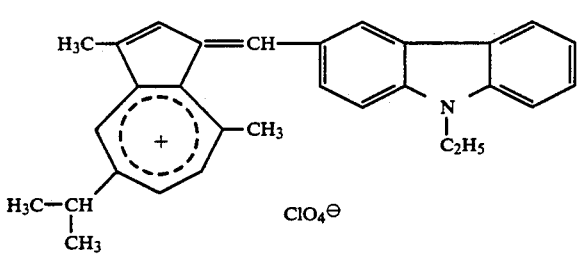
1-34
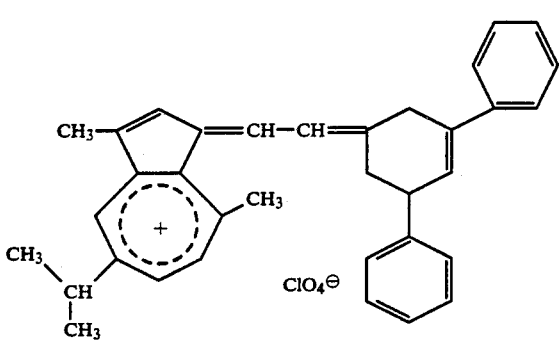
1-35

-continued
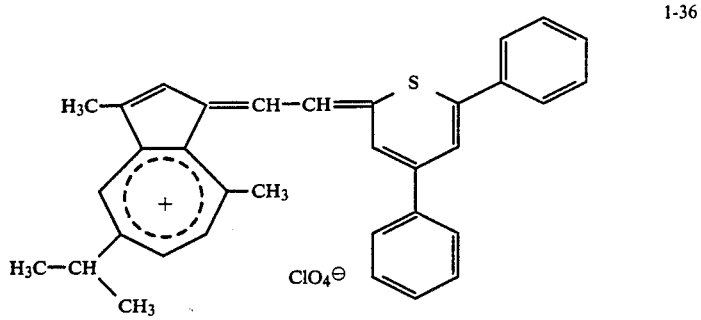
1-36
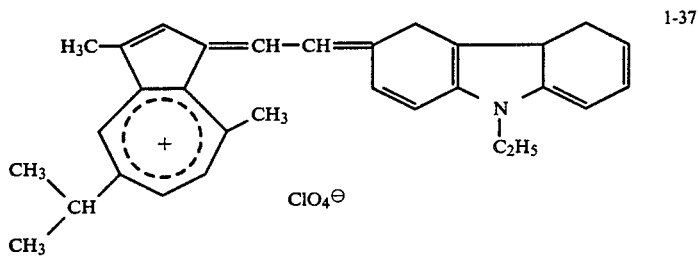
1-37
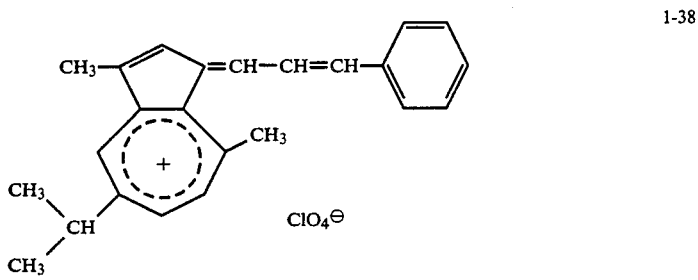
1-38
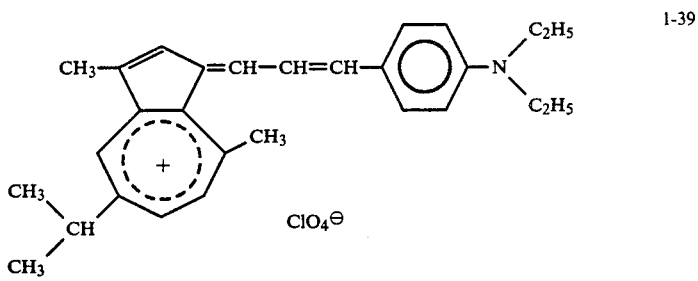
1-39
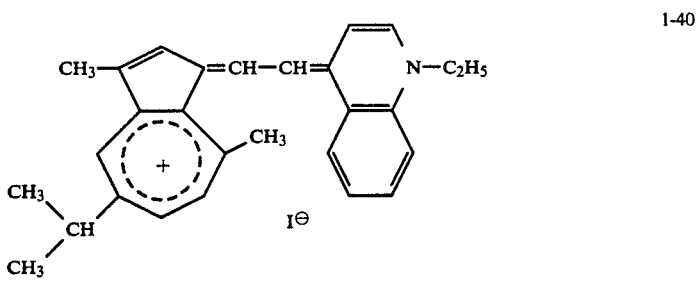
1-40
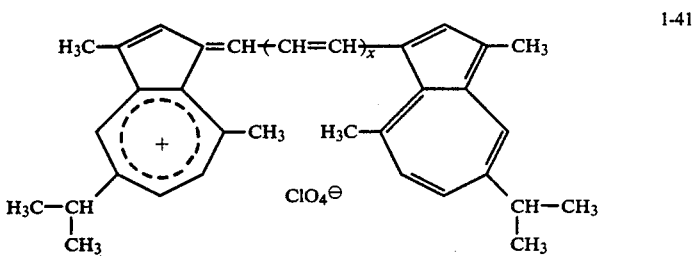
1-41
x is an integer of 1 or more 1-42

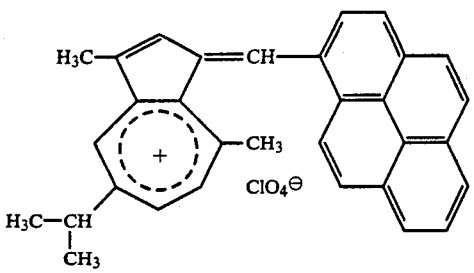

The pyrylium dyes, thiopyrylium dyes and selenapyrylium dyes (hereinafter called briefly as pyrylium dyes) are compounds represented by the following basic structure, having absorption peak at 780–900 nm, which can generate heat by infrared rays of this wavelength:

Basic structure:

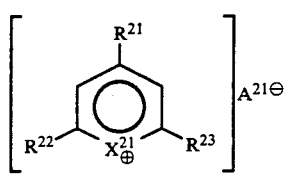

(wherein $X^{21}$ represents an oxygen atom, a sulfur atom or selenium atom, $R^{21}$, $R^{22}$ and $R^{23}$ represent various organic radicals and $A^{21}$ represents an anion). Typical examples of the pyrylium dyes are represented by the following formulae 2-1 to 2-3:

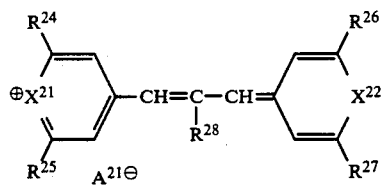

Formula 2-1

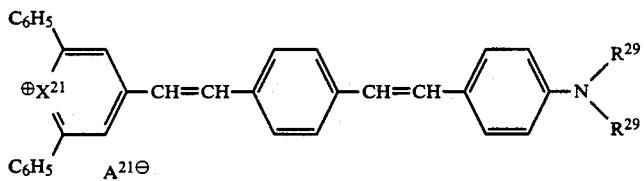

Formula 2-2

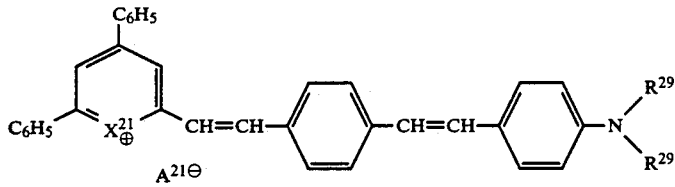

Formula 2-3

(wherein $R^{24}$, $R^{25}$, $R^{26}$ and $R^{27}$ represent substituted or unsubstituted aryl radicals such as phenyl, tolyl, xylyl, chlorophenyl, methoxyphenyl and the like or substituted or unsubstituted heterocyclic radicals such as 2-pyridyl, 3-pyridyl, 2-furyl, 2-thienyl, 2-thiazolyl, 3-carbazolyl, 2-quinolyl, 3-quinolyl, 2-imidazolyl, 2-lepidyl, 3-methoxy-2-pyridyl, 6-methyl-2-pyridyl, 4,5-dimethyl-2-thiazolyl, 4,5-diphenyl-2-thiazolyl, 4-phenyl-2-thiazolyl, 9-ethyl-3-carbazolyl, and the like, at least one of $R^{24}$, $R^{25}$, $R^{26}$ and $R^{27}$ representing substituted or unsubstituted heterocyclic radical; $R^{28}$ represents a hydrogen atom, an alkyl such as methyl, ethyl, propyl, butyl, etc., or substituted or unsubstituted aryl radical such as phenyl, tolyl, xylyl, chlorophenyl, methoxyphenyl, etc.; $R^{29}$ represents methyl or ethyl; $X^{21}$ and $X^{22}$ represent hydrogen atom, sulfur atom or selenilum atom; $A^{21}$ represent an anion such as chloride, bromide, iodide, perchlorate, benzenesulfonate, p-toluenesulfonate, methylsulfate, ethylsulfate, propylsulfate, etc.).

Specific examples of these pyrylium dyes are set forth below. For the purpose of convenience, anions were represented all by perchlorates.

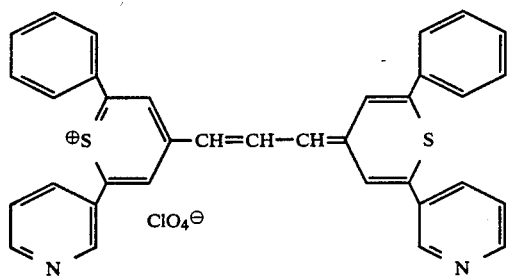
2-4
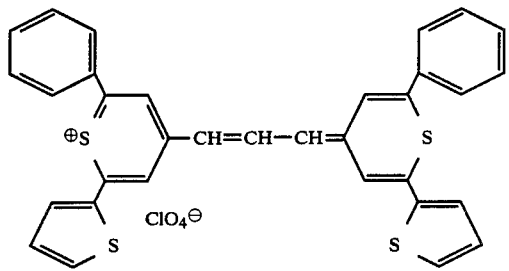
2-5
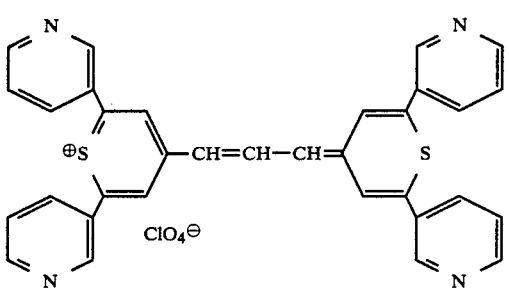
2-6
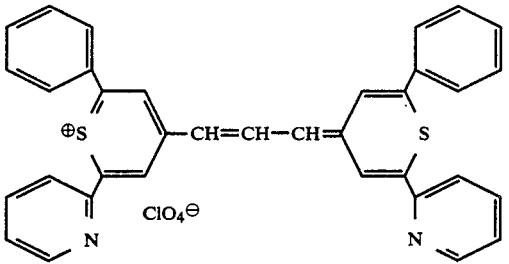
2-7
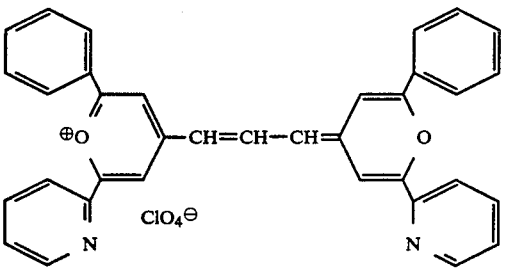
2-8

2-9
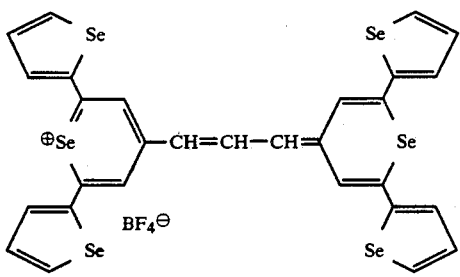
2-10
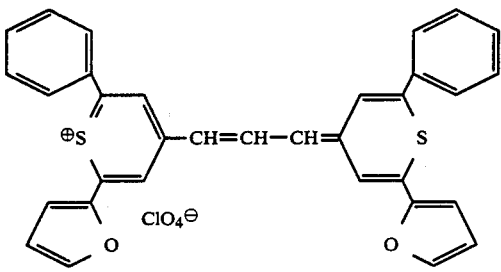
2-11
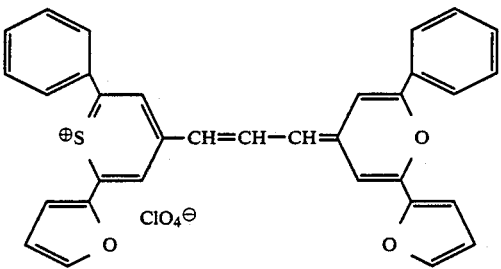
2-12
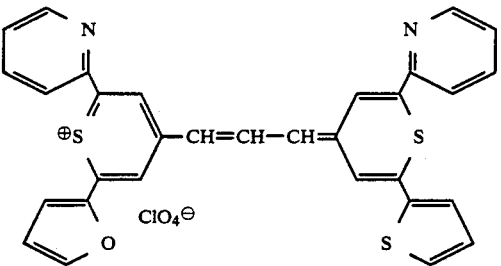
2-13
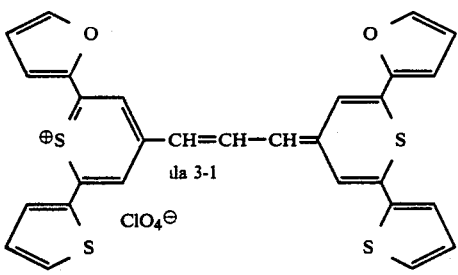
2-14
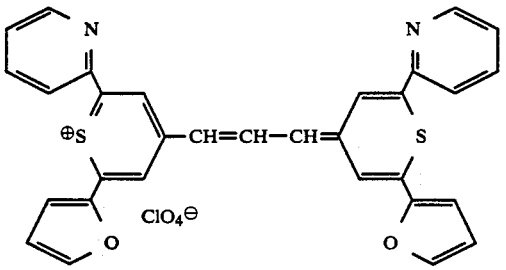

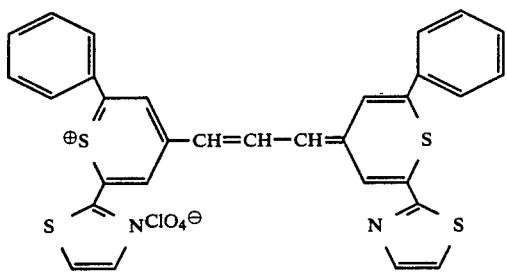
2-15
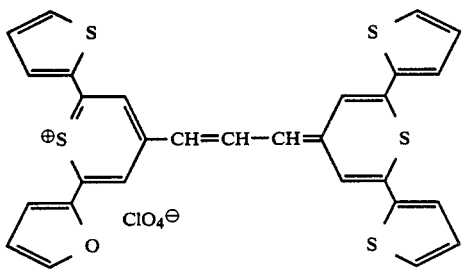
2-16
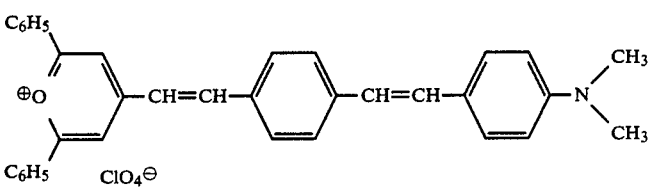
2-17
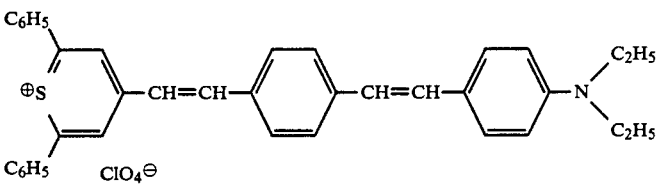
2-18
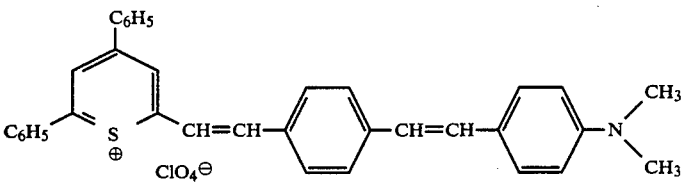
2-19
The above diene compound salts to be used in the present invention are compounds having absorption peak in the wavelength region of 750 nm or longer which can generate heat by infrared ray of this wavelength, as represented by the following formula 3-1 or 3-2:
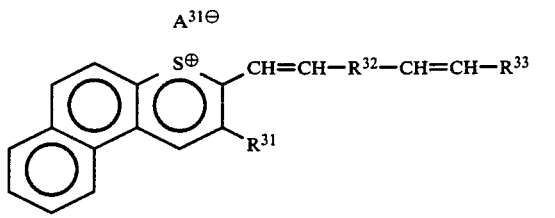
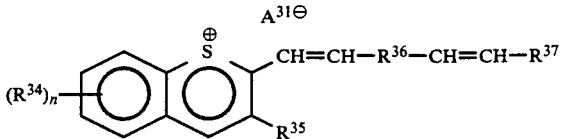

To describe in more detail about the diene compound salts, in the formulae 3-1 and 3-2, $R^{31}$ represents an alkyl radical such as methyl, ethyl, propyl, isopropyl, butyl, hexyl, etc., or a phenyl radical or a styryl radical which may have substituent. Here, examples of the substituent may include alkoxy radicals such as methoxy, ethoxy, butoxy, etc.; halogen atoms such as chlorine, bromine, iodine, etc.; alkyl radicals such as methyl, ethyl, propyl, isopropyl, etc.; and nitro radical. $R^{32}$ and $R^{36}$ each represent and arylene radical which may have substituent for forming a conjugated double bond system with the two —CH=CH— groups adjacent thereto such as p-phenylene, 1,4-naphthylene, etc. Here, examples of the substituent may include halogen atoms such as chlorine, bromine, iodine, etc.; alkyl radicals such as methyl, ethyl, etc.; and alkoxy radicals such as methoxy, ethoxy, etc. $R^{33}$ and $R^{37}$ each represent a phenyl radical or a naphthyl radical which may have substituent. Examples of the substituent may include substituted amino radicals such as dimethylamino, diethylamino, dipropylamino, dibutylamino, diphenylamino, phenylamino, phenylbenzylamino, phenylethylamino, etc.; cyclic amino radical such as morpholino, piperidinyl, pyrrolidino, etc.; and alkoxy radical such as methoxy, ethoxy, butoxy, etc. $R^{34}$ represents an alkoxy radical such as methoxy, ethoxy, butoxy, etc. $R^{35}$ represents an alkyl radical such as methyl, ethyl, propyl, isopropyl, butyl, hexyl, etc. $A^{31\ominus}$ represents an anion, including for example: $BF_4^{\ominus}$, $ClO_4^{\ominus}$, $CF_3COO^{\ominus}$, $PF_6^{\ominus}$, $Cl^{\ominus}$, $Br^{\ominus}$, $I^{\ominus}$, $ClSO_3^{\ominus}$, $CH_3SO_3^{\ominus}$, $C_2H_5SO_3^{\ominus}$, $C_3H_7SO_3^{\ominus}$, $C_4H_9SO_3^{\ominus}$, $C_5H_{11}SO_3^{\ominus}$, $C_6H_{13}SO_3^{\ominus}$, $CH_3CHClSO_3^{\ominus}$, $ClCH_2CH_2SO_3^{\ominus}$,

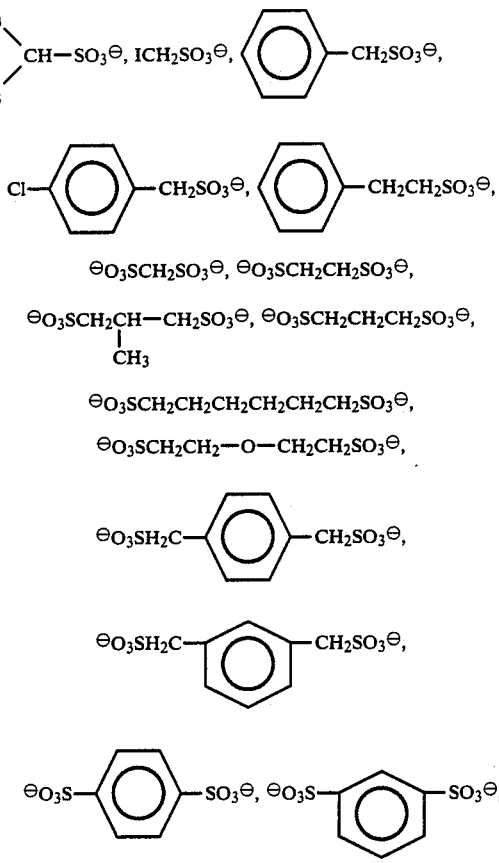

Specific examples of the diene compounds are shown below.

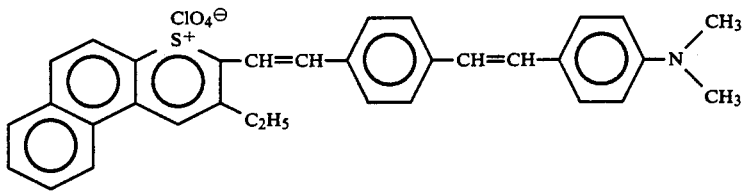

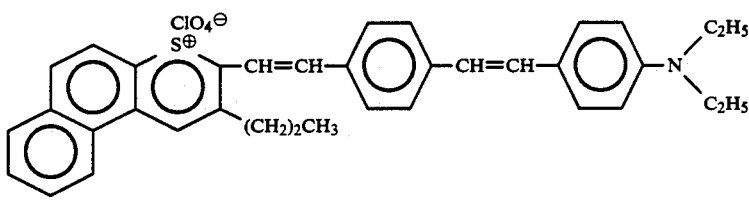

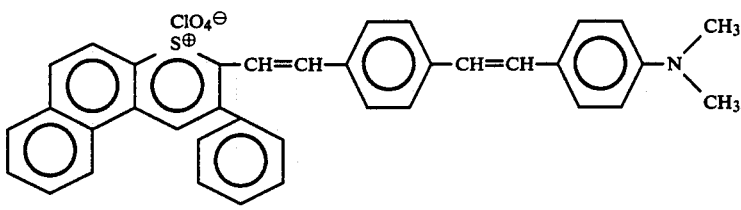

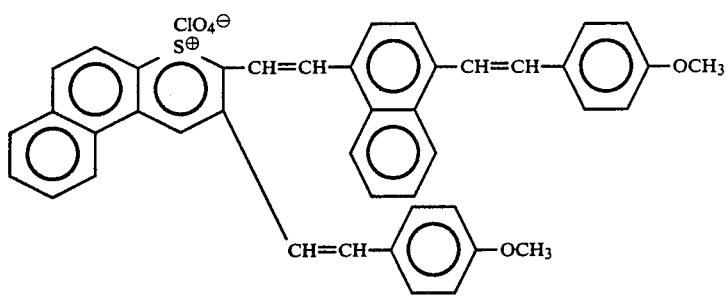
3-6
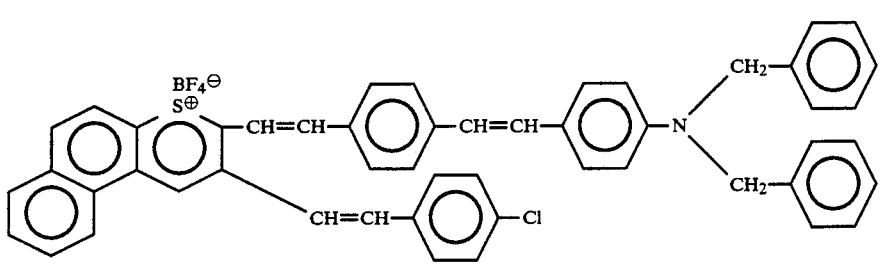
3-7
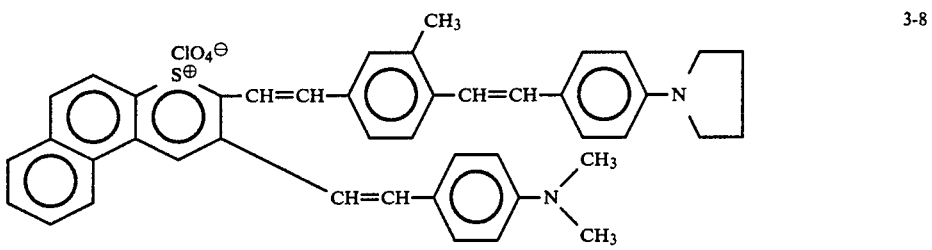
3-8
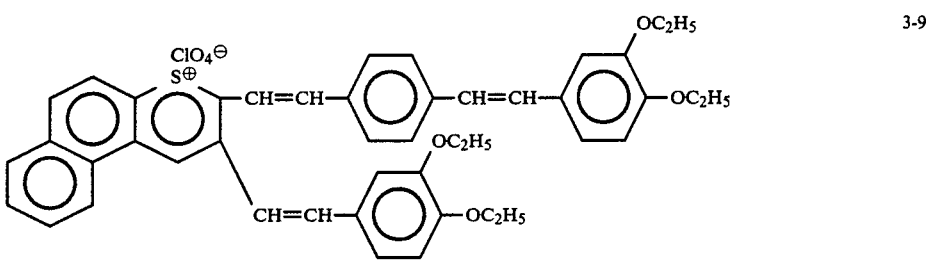
3-9
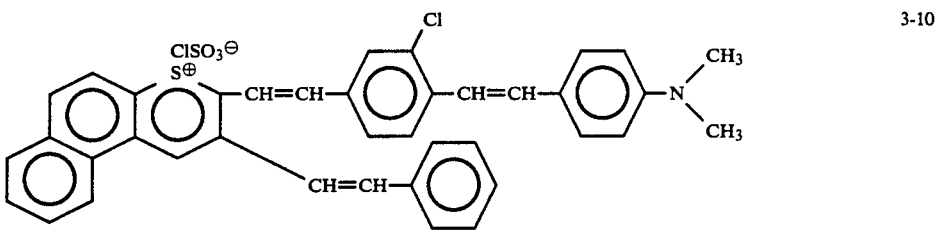
3-10
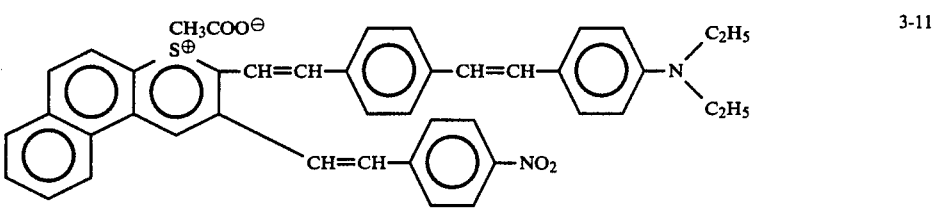
3-11

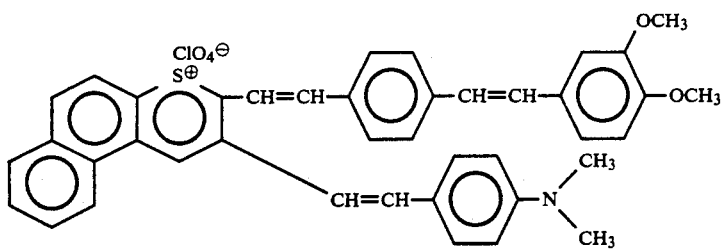
3-12
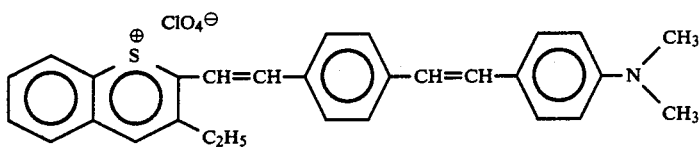
3-13
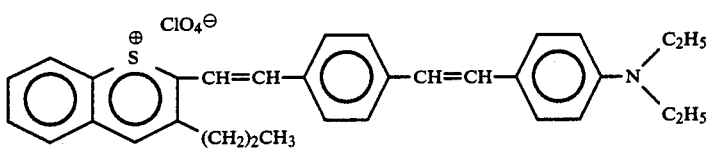
3-14
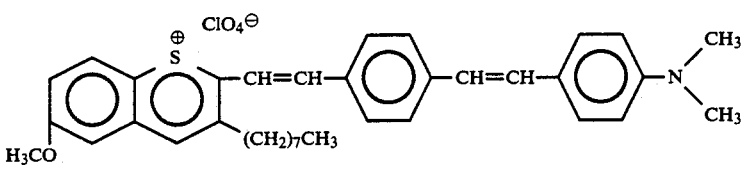
3-15
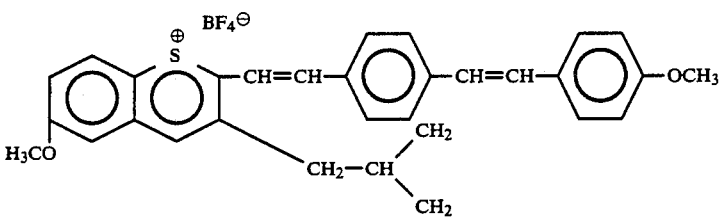
3-16
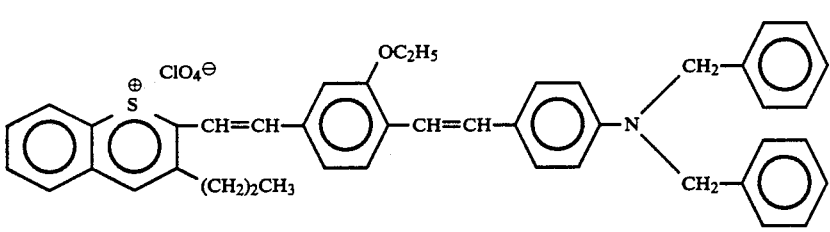
3-17
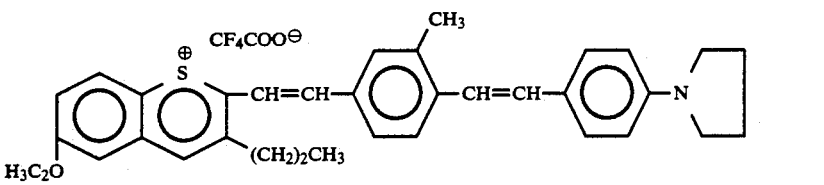
3-18
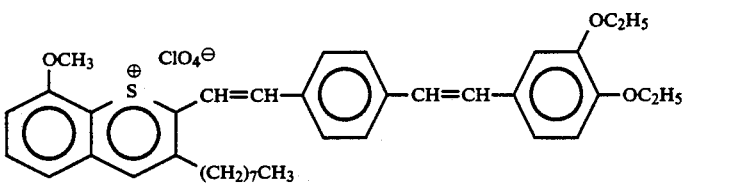
3-19

-continued

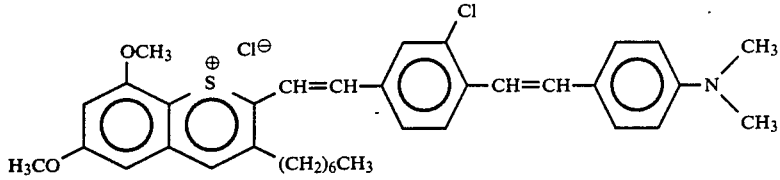
3-20

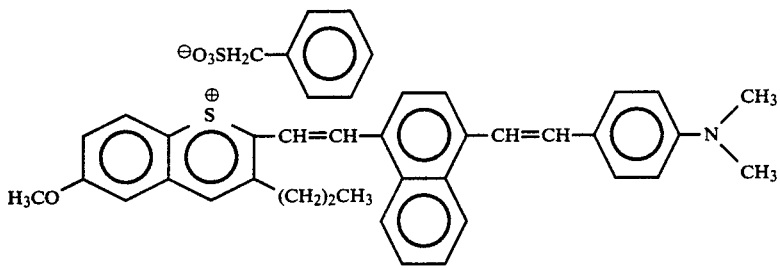
3-21

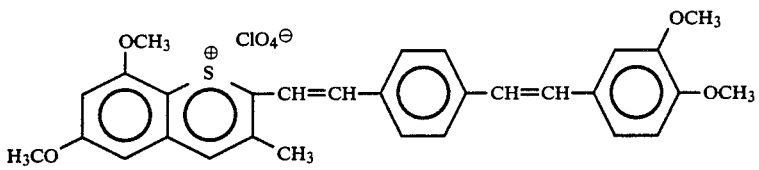
3-22

The above croconic methine dyes to be used in the present invention are compounds having the following basic structure (including intramolecular salts), having absorption peaks at 800 to 850 nm, which can generate heat by infrared ray of this wavelength:

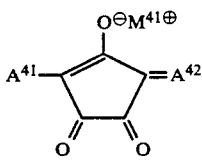

$M^{41\oplus}$: as hereinafter described,
$A^{41}$, $A^{42}$: substituent containing aromatic ring and/or heterocyclic ring.

Typical examples of the croconic methine dyes may include the dyes represented by the following formulae [I]-[IV].

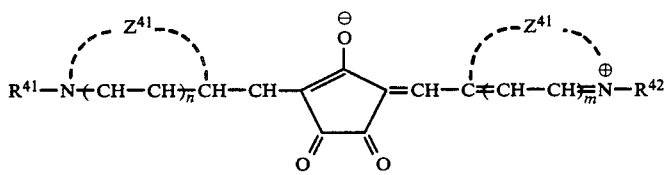
[Formula] I

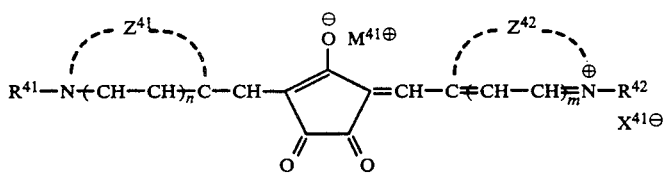
[Formula] II

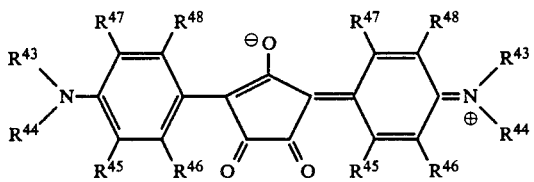
[Formula] III

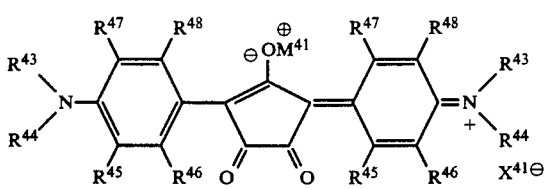
[Formula] IV

In the above formulae, $R^{41}$ and $R^{42}$ each represent an alkyl radical (e.g. methyl, ethyl, n-propyl, isopropyl, n-butyl, sec-butyl, isobutyl, t-butyl, n-amyl, t-amyl, n-hexyl, n-octyl, to-octyl, etc.), a substituted alkyl (e.g. 2-hydroxyethyl, 3-hydroxypropyl, 4-hydroxybutyl, 2-acetoxyethyl, carboxymethyl, 2-carboxyethyl, 3-carboxypropyl, 2-sulfoethyl, 3-sulfopropyl, 4-sulfobutyl, 3-sulfatopropyl, 4-sulfatobutyl, N-(methylsulfonyl)-carbamylmethyl, 3-(acetylsulfamyl)propyl, 4-(acetylsulfamyl)butyl, etc.), a cyclic alkyl radical (e.g. cyclohexyl, etc.), an allyl group ($CH_2=CH-CH_2-$), and alalkyl radical (e.g. benzyl, phenethyl, α-naphthylmethyl, β-naphthylmethyl, etc.), a substituted aralkyl radical (e.g. carboxybenzyl, sulfobenzyl, hydroxybenzyl, etc.), an aryl radical (e.g. phenyl, etc.) or a substituted aryl radical (e.g. carboxyphenyl, sulfophenyl, hydroxyphenyl, etc.). Particularly, in the present invention, of these organic radicals, hydrophobic ones are preferred.

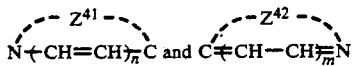

each represent a group of non-metallic atoms necessary for completing a substitued or unsubstituted heterocyclic ring such as a nucleus of thiazole series (e.g. thiazole, 4-methylthiazole, 4-phenylthiazole, 5-methylthiazole, 5-phenylthiazole, 4,5-dimethylthiazole, 4,5-diphenylthiazole, 4-(2-thienyl)-thiazole, etc.), a nucleus of benzothiazole series (e.g. benzothiazole, 5-chlorobenzothiazole, 5-methylbenzothiazole, 6-methylbenzothiazole, 5,6-dimethylbenzothiazole, 5-bromobenzothiazole, 5-phenylbenzothiazole, 5-methoxybenzothiazole, 6-methoxybenzothiazole, 5,6-dimethoxybenzothiazole, 5,6-dioxymethylenebenzothiazole, 5-hydroxybenzothiazole, 6-hydroxybenzothiazole, 4,5,6,7-tetrahydrobenzothiazole, etc.), a nucleus of naphthothiazole series (e.g. naphtho [2,1-d]thiazole, naphtho [1,2-d]thiazole, 5-methoxynaphtho[1,2-d]thiazole, 5-ethoxynaphtho[1,2-d]thiazole, 8-methoxynaphtho[2,1-d]thiazole, 7-methoxynaphtho[2,1-d]thiazole, etc., a nucleus of thionaphtho [7,6-d]thiazole series (e.g. 7-methoxythionaphtho [7,6-d]thiazole), a nucleus of oxazole series (e.g. 4-methyloxazole, 5-methyloxazole, 4-phenyloxazole, 4,5-diphenyloxazole, 4-ethyloxazole, 4,5-dimethyloxazole, 5-phenyloxazole), a nucleus of benzoxazole series (e.g. benzoxazole, 5-chlorobenzoxazole, 5-methylbenzoxazole, 5-phenylbenzoxazole, 6-methylbenzoxazole, 5,6-dimethylbenzoxazole, 5-methoxybenzoxazole, 6-methoxybenzoxazole, 5-hydroxybenzoxazole, 6-hydroxybenzoxazole, etc.), a nucleus of naphthoxazole series (e.g. naphtho[2,1-d]oxazole, naphtho[1,2-d]oxazole, etc.), a nucleus of selenazole series (e.g. 4-methylselenazole, 4-phenylselenazole, etc.), a nucleus of benzoselenazole series (e.g. benzoselenazole, 5-chlorobenzoselenazole, 5-methylbenzoselenazole, 5,6-dimethylbenzoselenazole, 5-methoxybenzoselenazole, 5-methyl-6-methoxybenzoselenazole, 5,6-dioxymethylenebenzoselenazole, 5-hydroxybenzoselenazole, 4,5,6,7-tetrahydrobenzoselenazole, etc.), a nucleus of naphthoselenazole series (e.g. naphtho[2,1-d]selenazole, naphtho[1,2-d]selenazole), a nucleus of thiazoline series (e.g. thiazoline, 4-methylthiazoline, 4-hydroxymethyl-4-methylthiazoline, 4,4-bis-hydroxymethylthiazoline, etc.), a nucleus of oxazoline series (e.g. oxazoline), a nucleus of selenazoline series (e.g. selenazoline), a nucleus of 2-quinoline series (e.g. quinoline, 6-methylquinoline, 6-chloroquinoline, 6-methoxyquinoline, 6-ethoxyquinoline, 6-hydroxyquinoline), a nucleus of 4-quinoline series (e.g. quinoline, 6-methoxyquinoline, 7-methylquinoline, 8-methylquinoline), a nucleus of 1-isoquinoline series (e.g. isoquinoline, 3,4-dihydroisoquinoline), a nucleus of 3-isoquinoline series (e.g. isoquinoline), a nucleus of 3,3-dialkylindolenine series (e.g. 3,3-dimethylindolenine, 3,3-dimethyl-5-chloroindolenine, 3,3,5-trimethylindolenine, 3,3,7-trimethylindolenine), a nucleus of pyridine series (e.g. pyridine, 5-methylpyridine), or a nucleus of benzimidazole series (e.g. 1-ethyl-5,6-dichlorobenzimidazole, 1-hydroxyethyl-5,6-dichlorobenzimidazole, 1-ethyl-5-chlorobenzimidazole, 1-ethyl-5,6-dibromobenzimidazole, 1-ethyl-5-phenylbenzimidazole, 1-ethyl-5-fluorobenzimidazole, 1-ethyl-5-fluorobenzimidazole, 1-ethyl-5-cyanobenzimidazole, 1-(β-acetoxyethyl)-5-cyanobenzimidazole, 1-ethyl-5-chloro-6-cyanobenzimidazole, 1-ethyl-5-fluoro-6-cyanobenzimidazole, 1-ethyl-5-acetylbenzimidazole, 1-ethyl-5-carboxybenzimidazole, 1-ethyl-5-ethoxycarbonylbenzimidazole, 1-ethyl-5-sulfamylbenzimidazole, 1-ethyl-5-N-ethylsulfamylbenzimidazole, 1-ethyl-5,6-difluorobenzimidazole, 1-ethyl-5,6-dicyanobenzimidazole, 1-ethyl-5-ethylsulfonylbenzimidazole, 1-ethyl-5-methylsulfonylbenzimidazole, 1-ethyl-5-trifluoromethylbenzimidazole, 1-ethyl-5-trifluoromethylsulfonylbenzimidazole, 1-ethyl-5-trifluoromethylsulfinylbenzimidazole, etc.). $R^{43}$ and $R^{44}$ each represents an alkyl radical such as methyl, ethyl, propyl, butyl, etc. $R^{43}$ and $R^{44}$ can also form a ring such as morpholino, piperidinyl, pyrrolidino, etc., together with a nitrogen atom. $R^{45}$, $R^{46}$, $R^{47}$ and $R^{48}$ each represent a hydrogen atom, an alkyl radical (methyl, ethyl, propyl, butyl, etc.), an alkoxy radical (methoxy, ethoxy, propoxy, butoxy, etc.) or a hydroxy radical. Also, $R^{45}$ and $R^{46}$ can be bonded to form a benzene ring, and further $R^{45}$ and $R^{46}$, and $R^{47}$ and $R^{48}$ may be bonded to each other, respectively, to form a benzene ring.

$X^{41\ominus}$ represents an anion such as ions of chloride, bromide, iodide, perchlorate, benzenesulfonate, p-toluenesulfonate, methylsulfate, ethylsulfate, propylsulfate, etc., with proviso that no $X^{41\ominus}$ exists when $R^{41}$ and (or) $R^{42}$ itself contains an anion group such as $-SO_3^\ominus$, $OSO_3^\ominus$, $-COO^\ominus$, $SO_2^\ominus NH-$, $-SO_2-N^\ominus-CO-SO_2^\ominus-N-SO_2-$.

$M^{41\oplus}$ represents a cation such as proton, sodium, ammonium, potassium, pyridium cation, etc. n and m are 0 or 1.

In the following, typical examples of the croconic methine dyes to be used in the present invention are enumerated. For the purpose of convenience, they are represented by betaine structures of the formula [I] or [III]. However, in preparation of these dyes, mixtures of dyes in the betaine form or salt form are obtained, and therefore they are generally frequently used as mixtures.

Typical examples of the formula [I], [II]

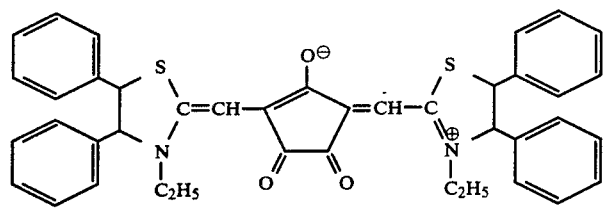
4-1
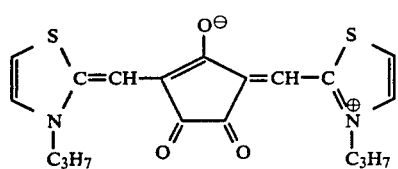
4-2
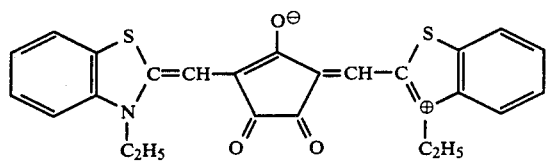
4-3
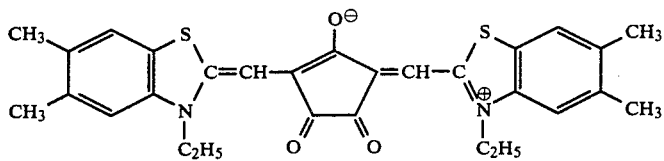
4-4
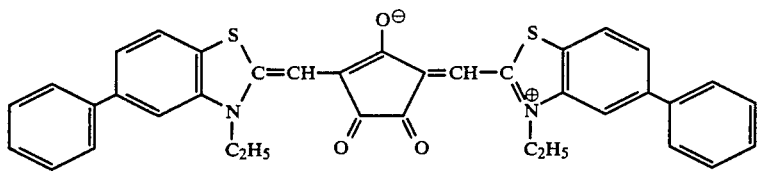
4-5
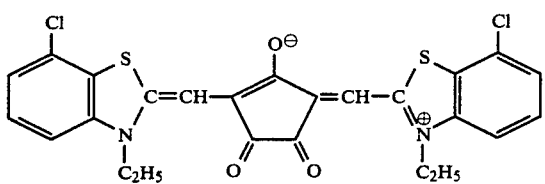
4-6
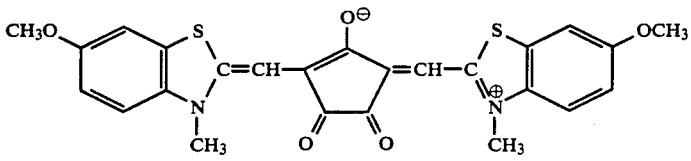
4-7
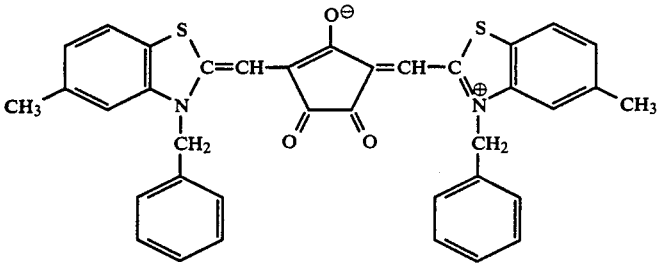
4-8

-continued
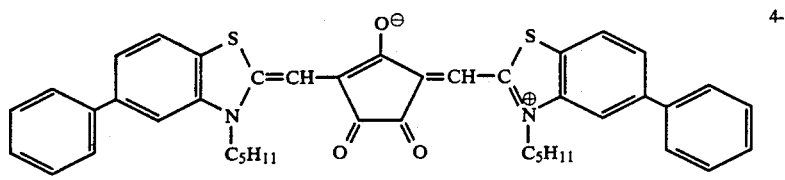
4-9
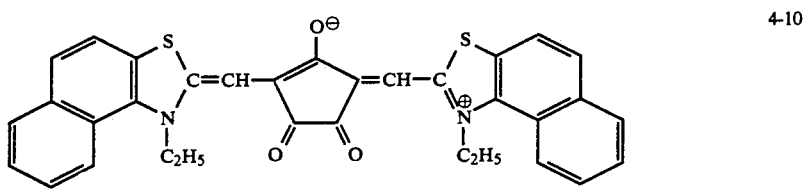
4-10
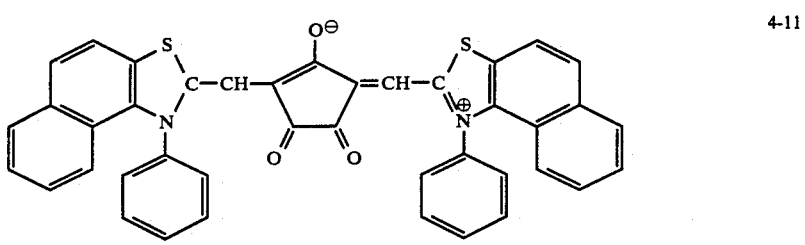
4-11
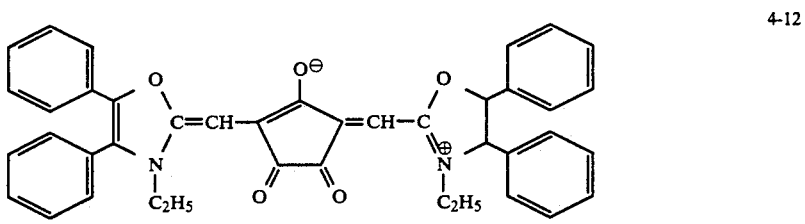
4-12
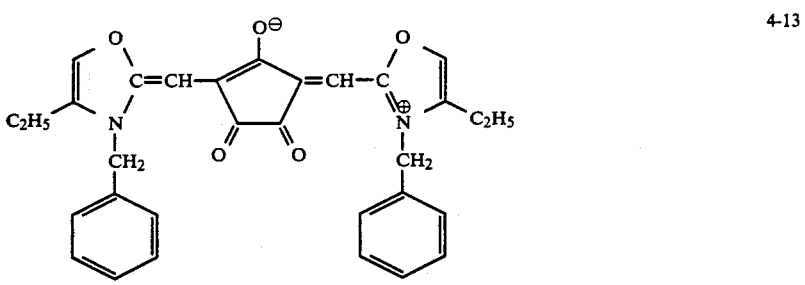
4-13
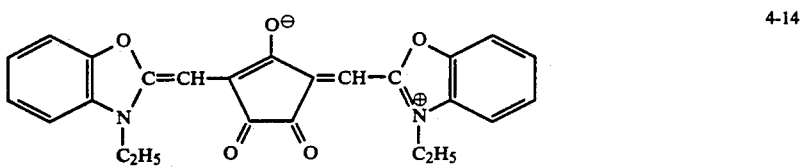
4-14
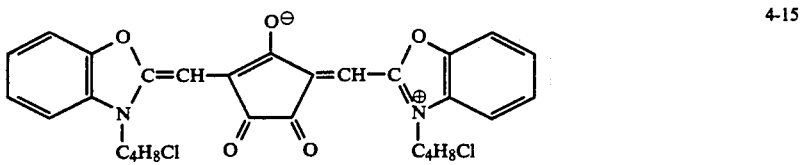
4-15

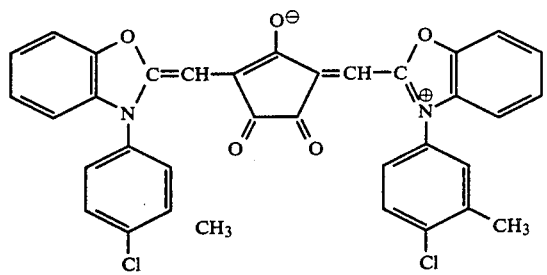
4-16
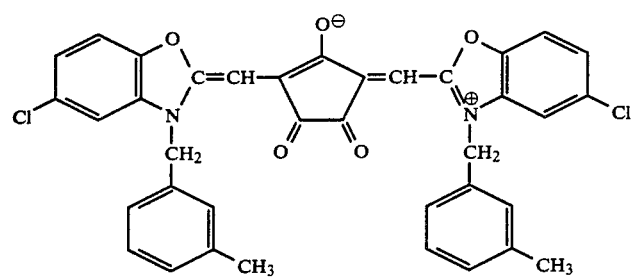
4-17
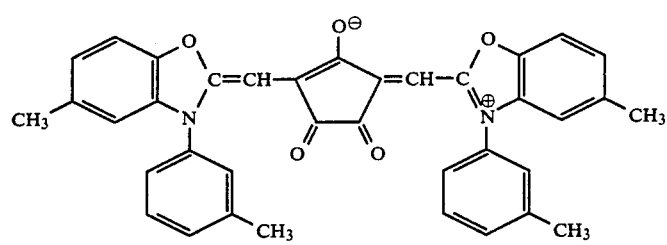
4-18
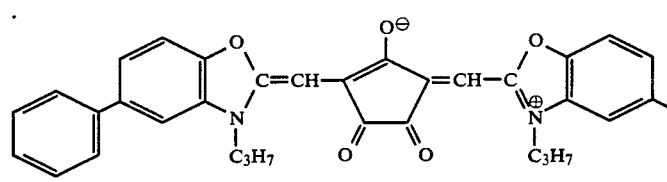
4-19
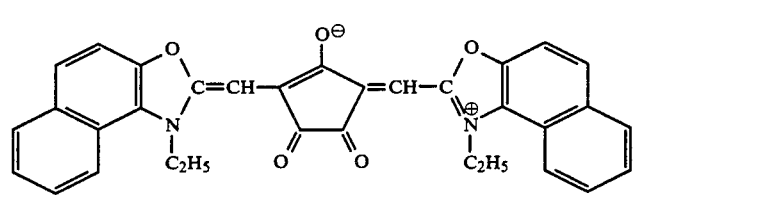
4-20
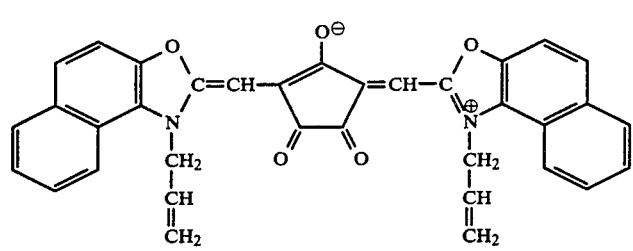
4-21
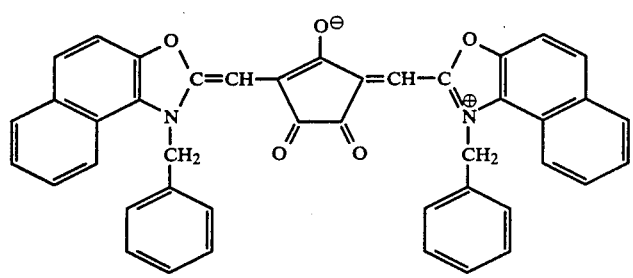
4-22

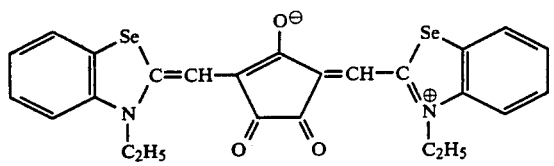
4-23
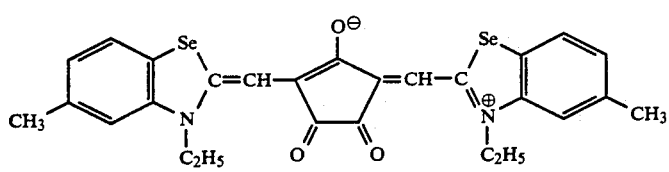
4-24
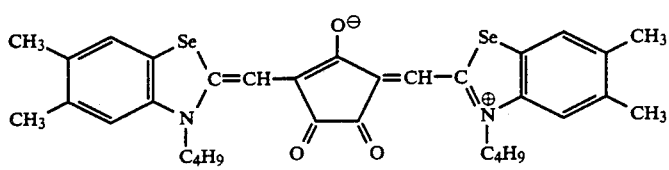
4-25
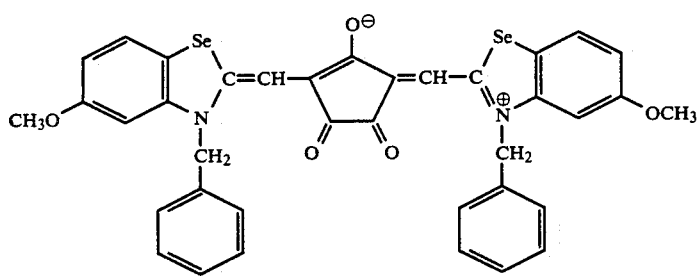
4-26
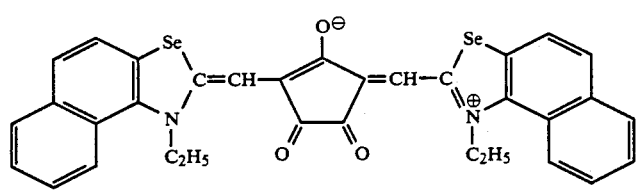
4-27
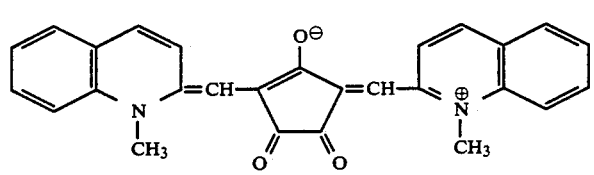
4-28
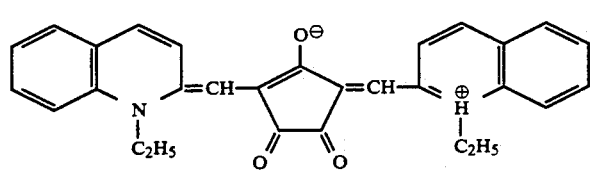
4-29
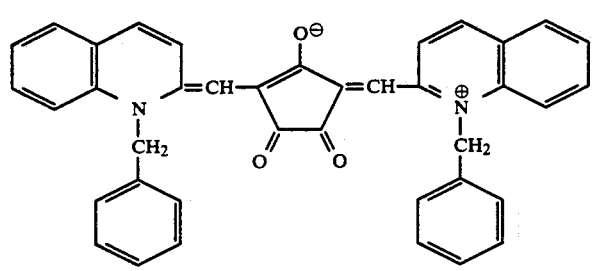
4-30

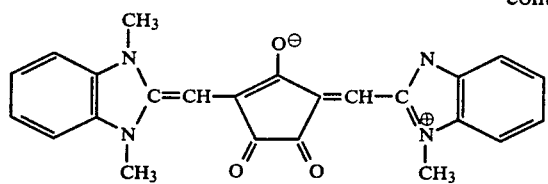
4-31
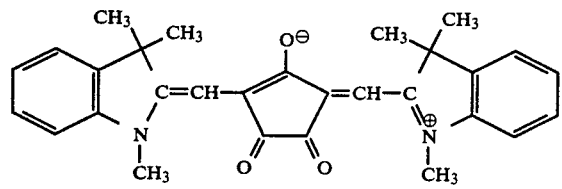
4-32
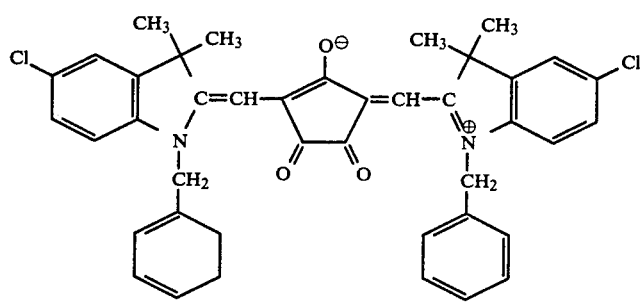
4-33
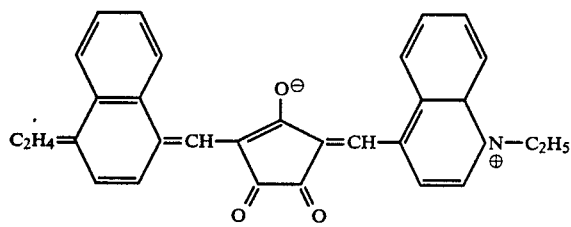
4-34
Typical Samples of the formula [III], [IV]
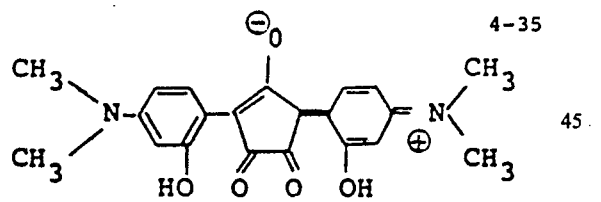
4-35
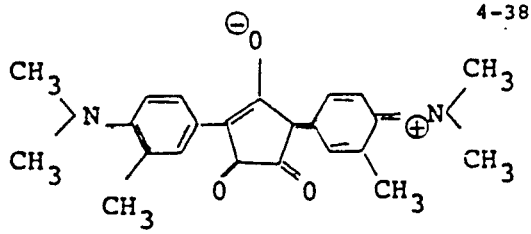
4-36
4-37
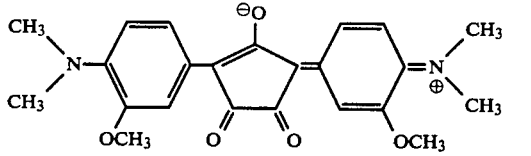
4-38
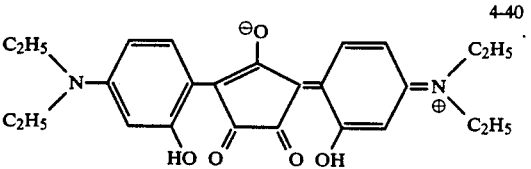
4-39
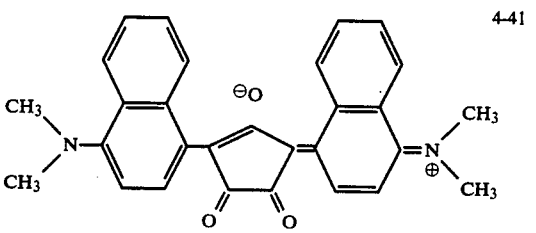
4-40
4-41

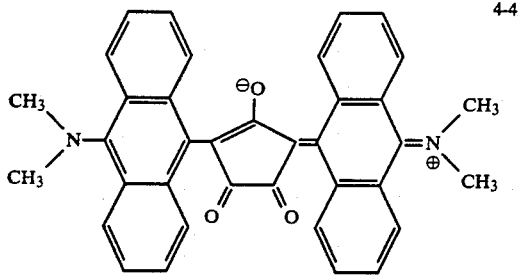

4-42

The above croconic methine dyes can be used either individually or as a combination of two or more compounds.

The above polymethine compounds to be used in the present invention are compounds having absorption peaks in the wavelength region of 750 nm or longer which can generate heat by infrared rays of such wavelength, as represented by the following formula 5-1 or 5-2:

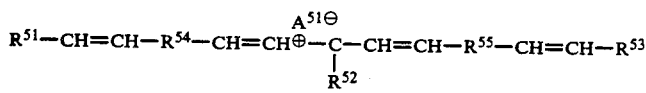

Formula 5-1

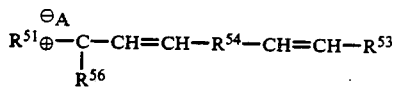

Formula 5-2

To describe in more detail about the polymethine compounds salts, in the formulae 5-1 and 5-2, $R^{51}$, $R^{52}$ and $R^{53}$ each independently represent an aryl radical such as phenyl, nephthyl, etc., which may have substituents. Here, examples of the substituent may include substituted amino radicals such as dimethylamino, diethylamino, dipropylamino, dibutylamino, diphenylamino, phenylbenzylamino, phenylethylamino, etc., cyclic amino radical such as morpholino, piperidinyl, pyrrolidino, etc., alkoxy radical such as methoxy, ethoxy, butoxy, etc. $R^{54}$ and $R^{55}$ each represents an arylene radical which may be substituted for forming a conjugated double bond system with two —CH=CH— radicals adjacent thereto such as p-phenylene, 1,4-naphthylene, etc. Here, examples of the substituent may include halogen atoms such as chlorine, bromine, iodine, etc., alkyl group such as methyl, ethyl, etc., and alkoxy radicals such as methoxy, ethoxy, etc. $R^{56}$ represents hydrogen or an aryl radicals such as phenyl, naphthyl, etc., which may be substituted. Examples of the substituents may include those as exemplified for $R^{51}$ to $R^{53}$. $A^{51\ominus}$ represents an anion radical, including halogen atoms such as $BF_4^{\ominus}$, $ClO_4^{\ominus}$, $CF_3COO^{\ominus}$, $PF_6^{\ominus}$, $Cl^{\ominus}$, $Br^{\ominus}$, $I^{\ominus}$ alkyl sulfonate compounds such as $ClSQ_3^{\ominus}$, $CH_3SO_3^{\ominus}$, $C_2H_5SO_3^-$, $C_3H_7SO_3^-$, $C_4H_9SO_3^{\ominus}$, $C_5H_{11}SO_3^{\ominus}$, $C_6H_{13}SO_3^{\ominus}$, $CH_3CHClSO_3^{\ominus}$, $ClCH_2CH_2SO_3^{\ominus}$,

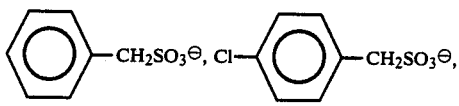

$ICH_2SO_3^{\ominus}$, benzenesulfonate compounds such as

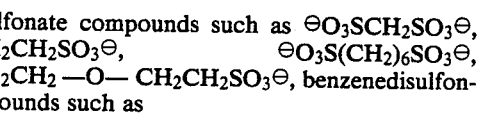

alkyldisulfonate compounds such as $^{\ominus}O_3SCH_2SO_3^{\ominus}$, $^{\ominus}O_3SCH_2CH_2SO_3^{\ominus}$, $^{\ominus}O_3S(CH_2)_6SO_3^{\ominus}$, $^{\ominus}O_3SCH_2CH_2-O-CH_2CH_2SO_3^{\ominus}$, benzenedisulfonate compounds such as

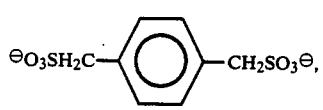

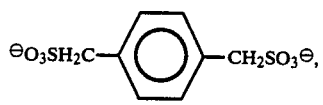

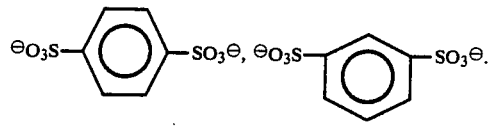

Specific examples of the polymethine compounds are shown below.

5-3 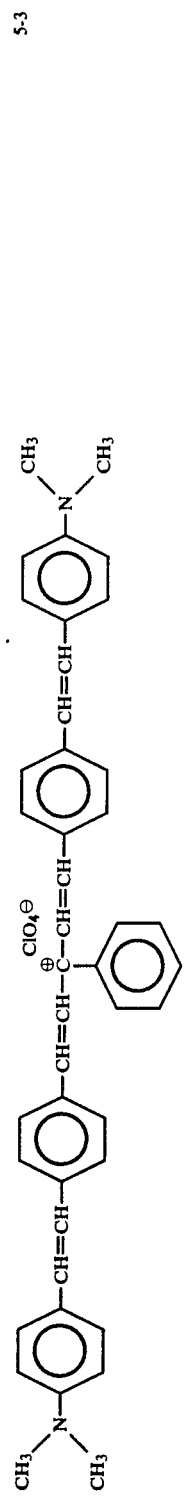
5-4 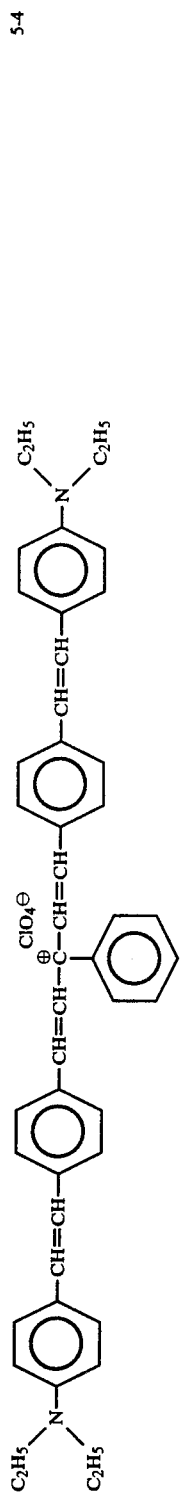
5-5 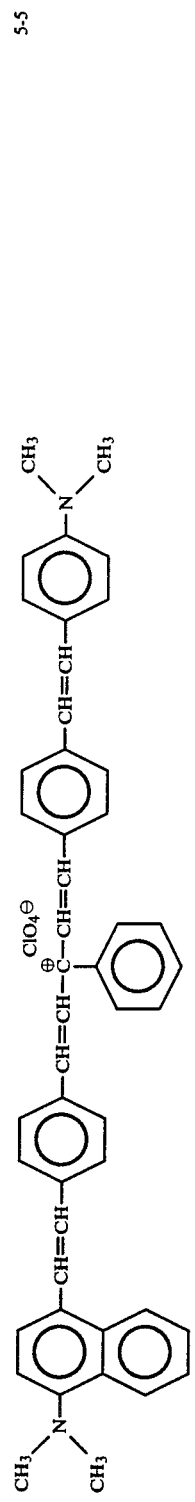
5-6 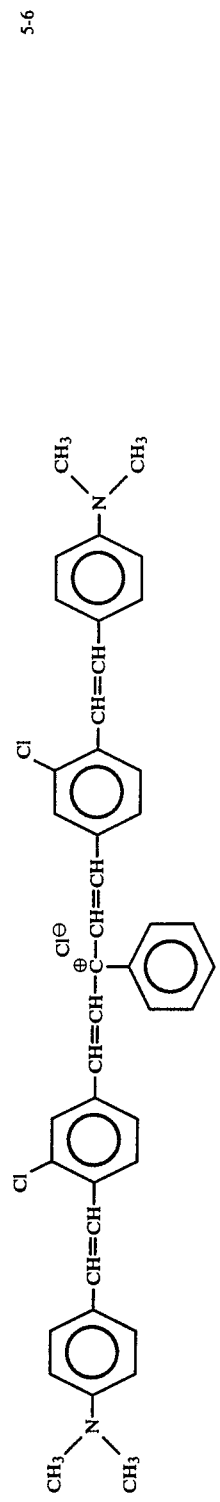
5-7 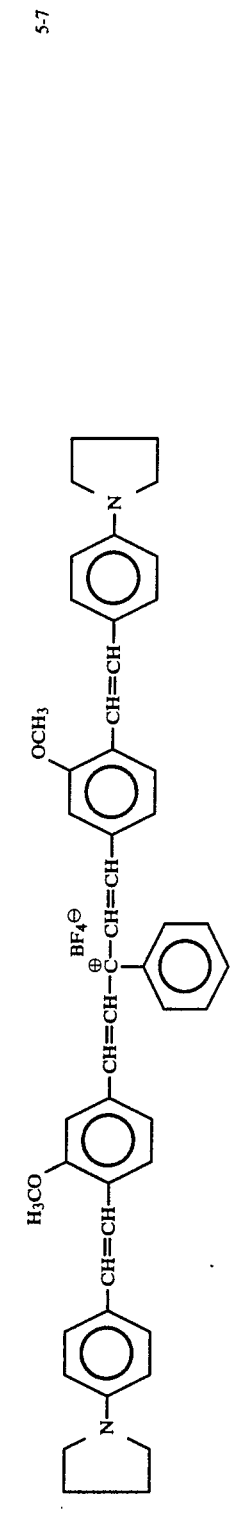

-continued
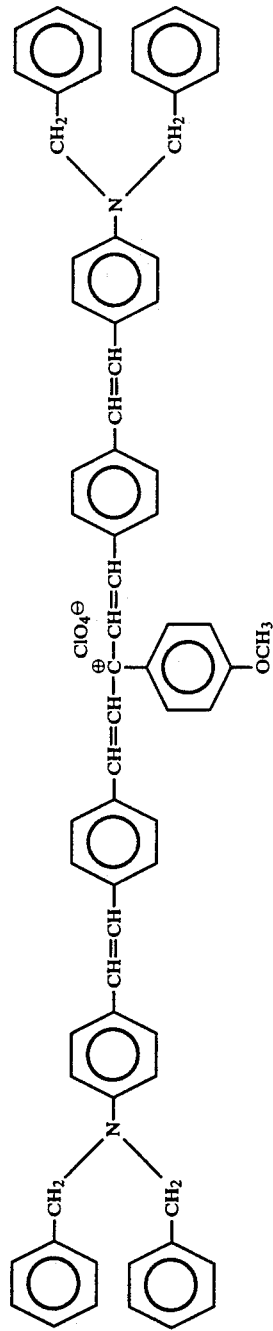
5-8
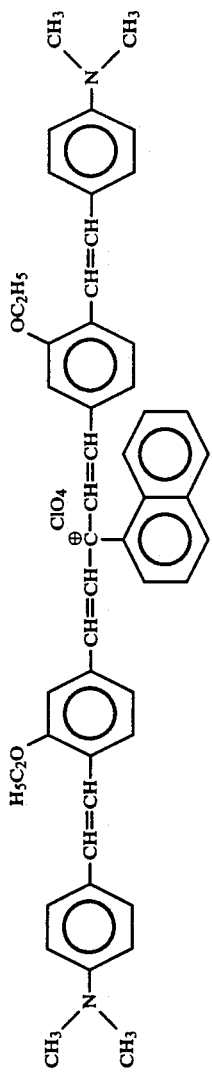
5-9
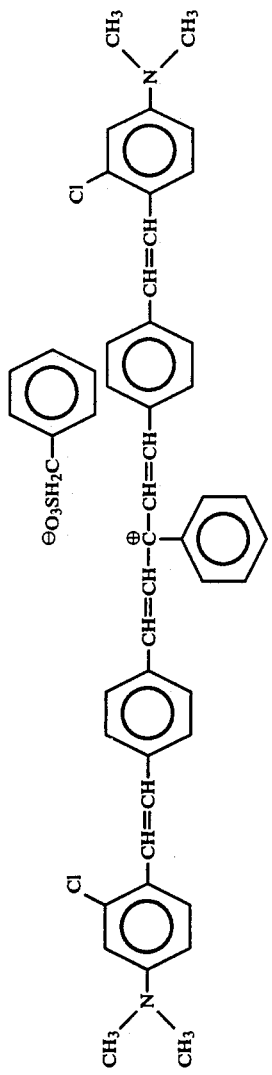
5-10
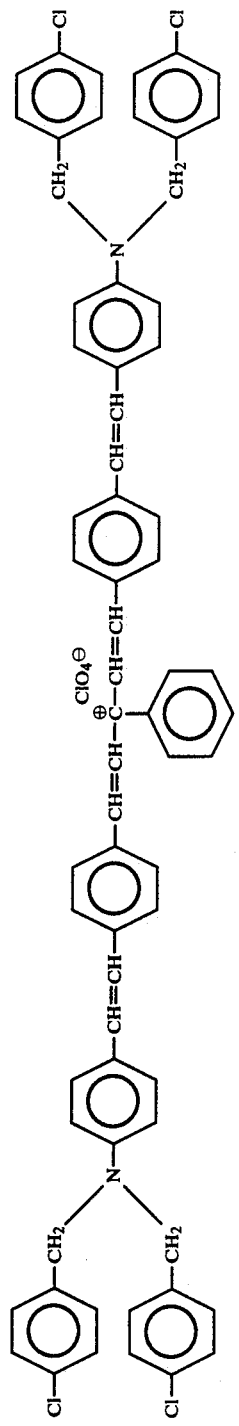
5-11

-continued
5-12 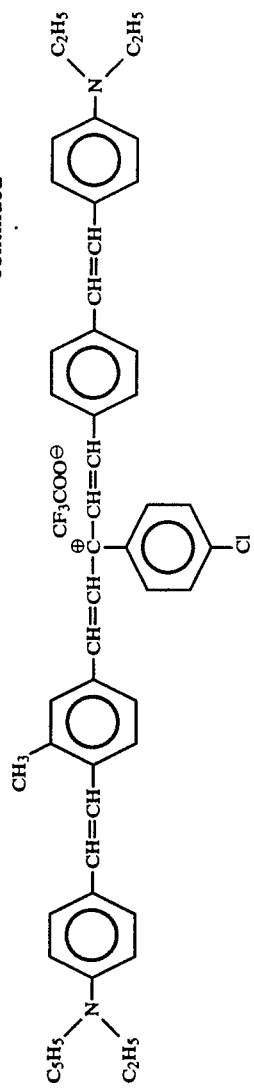
5-13 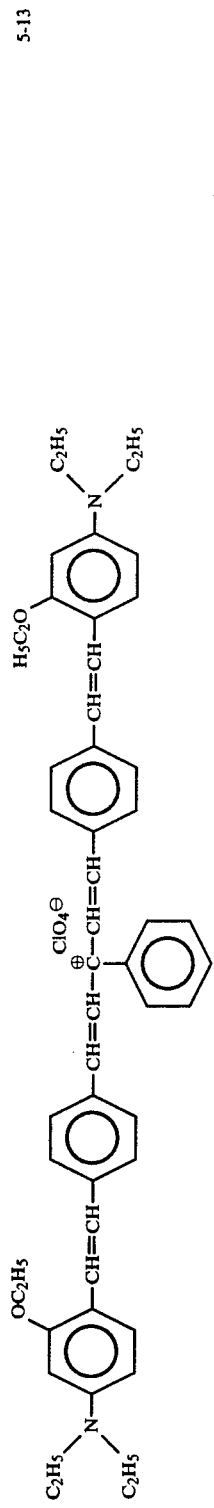
5-14 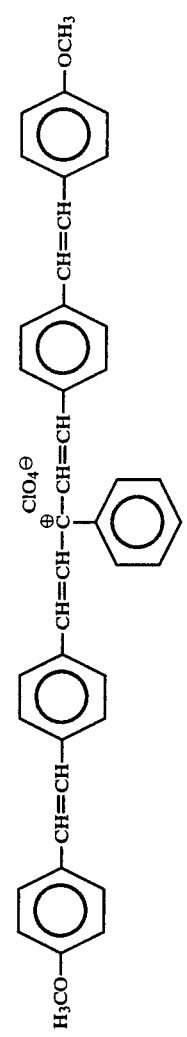
5-15 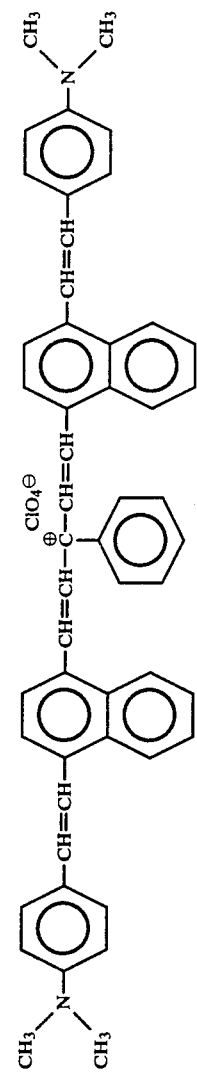
5-16 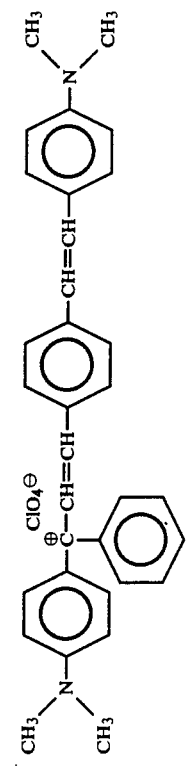

5-17 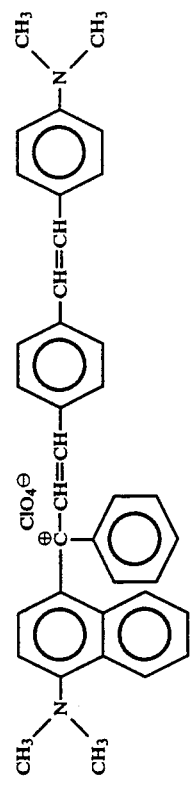
5-18 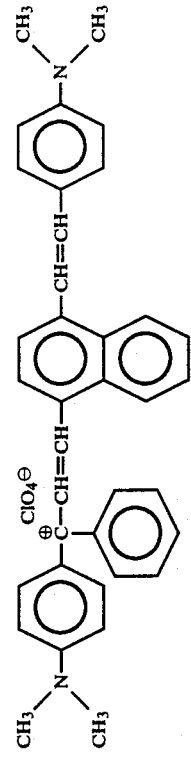
5-19 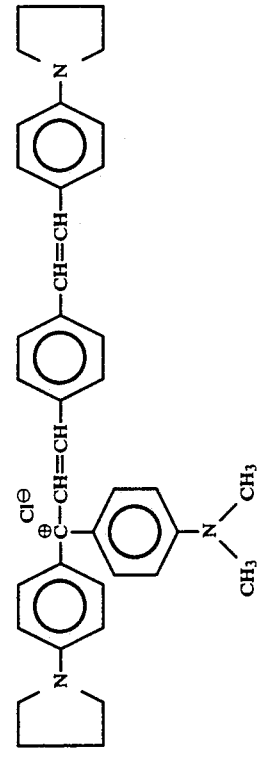
5-20 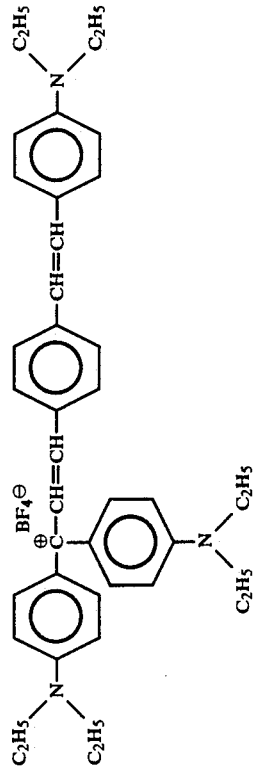

-continued
5-21
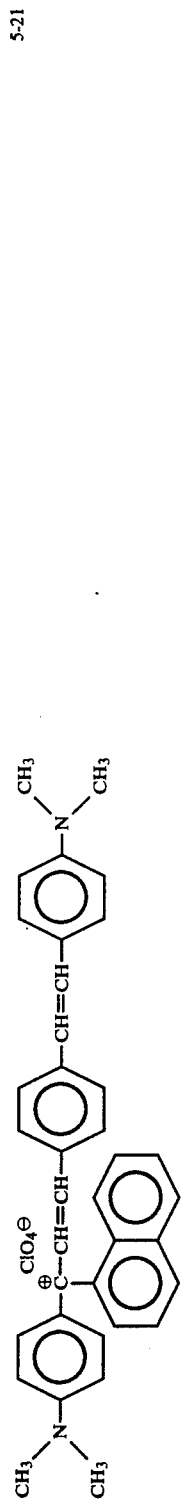
5-22
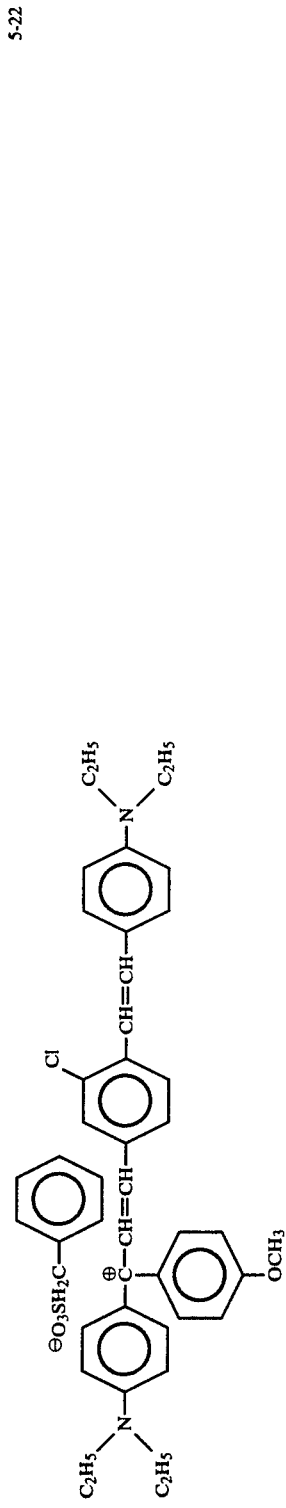
5-23
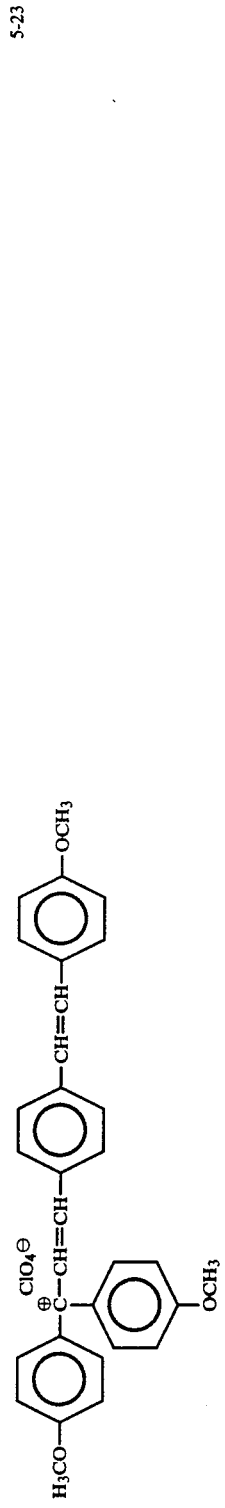
5-24
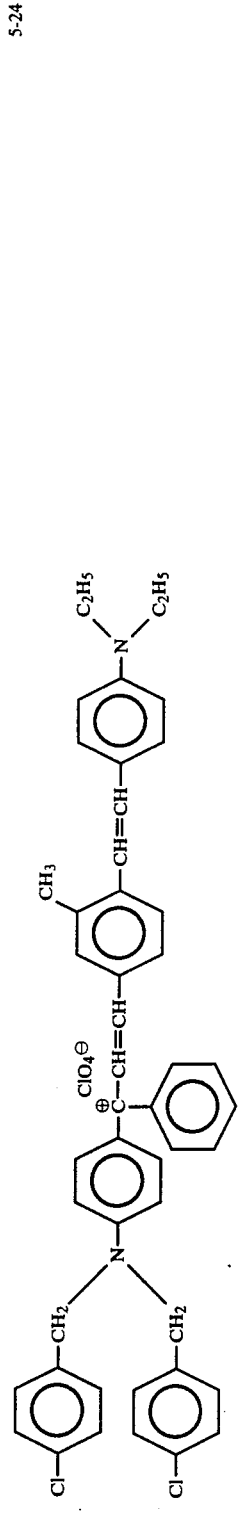

-continued
5-25 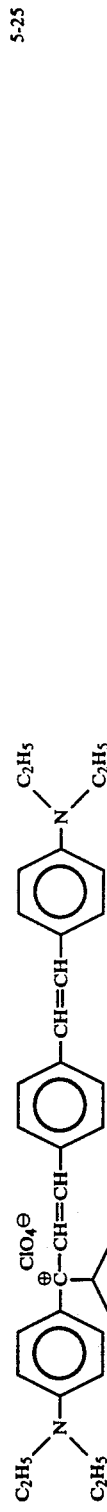
5-26 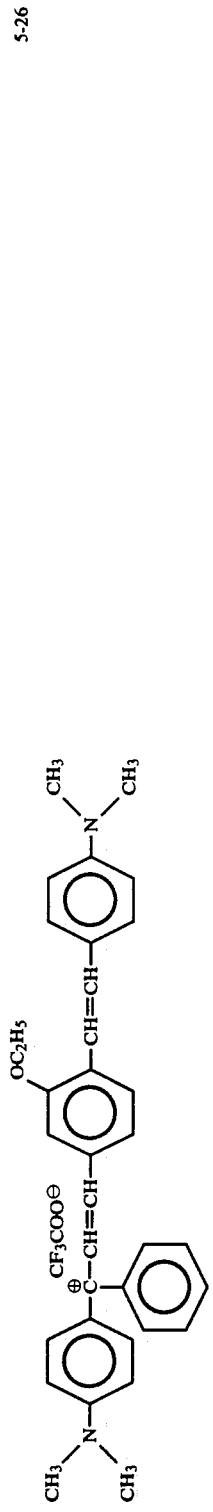
5-27 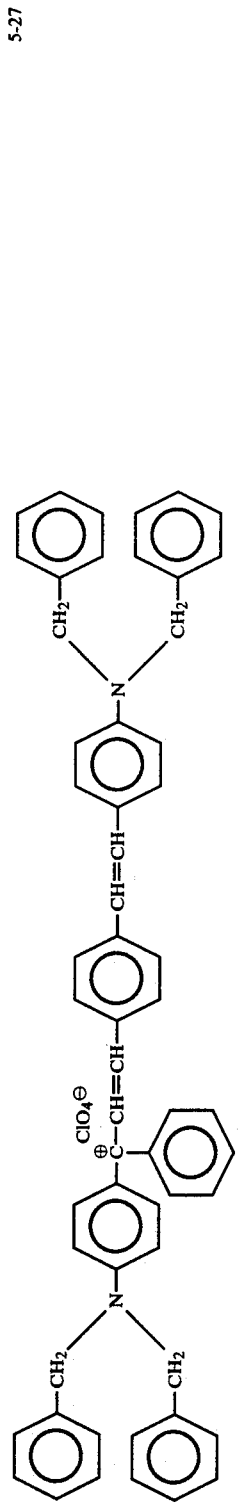
5-28 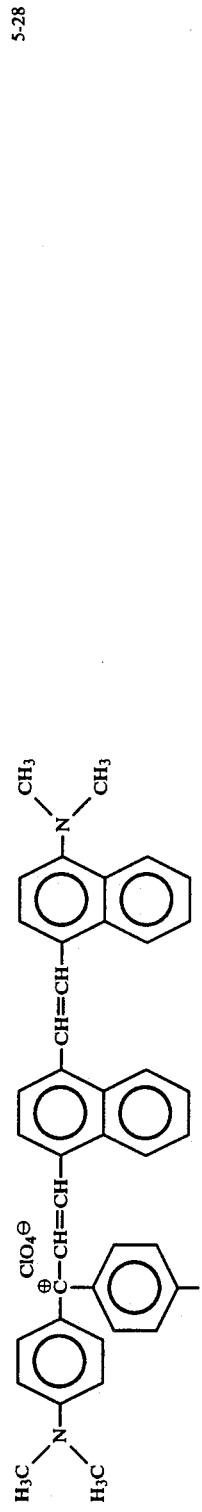
5-29 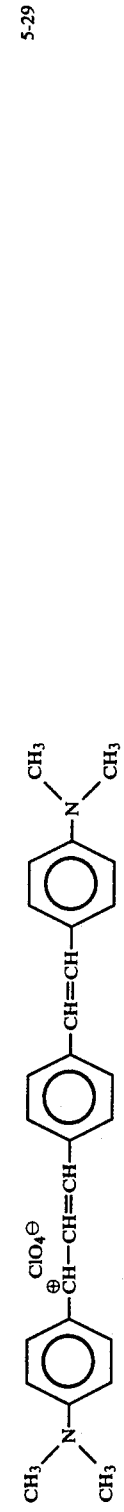

-continued
5-30
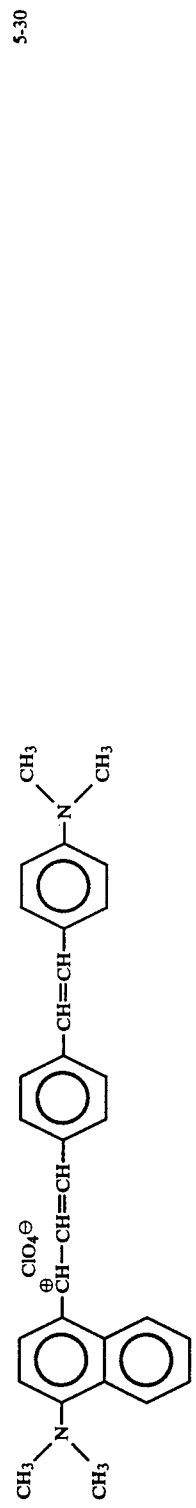
5-31
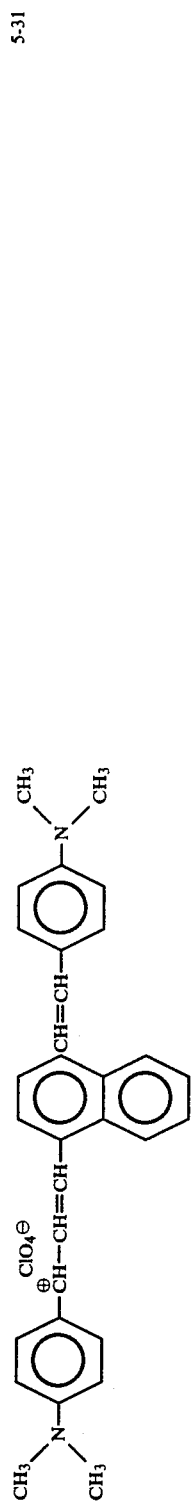
5-32
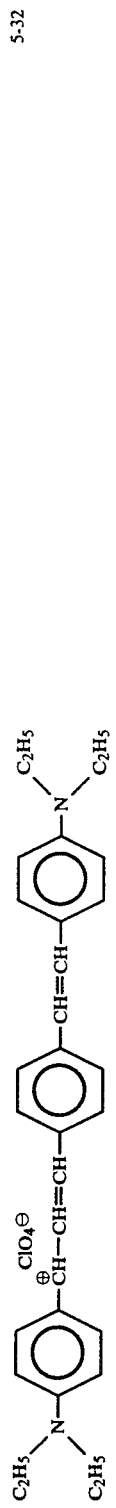
5-33
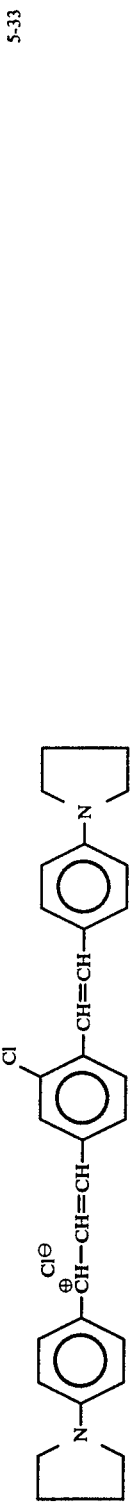
5-34
5-35
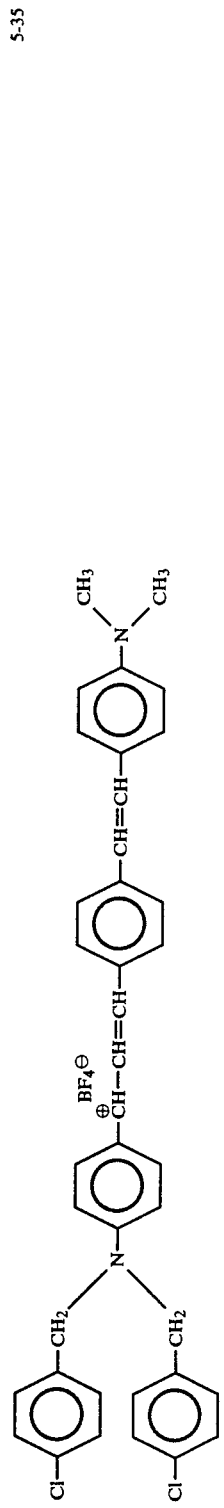

5-36
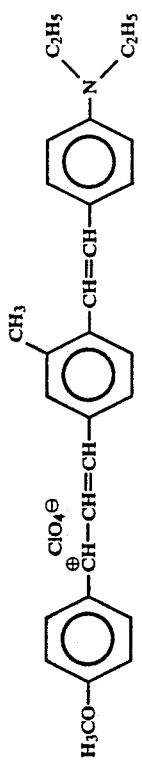
5-37
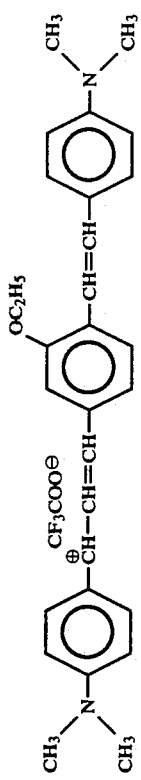
5-38
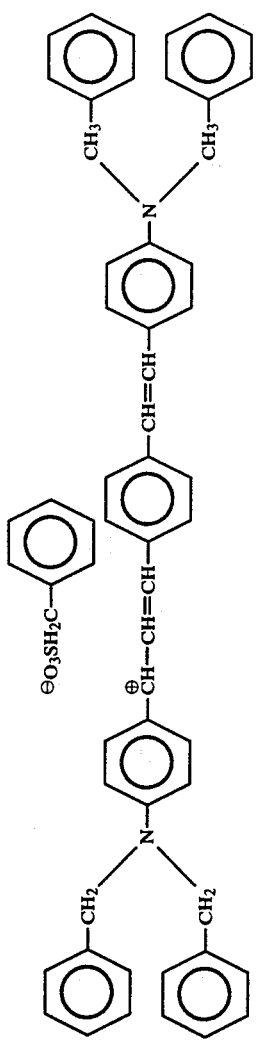

The optical recording medium to be used in the present invention contains the above DA compound and at least one selected from the AZ compounds or pyrylium dyes or diene compounds salts or croconic methines or polymethine compounds (hereinafter called the group B), having preferably a recording layer in which said DA compound alone or as a mixture with at least one selected from the group B forms a monomolecular film or built-up films thereof. Specific constitutions of said optical recording medium include the embodiments as shown below.

(1) One having a recording layer are comprising a mixed monomolecular film of the DA compound 2 and the compound 3 selected from the group B or a built-up films thereof (FIG. 1 shows its schematic sectional view).

Figure 2:
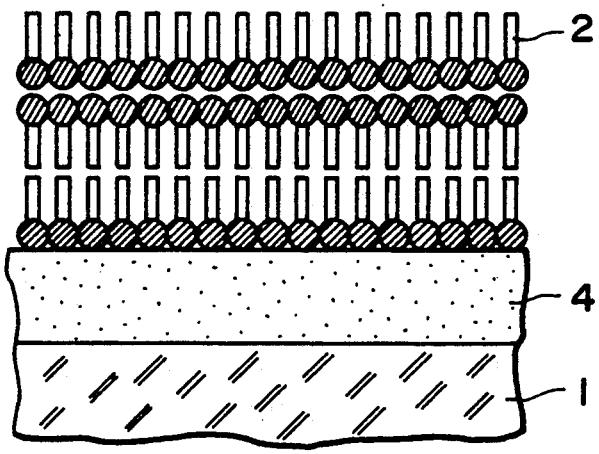

(2) One having a recording layer comprising the two layers of a layer comprising a monomolecular film of the DA compound 2 or a built-up films thereof and a layer containing the compound 3 selected from the group B (two layer separated system; FIG. 2 shows its schematic sectional view).

Figure 3A:
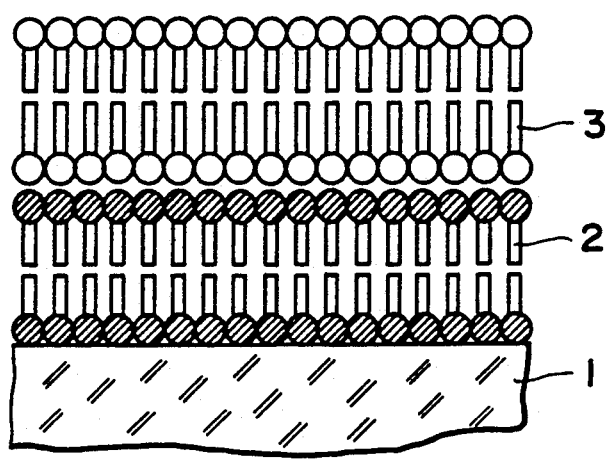
Figure 3B:
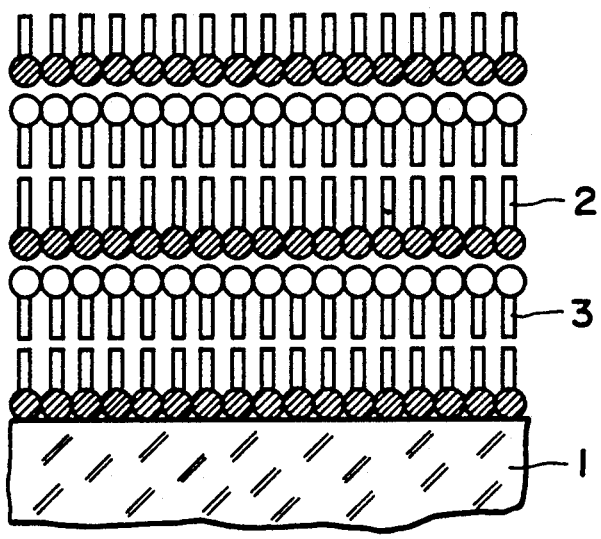
Figure 3C:
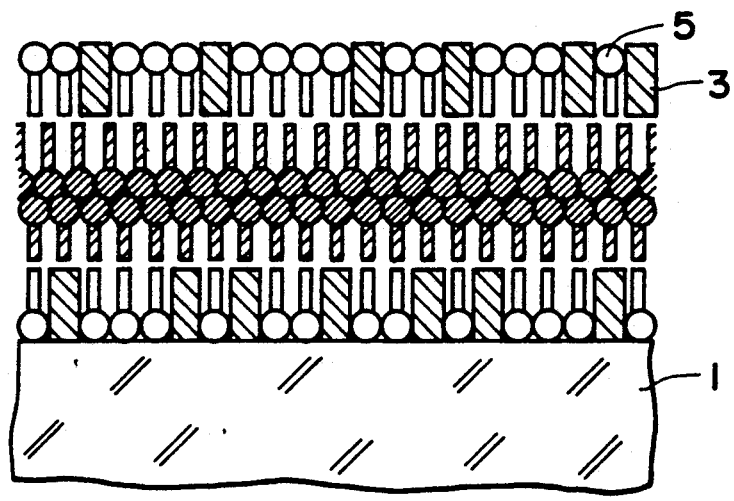

(3) One having a recording layer comprising at least one layer of the layer A comprising a monomolecular film of the DA compound 2 or built-up films thereof and at least one layer of the layer B comprising a monomolecular film containing the compound selected from the group B or built-up films thereof laminated (hetero-built-up system; FIG. 3 shows its schematic sectional view).

In the two separated layer system and the hetero-built-up system, the layer comprising a monomolecular film of the DA compound or a built-up films thereof and the radiation absorbing layer or the layer B containing the compound selected from the group B may be laminated in the order in which either one of them may be positioned on the surface side of the recording layer, and various protective layers may be provided on the recording layer thus constituted, if desired. Also, the laminating order in the hetero-built-up film system can be variously changed, and three specific examples are shown (see FIG. 3A, FIG. 3B and FIG. 3C.

As the substrate 1 of the optical recording medium to be used in the present invention, there may be employed various supporting materials such as plastic films of glass, acrylic resins, etc., plastic films of polyesters, etc., paper, metal and others. When recording is practiced by irradiating, from the substrate side, a substrate capable of transmitting a radiation for recording of a specific wavelength is used.

For formation of a monomolecular film of a DA compound or monomolecular built-up films on a substrate or a layer containing a compound selected from the group B, for example, the Langmuir-Blodgett method (hereinafter abbreviated as LB method) developed by I. Langmuir et al is may be used. The LB method is a method in which a monomolecular film or a film having monomolecular layer built-up is prepared by utilizing the phenomenon that, in a molecule with a structure having a hydrophilic moiety and a hydrophobic moiety in the molecule, when the balance between the both (amphiphilic balance) is adequately maintained, the molecule becomes a monomolecular layer on the surface with the hydrophilic moiety directed downward. The monomolecular layer on the water surface has the characteristics of the two-dimensional system. When the molecules are scattered sparsely, the following formula of the two-dimensional ideal gas is valid between the area per one molecule and the surface pressure $\pi$:

$$\pi A = KT,$$

thus becoming "gas film". Here, K is the Boltzmann's constant and T is an absolute temperature. When A is made sufficiently small, intermolecular interactions are strengthened, whereby the molecules become "condensed film (or solid film)" of a two-dimensional solid. The condensed films can be transferred one layer by one layer onto the surface of a substrate such as glass.

By use of this method, a monomolecular film of a DA compound or built-up films thereof can be prepared, for example, as follows. First, a DA compound is dissolved in a solvent such as chloroform, and the resulting solution is spread on an aqueous phase to form a spreading layer in which these compounds are spread in a film. Next, a partitioning plate (or a buoy) is provided to prevent too broad expansion of the spreading layer through free diffusion on the aqueous phase whereby the area of the spreading layer is restricted to control the gathered state of these compounds and obtain a surface pressure $\pi$ in proportion to the gathered state. By moving this partitioning plate, the gathered state of the film substance can be controlled by reducing the spreading area, whereby the surface pressure can be gradually elevated to be set at a surface pressure $\pi$ suitable for preparation of built-up films. At the surface pressure constantly maintained, by moving vertically a clean substrate gently, a monomolecular film of a DA compound is transferred onto the surface or the layer containing the compound selected from the group B on the substrate. A monomolecular film can be thus produced, and a built-up film of monomolecular layers can be formed to a desired built-up degree by repeating the above operation.

For transfer of the monomolecular film onto a substrate, other than the above vertical dipping method, such methods as the horizontal lifting method, the rotating cylinder method, etc., may be employed. The horizontal lifting method is a method in which transfer is effected with the substrate being contacted horizontally on the water surface, and the rotating cylinder method is a method in which the monomolecular layer is transferred onto the substrate surface by rotating a cylindrical substrate on the water surface. In the vertical dipping method as described above, when a substrate having a hydrophilic surface is withdrawn in the direction transversing the water surface, a monomolecular layer with the hydrophilic groups of the DA compound faced toward the substrate side is formed in the first layer on the substrate. When the substrate is moved vertically, mixed monomolecular films are laminated one layer by one layer in the respective steps. Since the direction of the film forming molecules in the withdrawing step becomes opposite to that of the dipping step, according to this method, there is formed a Y type film in which hydrophilic moieties and hydrophilic moieties or hydrophobic moieties and hydrophobic moieties are faced to each other between the respective layers.

In contrast, the horizontal lifting method is a method in which monomolecular film is transferred with the substrate contacted horizontally on the water surface, whereby a monomolecular film is formed on the substrate with the hydrophobic moiety of the DA compound faced toward the substrate side. According to this method, even when a film is built up, there is no change in direction of the molecules of the DA compound, but there is formed an X type film in which the hydrophobic groups are faced toward the substrate side in all of the layers. On the contrary, a built-up film in which the hydrophilic groups in all the layers are faced toward the substrate side is called a Z type film.

In a rotating cylinder method, a monomolecular layer is transferred onto the substrate surface by rotating a cylindrical substrate on the water surface. The method for transferring monomolecular layers onto a substrate is not limited to these, but it is also possible to employ a method in which a substrate is extruded into an aqueous phase from substrate roll, when employing a large area substrate. Also, the direction of the hydrophilic moiety and the hydrophobic moiety toward the substrate as described above are given as general rules, and it is also modified then by the surface treatment of the substrate, etc.

Details of the transferring operation of these monomolecular films are already known and described in, for example, "Shin Jikken Kagaku Koza (New Experimental Chemical Course) 18 Interface and Colloid" P.498-507, published by Maruzen.

Also, the so-called mixed monomolecular film or the mixed monomolecular built-up film comprising two or more compounds can be obtained according to the same method as described above. In this case, at least one of the two or more compounds constituting the mixed monomolecular film or the mixed monomolecular built-up film may have hydrophilic site and hydrophobic site in combination, and it is not necessarily required that all the compounds should have hydrophilic site and hydrophobic site in combination. That is, provided that amphiphilic balance is maintained in at least one compound, a monomolecular layer can be formed on the water surface and the other compound can be sandwiched between the amphiphilic compound, whereby a monomolecular layer having molecular orderliness can be consequently formed.

Accordingly, a recording layer comprising a mixed monomolecular film or a mixed monomolecular built-up film of a DA compound and the compound selected from the group B can be formed according to the LB method similarly as described above by dissolving a DA compound and a compound selected from the group B in a solvent such as chloroform, and spreading the solution on an aqueous face to form a spreading layer having these compounds spread in a film.

However, for improving dramatically the film forming property, the compound selected from the group B is required to be made amphiphilic.

On the other hand, for formation of a layer containing the compound selected from the group B, there may be typically employed the method in which the compound selected from the group B is dissolved in an appropriate volatile solvent to prepare a coating solution, which is then coated. The coating solution may also incorporate various binders comprising natural or synthetic polymers for improvement of adhesion to the substrate or the layer comprising monomolecular film of a DA compound or its built-up film. Further, for improving stability and quality of the layer B, various kinds of additives may be added.

Suitable binders can be selected from a variety of resins. Specific examples may include cellulose esters such as nitrocellulose, cellulose phosphate, cellulose sulfate, cellulose acetate, cellulose propionate, cellulose butylate, cellulose myristytate, cellulose parmitate, cellulose acetate propionate, cellulose acetate butylate, etc.; cellulose ethers such as methyl cellulose, ethyl cellulose, propyl cellulose, butyl cellulose, etc.; vinyl resins such as polystyrene, polyvinyl chloride, polyvinyl acetate, polyvinyl butylal, polyvinyl acetal, polyvinyl alcohol, polyvinyl pyrrolidone, etc.; copolymer resins such as styrene-butadiene copolymer, styrene-acrylonitrile copolymer, styrene-butadieneacrylonitrile copolymer, vinyl chloride-vinyl acetate copolymer, etc.; acrylic resins such as polymethyl methacrylate, polymethylacrylate, polyacrylic acid, polymethacrylic acid, polyacrylamide, polyacrylonitrile, etc.; polyesters such as polyethylene terephthalate, etc.; polyarylate resins such as poly (4,4'-isopropylidenediphenylene-co-1,4-cyclohexylenedimethylene carbonate, poly(ethylenedioxy-3,3'-phenylene thiocarbonate), poly(4,4'-isopropylidenediphenylene carbonate-co-terephthalate), poly(4,4'-isopropylidenediphenylene carbonate), poly(4,4'-secbutylidenediphenylene carbonate), poly(4,4'-isopropylidenediphenylene carbonate-block-oxyethylene), etc.; polyamides; polyimides; epoxy resins; phenol resins; and polyolefins such as polyethylene, polypropylene, chlorinated polyethylene, etc.

The solvent to be used for coating may include, in the case of AZ compounds, pyrylium dyes, diene compounds salts or polyethylene compounds, alcohols such as methanol, ethanol, isopropanol, etc., ketones such as acetone, methyl ethyl ketone, cyclohexanone, etc.; aliphatic nitriles such as acetonitrile, etc.; aliphatic halogenated hydrocarbons such as chloroform, methylene chloride, dichloroethylene, carbon tetrachloride, trichloroethylene, etc.; and others. Methylene chloride and acetonitrrile are particularly preferred. In the case of croconic methines, the solvent used may be selected suitably depending on the state of the cronconic methine dye. In the case of a croconic methine dye under amorphous state, there may be employed alcohols such as methanol, ethanol, isopropanol, etc.; ketones such as acetone, methyl ethyl ketone, cyclohexanone, etc.; amides such as N,N-dimethylformamide, N,N-dimethylacetamide, etc.; sulfoxides such as dimethyl sulfoxide, etc.; ethers such as tetrahydrofuran, dioxane, ethylene glycol monomethyl ether, etc.; esters such as methyl acetate, ethyl acetate, etc.; aromatic such as benzene, toluene, xylene, ligroin, etc. On the other hand, in the case of a croconic methine under state of particles, there may be selected halogenated hydrocarbons such as dichloromethane, chloroform, carbon tetrachloride, 1,1-dichloromethane, 1,2-dichloromethane, 1,1,2-trichloromethane, chlorobenzene, bromobenzene, 1,2-dichlorobenzene, etc.

For coating of the coating solution thus obtained, there may be employed various methods such as spinner rotary coating, dip coating, spray coating, bead coating, wire bar coating, blade coating, roller coating, curtain coating, etc.

Also, the B layer containing the compound selected from the group B may be a monomolecular film or a built-up film thereof similarly as the A layer comprising a monomolecular layer film of a DA compound or its built-up film. However, because the compound selected from the group B is not an amphiphilic substance, it cannot alone form a monomolecular film according to the LB method. In forming a monomolecular film solely from a compound selected from the group B which is not amphiphilic by means of an LB method, the formation is made possible by introducing a long chain alkyl thereto or by use of organic molecules as a molecular carrier having a well-balanced amphiphilicity such as a higher fatty acid including stearic acid and arachic acid in an appropriate proportion, thus forming a mixed monomolecular film or a mixed monomolecular built-up film containing the compound selected from the group B.

When the recording layer comprises a mixed monomolecular film of a DA compound and the compound selected from the group B or a built-up film thereof, its film thickness may be suitably about 500 Å to 2 μm, particularly preferably within the range from 1000 to 5000 Å. Above all, the weight ratio of the DA compound and the compound selected from the group B within the recording layer should preferably be about 15 to 15/1, most preferably 1/5 to 10/1.

In the case of the two separated layer system, each film thickness may be suitably about 100 Å to 1 μm, particularly preferably in the range from 200 to 5000 Å.

In the case of the hetero-built-up film system, the total thickness of the respective DA compound layers and the total film thickness of the respective layers of the compounds selected from the group B may each suitably be about 100 Å to 1 μm, particularly preferably in the range from 200 to 5000 Å.

The monomolecular film and built-up film formed on the substrates as described above has high density as well as high degree of orderliness, and therefore, variation in light absorption from place to place is very small. Accordingly, by constituting a recording layer with such a film, there can be obtained a recording medium to be used in the present invention having high density and recording performance of high resolution capable of effecting optical recording and thermal recording depending on the functions of the DA compound and the compound selected from the group B.

In the recording method of the present invention, the recording medium as constituted above to be provided for recording is first subjected to polymerization of the DA compound in the recording layer. That is, the DA compound which is substantially colorless and transparent at the initial stage is polymerized on irradiation of UV-rays onto the whole recording layer to be changed to a polydiacetylene derivative compound. This polymerization occurs by irradiation of UV-rays, etc., and it will not occur by mere application of thermal energy. As the results of this polymerization, the recording layer becomes to have the maximum absorption wavelength at 620 to 660 nm to be changed to blue color or dark color. The change in hue based on this polymerization is an irreversible change, and the recording layer once changed to blue color or dark color will never be returned to the colorless transparent film. Thus, the DA compound in the recording layer is polymerized to be changed to a polydiacetylene derivative compound, and the recording medium having a recording layer changed to blue color or dark color is used in the method of the present invention.

The polydiacetylene derivative compound changed to blue color or dark color, when heated to about 50° C. or higher, becomes for this time to have the maximum absorption wavelength at about 540 nm to be changed to red color. This change is also an irreversible change. The optical recording method of the present invention performs recording by utilizing such color change characteristic of the polydiacetylene derivative compound, and the recording method of the present invention is described in detail below.

Figure 4:
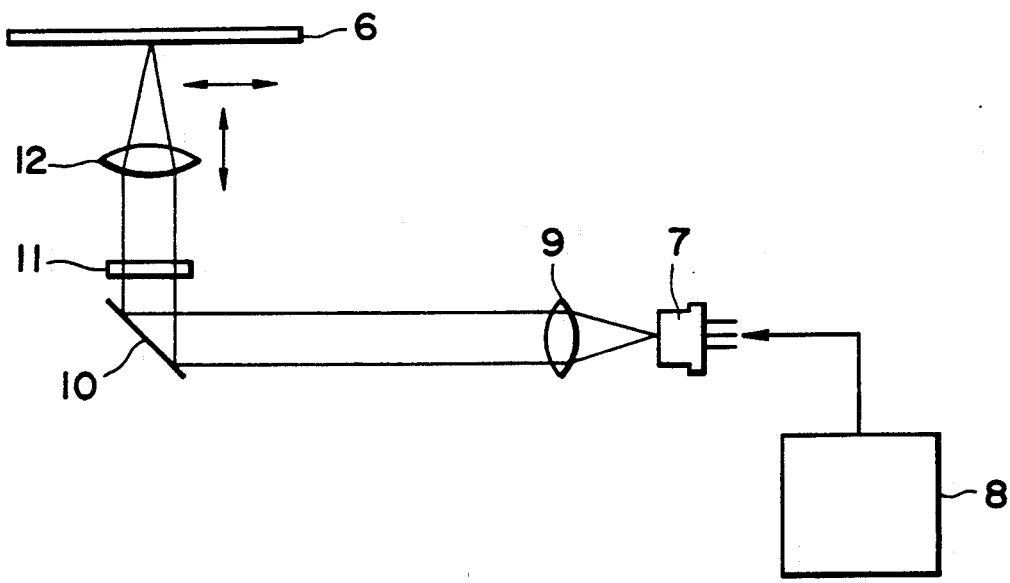
FIG. 4 is a block diagram showing an example of the information recording device by use of the method of the present invention.
Figure 5A:
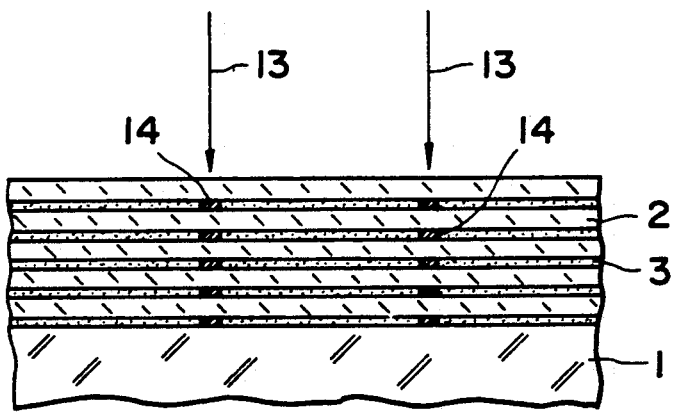
FIG. 5 is a flow chart showing the recording process by use of the optical recording medium of the present invention.
Figure 5B:
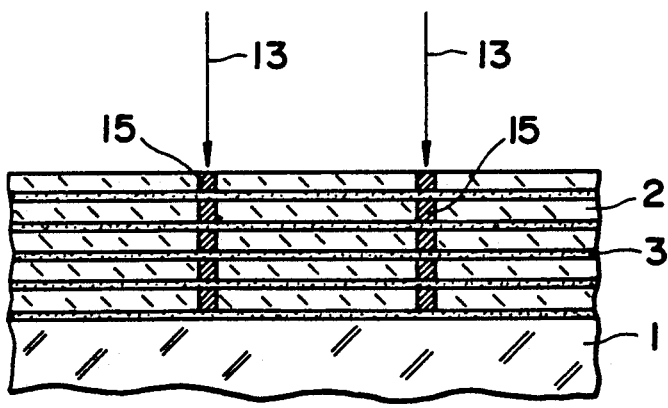

FIG. 4 is a schematic illustration showing one embodiment of the optical recording device to be used for practicing the optical recording method of the present invention. The optical recording device is constituted of an optical recording medium mounting means not shown for setting the optical recording medium B at a predetermined position and an information writing means for writing an information onto the optical recording medium. The information writing means consists of a semiconductor laser 7 for radiating infrared rays of the wavelength within the range from 700 to 1000 nm, a control circuit 8 for controlling oscillation of the semiconductor laser 7 corresponding to the input information and an optical system (collimator lens 9, reflective plate 10, wavelength plate 11 and objective lens 12). As the semiconductor laser 7, it is particularly preferable to use a GaBs junction laser of output length of 820 to 840 nm.

The input information is converted to an optical signal by the semiconductor laser via the control circuit. The optical signal, by passing through the optical system, is converged at a predetermined position of the optical recording medium having a blue recording layer which is placed on the optical recording medium mounting means and is rotated synchronously. While the polydiacetylene derivative compound existing at the image formation point (site) does not absorb the laser beam of this wavelength, but the compound selected from the group B absorb the laser beam to generate heat. The heat generated from the compound selected from the group B is transferred to the adjacent polydiacetylene derivative compound, whereby the polydiacetylene derivative compound turns red. Thus, optical recording due to color change of the recording site on the recording layer is practiced corresponding to the input information.

As the optical recording medium, a disc (optical disc) shaped in a disc has been employed in the above example, but it is also possible to use an optical tape, an optical card, etc., depending on the kind of the substrate supporting the recording layer containing the polydiacetylene derivative compound and the compound selected from the group B.

The present invention is described in more detail by referring to the following Examples.

EXAMPLE 1-1

A solution of 1 part by weight of a diacetylene derivative represented by $C_{12}H_{25}-C\equiv C-C\equiv C-C_8H_{16}-COOH$ and 1 part by weight of an AZ compound salt represented by the above formula 1-6 dissolved at a concentration of $1\times 10^{-3}$ mole/liter in chloroform was spread on an aqueous phase with pH 6.5 and a cadmium chloride concentration of $1\times 10^{-3}$ mole/liter.

After removal of the solvent chloroform, at a surface pressure maintained to be constant, a glass substrate sufficiently cleaned having a hydrophilic surface was moved vertically in the direction transversing the water surface gently at a speed of 1.0 cm/min. to have a mixed monomolecular film of the DA compound and the AZ compound salt transferred onto the substrate. Thus, optical recording media having a mixed monomolecular film and mixed monomolecular built-up films built up in 21 layers, 41 layers and 81 layers formed on the substrate, respectively, were prepared.

EXAMPLE 1-2

Optical recording media were prepared in the same manner as Example 1-1 except that 2 parts by weight of the diacetylene derivative compound were used per 1 part by weight of the AZ compound salt.

EXAMPLE 1-3

Optical recording media were prepared in the same manner as Example 1-1 except that 10 parts by weight of the diacetylene derivative compound were used per 1 part by weight of the AZ compound salt.

EXAMPLE 1-4

Optical recording media were prepared in the same manner as Example 1-1 except that 15 parts by weight of the diacetylene derivative compound were used per 1 part by weight of the AZ compound salt.

COMPARATIVE EXAMPLE 1-1

Optical recording media were prepared in the same manner as Example 1-1 except that only the diacetylene derivative compound was used without use of the AZ compound salt.

COMPARATIVE EXAMPLE 1-2

On a glass substrate, a radiation absorbing layer made of Gd·Tb·Fe having a film thickness of 1500 Å was provided according to the sputtering method. By use of this substrate, optical recording media having a monomolecular film or monomolecular built-up films of the diacetylene derivative formed on the radiation absorbing layer on the substrate in the same manner as Comparative example 1-1 were prepared.

EXAMPLE 1-5

Repeating the procedure of example 1-1 except that the compound represented by the formula 1-4 was employed as the AZ compound, optical recording media were prepared.

EXAMPLE 1-6

According to the same procedure as in Example 1-1 except for using a diacetylene derivative compound by $C_8H_{17}$—C≡C—C≡C—$C_2H_4$—COOH in place of the diacetylene derivative compound represented by $C_{12}H_{25}$—C≡C—C≡C—$C_8H_{16}$—COOH, optical recording media were prepared.

EXAMPLE 1-7 to 1-9

Optical recording media were prepared according to the same procedure as in Example 1-6 except for using the AZ compound salts represented by the formula 1-7, 1-19 and 1-24, respectively, in place of the AZ compound salt represented by the formula 1-6.

EXAMPLE 1-10

The compound represented by the formula 1-22 was employed as the AZ compound, following otherwise entirely the same procedure as in Example 1-1, optical recording media were prepared.

RECORDING TEST

On each of the optical recording media prepared in Example 1-1 to 1-10 and Comparative examples 1-1 to 1-2, UV-ray of 254 nm was irradiated uniformly and sufficiently to make the recording layer a blue film. Next, a semiconductor laser beam with output of 3 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 1-1. Evaluation was conducted by judging whether, the recording sensitivity, the image resolution and the image density are good or not, and those which are particularly good are rated as ⊚, those which are good as ○ and those which cannot be recorded or are bad as x.

Also, film forming characteristic was evaluated for film forming percentage and surface irregularity of the film.

The film forming percentage was determined by carrying out the operation of building up monomolecular film on a 20 mm φ circular glass substrate for 50 sheets of glass substrates, and calculating the rate of the number of operations of the 50 operations when the film was cleanly transferred onto the substrate without occurrence of peeling or peel-off of the monomolecular film during the built-up step:
50% or less: x
50–80%: ○
80% or more: ⊚

The surface irregularity of the film was determined by observing the film surface state with naked eyes and by an optical microscope (magnification ×500) and rating the film surface which is uniform as ○, one having peel-off partially occurred as Δ, and one having peel-off occurred over a wide range and showing clear unevenness on the surface as x.

TABLE 1 - 1

| Recording medium | Build-up number of films | Sensitivity | Resolution | Image density | Film forming percentage | Surface irregularity |
|---|---|---|---|---|---|---|
| Example 1-1 | 1 | ⊚ | ⊚ | X | ⊚ | ○ |
|  | 21 | ⊚ | ⊚ | ⊚ | ⊚ | ○ |
|  | 41 | ⊚ | ⊚ | ⊚ | ⊚ | ○ |
|  | 81 | ⊚ | ⊚ | ⊚ | ⊚ | ○ |
| Example 1-2 | 1 | ⊚ | ⊚ | X | ⊚ | ○ |
|  | 21 | ⊚ | ⊚ | ⊚ | ⊚ | ○ |
|  | 41 | ⊚ | ⊚ | ⊚ | ⊚ | ○ |
|  | 81 | ⊚ | ⊚ | ⊚ | ⊚ | ○ |
| Example 1-3 | 1 | ⊚ | ⊚ | X | ⊚ | ○ |
|  | 21 | ⊚ | ⊚ | ⊚ | ⊚ | ○ |
|  | 41 | ⊚ | ⊚ | ⊚ | ⊚ | ○ |
|  | 81 | ⊚ | ⊚ | ⊚ | ⊚ | ○ |
| Example 1-4 | 1 | ○ | ⊚ | X | ⊚ | ○ |
|  | 21 | ○ | ⊚ | ⊚ | ⊚ | ○ |

TABLE 1 - 1-continued

| Recording medium | Build-up number of films | Sensitivity | Resolution | Image density | Film forming percentage | Surface irregularity |
|---|---|---|---|---|---|---|
| | 41 | O | ⊙ | ⊙ | ⊙ | O |
| | 81 | O | ⊙ | ⊙ | ⊙ | O |
| Comparative Example 1-1 | 1 | X | X | X | ⊙ | O |
| | 21 | X | X | X | ⊙ | O |
| | 41 | X | X | X | ⊙ | O |
| | 81 | X | X | X | ⊙ | O |
| Comparative Example 1-2 | 1 | O | O | X | ⊙ | O |
| | 21 | O | O | X | ⊙ | O |
| | 41 | X | X | X | ⊙ | O |
| | 81 | X | X | X | ⊙ | O |
| Example 1-5 | 1 | O | O | X | X | △ |
| | 21 | O | O | ⊙ | X | △ |
| | 41 | O | O | ⊙ | X | △ |
| | 81 | O | O | ⊙ | X | △ |
| Example 1-6 | 1 | ⊙ | ⊙ | X | ⊙ | O |
| | 21 | ⊙ | ⊙ | ⊙ | ⊙ | O |
| | 41 | ⊙ | ⊙ | ⊙ | ⊙ | O |
| | 81 | ⊙ | ⊙ | ⊙ | ⊙ | O |
| Example 1-7 | 1 | ⊙ | ⊙ | X | ⊙ | O |
| | 21 | ⊙ | ⊙ | ⊙ | ⊙ | O |
| | 41 | ⊙ | ⊙ | ⊙ | ⊙ | O |
| | 81 | ⊙ | ⊙ | ⊙ | ⊙ | O |
| Example 1-8 | 1 | ⊙ | ⊙ | X | ⊙ | O |
| | 21 | ⊙ | ⊙ | ⊙ | ⊙ | O |
| | 41 | ⊙ | ⊙ | ⊙ | ⊙ | O |
| | 81 | ⊙ | ⊙ | ⊙ | ⊙ | O |
| Example 1-9 | 1 | ⊙ | ⊙ | X | ⊙ | O |
| | 21 | ⊙ | ⊙ | ⊙ | ⊙ | O |
| | 41 | ⊙ | ⊙ | ⊙ | ⊙ | O |
| | 81 | ⊙ | ⊙ | ⊙ | ⊙ | O |
| Example 1-10 | 1 | O | O | X | X | △ |
| | 21 | O | O | ⊙ | X | △ |
| | 41 | O | O | ⊙ | X | △ |
| | 81 | O | O | ⊙ | X | △ |

EXAMPLE 1-11

After 1 part of a diacetylene derivative represented by $C_{12}H_{25}-C\equiv C-C\equiv C-C_8H_{16}-COOH$ and 1 part of an azulenium salt represented by the above formula 1-10 were dissolved at a concentration of $3\times 10^{-3}$ mole/liter in chloroform, the solution was spread on aqueous phase with pH 6.5 and a cadmium chloride concentration of $1\times 10^{-3}$ mole/liter. After removal of the solvent chloroform by evaporation, the surface pressure was enhanced to 20 dyne/cm. At a surface pressure maintained constantly, a glass substrate as a support sufficiently cleaned having a hydrophilic surface was moved vertically in the direction transversing the water surface gently at a speed of 1.0 cm/min. to have a mixed diacetylene monomolecular film transferred onto the substrate. Thus, optical recording media having a mixed monomolecular film and mixed monomolecular built-up films built up in 5 layers, 21 layers and 41 layers formed on the substrate, respectively, were prepared.

EXAMPLE 1-12

Optical recording media were prepared in the same manner according to Example 1-11 except that 2 parts of the diacetylene derivative compound were used.

EXAMPLE 1-13

Optical recording media were prepared in the same manner according to Example 1-11 except that 10 parts of the diacetylene derivative compound were used.

EXAMPLE 1-14

Optical recording media were prepared in the same manner according to Example 1-11 except that 15 parts of the diacetylene derivative compound were used.

RECORDING TEST 1

On each of the optical recording media prepared in Examples 1-11 to 1-14, UV-ray of 254 nm was irradiated uniformly and sufficiently to make the recording layer a blue film.

Next, a semiconductor laser beam with output of 3 mW, wavelength of 830 nm (beam diameter: 4 μm) was irradiated following input information. The results are shown in Table 1-2. Evaluation was conducted by judging by success and quality of recording, and those which gave particularly good recording are rated as ⊙, those which gave good recording as O, and those which gave inferior recording as x.

TABLE 1-2

| Recording medium | Number of films laminated | Overall evaluation |
|---|---|---|
| Example 1-11 | 1 | O |
| | 5 | O |
| | 21 | O |
| | 41 | O |
| Example 1-12 | 1 | ⊙ |
| | 5 | ⊙ |
| | 21 | ⊙ |
| | 41 | ⊙ |
| Example 1-13 | 1 | ⊙ |
| | 5 | ⊙ |
| | 21 | ⊙ |
| | 41 | ⊙ |
| Example | 1 | O |

TABLE 1-2-continued

| Recording medium | Number of films laminated | Overall evaluation |
|---|---|---|
| 1-14 | 5 | O |
|  | 21 | O |
|  | 41 | O |

EXAMPLES 1-15 TO 1-18

The compound represented by the following formula was used as the diacetylene derivative:

$$C_8H_{17}-C\equiv C-C\equiv C-C_2H_4-COOH,$$

and, following otherwise entirely the same procedures as in Examples 1-11 to 1-14, recording media were prepared.

RECORDING TEST 2

By use of the recording media of Examples 1-15 to 1-18, recording tests were conducted in the same manner as in Recording test 1. The results are shown in Table 1-3.

TABLE 1-2

| Recording medium | built-up number of films | Overall evaluation |
|---|---|---|
| Example 1-15 | 1 | O |
|  | 5 | O |
|  | 21 | O |
|  | 41 | O |
| Example 1-16 | 1 | ⊙ |
|  | 5 | ⊙ |
|  | 21 | ⊙ |
|  | 41 | ⊙ |
| Example 1-17 | 1 | ⊙ |
|  | 5 | ⊙ |
|  | 21 | ⊙ |
|  | 41 | ⊙ |
| Example 1-18 | 1 | O |
|  | 5 | O |
|  | 21 | O |
|  | 41 | O |

EXAMPLE 2-1

A solution of 1 part by weight of a diacetylene derivative represented by $C_{12}H_{25}-C\equiv C-C\equiv C-C_8H_{16}-COOH$ and 1 part by weight of a pyrylium dye represented by the above formula 2-8 dissolved at a concentration of $1\times 10^{-3}$ mole/liter in chloroform was spread on an aqueous phase with pH 6.5 and a cadmium chloride concentration of $1\times 10^{-3}$ mole/liter. After removal of the solvent chloroform, at a surface pressure maintained constantly, a glass substrate sufficiently cleaned having a hydrophilic surface was moved vertically in the direction transversing the water surface gently at a speed of 1.0 cm/min. to have a mixed monomolecular film of the DA compound and the pyrylium dye transferred onto the substrate. Thus, optical recording media having a mixed monomolecular film and mixed monomolecular built-up films built up in 5 layers, 21 layers and 41 layers formed on the substrate, respectively, were prepared.

EXAMPLE 2-2

Optical recording media were prepared in the same manner as Example 2-1 except that 2 parts by weight of the diacetylene derivative compound were used per 1 part by weight of the pyrylium dye.

EXAMPLE 2-3

Optical recording media were prepared in the same manner as Example 2-1 except that 10 parts by weight of the diacetylene derivative compound were used per 1 part by weight of the pyrylium dye.

EXAMPLE 2-4

Optical recording media were prepared in the same manner as Example 2-1 except that 15 parts by weight of the diacetylene derivative compound were used per 1 part by weight of the pyrylium dye.

RECORDING TEST 2-1

On each of the optical recording media prepared in Examples 2-1 to 2-4, UV-ray of 254 nm was irradiated uniformly and sufficiently to make the recording layer a blue film. Next, a semiconductor laser beam with output of 3 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 2-1. Evaluation was conducted by judging whether the recording sensitivity, the image resolution and the image density are good or not, and those which are particularly good are rated as ⊙, those which are good as O, and those which cannot be recorded or are bad as x.

TABLE 2-1

| Optical recording medium | Built-up number of films | Sensitivity | Resolution | Image density |
|---|---|---|---|---|
| Example 2-1 | 1 | O | ⊙ | X |
|  | 5 | ⊙ | ⊙ | O |
|  | 21 | ⊙ | ⊙ | ⊙ |
|  | 41 | ⊙ | ⊙ | ⊙ |
| Example 2-2 | 1 | O | ⊙ | X |
|  | 5 | ⊙ | ⊙ | O |
|  | 21 | ⊙ | ⊙ | ⊙ |
|  | 41 | ⊙ | ⊙ | ⊙ |
| Example 2-3 | 1 | O | ⊙ | X |
|  | 5 | O | ⊙ | X |
|  | 21 | ⊙ | ⊙ | ⊙ |
|  | 41 | ⊙ | ⊙ | ⊙ |
| Example 2-4 | 1 | X | ⊙ | X |
|  | 5 | O | ⊙ | X |
|  | 21 | O | ⊙ | X |
|  | 41 | O | ⊙ | O |

COMPARATIVE EXAMPLE 2-1

Optical recording media with a thickness of recording layer of 2000 Å were prepared in the same manner as Example 2-1 except that a solution of 3 parts by weight of the pyrylium dye and 1 part by weight of nitrocellulose dissolved in 10 parts by weight of methylene chloride was used as the coating solution without using the diacetylene derivative compound.

RECORDING TEST 2-2

Recording was practiced according to the same operation as in Recording test 2-1 except for varying variously the irradiation time of the semiconductor laser beam onto the optical recording medium having 21 layers of mixed monomolecular built-up film prepared in Example 2-2 (irradiation time 200 to 800 ns/bit).

Also, for the optical recording media of Comparative example 2-1, no UV-ray irradiation was practiced, but the semiconductor laser beam was irradiated on the recording layer surface at the predetermined positions with the same output and various irradiation time (irradiation time 500 ns/bit to 5 μs/bit) following an input information, thereby practicing recording by formation of pit.

For the optical recording medium Example 2-2, good recording could be practiced when the irradiation time was 200 ns or more, but, for the optical recording media prepared in Comparative example 2-1, it was found necessary to take 2μs or longer irradiation time for forming clearly one pit as the result of observation by a microscope.

EXAMPLE 2-5

According to the same procedure as in Example 2-2 except for using a diacetylene derivative compound by $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, optical recording media were prepared.

EXAMPLE 2-6

According to the same procedure as in Example 2-5 except for using a thiopyrylium dye represented by the formula 2-4 in place of the pyrylium dye represented by the formula 2-8, optical recording media were prepared.

EXAMPLE 2-7

According to the same procedure as in Example 2-5 except for using selenapyrylium dye represented by the formula 2-10 in place of the pyrylium dye represented by the formula 2-8, optical recording media were prepared.

EXAMPLE 2-8

According to the same procedure as in Example 2-5 except for using a pyrylium dye represented by the formula 2-17 in place of the pyrylium dye represented by the formula 2-8, optical recording media were prepared.

EXAMPLE 2-9

According to the same procedure as in Example 2-5 except for using a thiopyrylium dye represented by the formula 2-19 in place of the pyrylium dye represented by the formula 2-8, optical recording media were prepared.

RECORDING TEST 2-3

By use of the optical recording media prepared in Examples 2-5 to 2-9, recording test was practiced in the same manner as Recording test 2-1. Evaluations of the recording results are shown in Table 2-2.

TABLE 2-2

| Optical recording medium | Built-up number of films | Sensitivity | Resolution | Image density |
|---|---|---|---|---|
| Example 2-5 | 1 | ○ | ◐ | X |
|  | 5 | ● | ● | ○ |
|  | 21 | ● | ◐ | ● |
|  | 41 | ● | ● | ● |
| Example 2-6 | 1 | ○ | ● | X |
|  | 5 | ● | ● | ○ |
|  | 21 | ● | ● | ◐ |
|  | 41 | ● | ● | ● |
| Example 2-7 | 1 | ○ | ● | X |
|  | 5 | ● | ● | ○ |
|  | 21 | ● | ● | ● |
|  | 41 | ● | ● | ● |
| Example 2-8 | 1 | ○ | ● | X |
|  | 5 | ○ | ● | ○ |
|  | 21 | ○ | ● | ● |
|  | 41 | ○ | ● | ● |
| Example 2-9 | 1 | ○ | ○ | X |
|  | 5 | ○ | ● | ○ |
|  | 21 | ○ | ● | ○ |
|  | 41 | ○ | ◐ | ○ |

EXAMPLE 3-1

A solution of 1 part by weight of diacetylene derivative represented by $C_{12}H_{25}-C\equiv C-C\equiv C-C_8H_{16}-COOH$ and 1 part by weight of a polymethine compound represented by the above formula 5-7 dissolved at a concentration of $1\times10^{-3}$ mole/liter in chloroform was spread on an aqueous phase with pH 6.5 and a cadmium chloride concentration of $1\times10^{-3}$ mole/liter. After removal of the solvent chloroform, at a surface pressure maintained constantly, a glass substrate sufficiently cleaned having a hydrophilic surface was moved vertically in the direction transversing the water surface gently at a speed of 1.0 cm/min. to have a mixed monomolecular film of the DA compound and the polymethine compound transferred onto the substrate. Thus, optical recording media having a mixed monomolecular film and mixed monomolecular built-up films built up in 21 layers, 41 layers and 81 layers formed on the substrate, respectively, were prepared.

EXAMPLE 3-2

Optical recording media were prepared in the same manner as Example 3-1 except that 2 parts by weight of the diacetylene derivative compound were used per 1 part by weight of the polymethine compound.

EXAMPLE 3-3

Optical recording media were prepared in the same manner as Example 3-1 except that 10 parts by weight of the diacetylene derivative compound were used per 1 part by weight of the polymethine compound.

EXAMPLE 3-4

Optical recording media were prepared in the same manner as Example 3-1 except that 15 parts by weight of the diacetylene derivative compound were used per 1 part by weight of the polymethine compound.

RECORDING TEST 3-1

On each of the optical recording media prepared in Examples 3-1 to 3-4, UV-ray of 254 nm was irradiated uniformly and sufficiently to make the recording layer a blue film. Next, a semiconductor laser with output of 3 mW, wavelength of 830 nm and 1 μm of beam diameter was irradiated following an input information at the predetermined position on each recording medium surface (irradiation time 200 ns/1 bit) to form a red record image on the blue recording layer.

Evaluations of the recording results are shown in Table 3-1. Evaluation was conducted by judging whether the recording sensitivity, the image resolution and the image density are good or not, those which are particularly good are rated as ⊚, those which are good as O, and those which cannot be recorded or are bad as x.

TABLE 3-1

| Optical recording medium | Built-up number of films | Sensitivity | Resolution | Image density |
|---|---|---|---|---|
| Example 3-1 | 1 | O | ⊚ | X |
|  | 21 | ⊚ | ⊚ | ⊚ |
|  | 41 | ⊚ | ⊚ | ⊚ |
|  | 81 | ⊚ | ⊚ | ⊚ |
| Example 3-2 | 1 | O | ⊚ | X |
|  | 21 | ⊚ | ⊚ | ⊚ |
|  | 41 | ⊚ | ⊚ | ⊚ |
|  | 81 | ⊚ | ⊚ | ⊚ |
| Example 3-3 | 1 | O | ⊚ | X |
|  | 21 | ⊚ | ⊚ | ⊚ |
|  | 41 | ⊚ | ⊚ | ⊚ |
|  | 81 | ⊚ | ⊚ | ⊚ |
| Example 3-4 | 1 | X | X | X |
|  | 21 | O | ⊚ | X |
|  | 41 | O | O | X |
|  | 81 | O | O | O |

COMPARATIVE EXAMPLE 3-1

Optical recording media with a thickness of recording layer of 2000 Å were prepared in the same manner as Example 3-1 except that a solution of 3 parts by weight of the polymethine compound and 1 part by weight of nitrocellulose dissolved in 10 parts by weight of methylene chloride was used as the coating solution without using the diacetylene derivative compound.

RECORDING TEST 3-2

Recording was practiced according to the same operation as in Recording test 3-1 except for varying variously the irradiation time of the semiconductor laser beam onto the optical recording medium having 41 layers of mixed monomolecular built-up film prepared in Example 3-2 (irradiation time 200 to 800 ns/bit). Also, for the optical recording media of Comparative example 3-1, no UV-ray irradiation was practiced, but the semiconductor laser beam was irradiated on the recording layer surface at the predetermined positions with various irradiation time (irradiation time 500 ns/bit to 5 µs/bit) following an input information, thereby practicing recording by formation of pit.

For the optical recording media of Example 3-2, good recording could be practiced when the irradiation time was 200 ns or more, but, for the the optical recording media prepared in Comparative example 3-3, it was found necessary to take 2.5 µs or longer irradiation time for forming clearly one pit as the result of observation by a microscope.

EXAMPLE 3-5

According to the same procedure as in Example 3-2 except for using a diacetylene derivative compound of $C_8H_{17}$—C≡C—C≡C—$C_2H_4$—COOH in place of the diacetylene derivative compound of $C_{12}H_{25}$—C≡C—C≡C—$C_8H_{16}$—COOH, optical recording media were prepared.

EXAMPLE 3-6 to 3-9

According to the same procedure as in Example 3-5 except for using polymethine compound represented by the formulae 5-3, 5-7, 5-20 and 5-28, respectively, in place of the polymethine compound represented by the formula 5-16, optical recording media were prepared.

RECORDING TEST 3-3

By use of the optical recording media prepared in Examples 3-5 to 3-9, recording test was practiced in the same manner as Recording test 3-1. Evaluations of the recording results are shown in Table 3-2.

TABLE 3-2

| Optical recording medium | Built-up number of films | Sensitivity | Resolution | Image density |
|---|---|---|---|---|
| Example 3-5 | 1 | O | ⊚ | X |
|  | 21 | ⊚ | ⊚ | ⊚ |
|  | 41 | ⊚ | ⊚ | ⊚ |
|  | 81 | ⊚ | ⊚ | ⊚ |
| Example 3-6 | 1 | O | O | X |
|  | 21 | ⊚ | ⊚ | ⊚ |
|  | 41 | ⊚ | ⊚ | ⊚ |
|  | 81 | ⊚ | ⊚ | ⊚ |
| Example 3-7 | 1 | O | O | X |
|  | 21 | O | ⊚ | O |
|  | 41 | O | ⊚ | O |
|  | 81 | O | ⊚ | O |
| Example 3-8 | 1 | O | ⊚ | X |
|  | 21 | ⊚ | ⊚ | ⊚ |
|  | 41 | ⊚ | ⊚ | ⊚ |
|  | 81 | ⊚ | ⊚ | ⊚ |
| Example 3-9 | 1 | O | ⊚ | X |
|  | 21 | O | ⊚ | O |
|  | 41 | O | ⊚ | ⊚ |
|  | 81 | O | ⊚ | ⊚ |

EXAMPLE 4-1

A coating solution having 10 parts of an azulenium compound of formula 1-9 dissolved thoroughly in 20 parts of ethylene chloride was prepared as the coating solution.

Next, a glass substrate or carrier was mounted on a spinner coating machine and, after the above coating solution was added dropwise at the central portion of the above glass substrate, spinner rotation coating was effected for a predetermined time at a predetermined rotation number to obtain a desired film thickness.

Next, after a diacetylene derivative represented by $V_{12}H_{25}$—C≡C—C≡C—$C_8H_{16}$—COOH was dissolved at a concentration of $3 \times 10^{-3}$ mole/liter in chloroform, the solution was spread on an aqueous phase with pH 6.5 and a cadmium chloride concentration of $1 \times 10^{-3}$ mole/liter. After removal of the solvent chloroform by evaporation, the surface pressure was enhanced to 20 dyne/cm. At a surface pressure maintained constantly, a carrier of a glass substrate having a sufficiently clean surface and attached with a radiation absorbing layer was moved vertically in the direction transversing the water surface gently at a speed of 1.0 cm/min. to have a mixed diacetylene monomolecular transferred onto the carrier, thus forming diacetylene monomolecular film and built-up films thereof.

Thus, 25 kinds of recording media different in film thickness and built-up number as shown in Table 4-1 were prepared.

RECORDING TEST 4-1

On each of the optical recording media prepared in Example 4-1, UV-ray of 254 nm was irradiated uniformly and sufficiently to make the recording layer a blue film.

Next, a semiconductor laser beam with output of 3 mW, wavelength of 830 nm (beam diameter: 4 µm) was irradiated following an input information. The results are shown in Table 4-1.

However, evaluation was conducted by judging about possibility and quality of recording, and those which gave particularly good recording are rated as , those which gave good recording as , and those which gave inferior recording as x.

EXAMPLE 4-2

Recording media were prepared according to the same procedure as in Example 4-1 except for a compound of the formula $C_8H_{17}$—C≡C—C≡C—$C_2H_4$—COOH as the diacetylene derivative compound (Table 4-2).

RECORDING TEST 4-2

Except for using the recording media of Example 4-2, recording was performed in the same manner as Recording test 4-1. The results are shown in Table 4-2.

EXAMPLE 4-3

Recording media were prepared according to the same procedure as in Example 4-1 except for using a compound represented by the formula 1-33 as the azulenium compound.

RECORDING TEST 4-3

Except for using the recording media of Example 4-3, recording was performed in the same manner as Recording test 4-1. The results were the same as those shown in Tables 4-1 and 4-2.

Although not shown in Examples, in order to obtain more homegeneous film of a diacetylene derivative compound by enhancing adhesiveness between the azulenium salt compound and the deacetylene derivative compound, a built-up film comprising 2 to 3 layers of monomolecular film of stearic acid of arachic acid may be also interposed between the azulenium salt compound and the diacetylene derivative compound.

TABLE 4-1

Recording media with different film thickness and built-up numbers and recording results

| Monomolecular film of diacetylene | Film thickness of azulenium salt | | | | |
|---|---|---|---|---|---|
| | 100 Å | 200 Å | 1000 Å | 3000 Å | 6000 Å |
| 1 | ○ | ○ | ○ | ○ | ○ |
| 7 | ○ | ● | ● | ● | ○ |
| 41 | ○ | ● | ● | ● | ○ |
| 101 | ○ | ● | ● | ● | ○ |
| 201 | ○ | ○ | ○ | ○ | ○ |

TABLE 4-2

Recording media with different film thicknesses and built-up numbers and recording results

| Monomolecular film of diacetylene | Film thickness of azulenium salt | | | | |
|---|---|---|---|---|---|
| | 100 Å | 200 Å | 1000 Å | 3000 Å | 6000 Å |
| 1 | ○ | ○ | ○ | ○ | ○ |
| 7 | ○ | ● | ● | ● | ○ |
| 41 | ○ | ● | ● | ● | ○ |
| 101 | ○ | ● | ● | ● | ○ |
| 201 | ○ | ○ | ○ | ○ | ○ |

EXAMPLE 5-1

A coating solution obtained by dissolving 1 part by weight of a pyrylium dye represented by the formula 2-8 in 4 parts of methylene chloride was added dropwise in a small amount at the central portion of a disc substrate made of a glass (thickness 1.5 mm, diameter 200 mm) mounted on a spinner coating machine and coating carried out by rotating the spinner for a predetermined time at a predetermined rotation number, followed by drying at normal temperature, to prepare a number of samples with coated film thicknesses after drying on the substrate of 300 Å, 500 Å, 1000 Å, 3000 Å and 5000 Å, respectively.

Next, a solution of a diacetylene derivative represented by $C_{12}H_{25}$—C≡C—C≡C—$C_8H_{16}$—COOH dissolved at a concentration of $3 \times 10^{-3}$ mole/liter in chloroform was spread on an aqueous phase with pH 6.5 and a cadmium chloride concentration of $1 \times 10^{-3}$ mole/liter. After removal of the solvent chloroform, at a surface pressure maintained constantly, a glass substrate having the pyrylium dye layer previously formed thereon was moved vertically in the direction transversing the water surface gently at a speed of 1.0 cm/min. to have a DA monomolecular transferred onto the pyrylium layer. Thus, optical recording media having a monomolecular film and built-up films of 7 layers, 41 layers and 101 layers of monomolecular film formed on the substrate, respectively, were prepared.

RECORDING TEST 5-1

On each of the optical recording media prepared in Example 5-1, comparative tests 5-1 and 5-2, UV-ray of 254 nm was irradiated uniformly and suffuciently to make the recording layer a blue film. Next, a semiconductor laser beam with output of 3 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 5-1. Evaluation was conducted by the overall judgement about whether the recording sensitivity, the image resolution and the image density are good or not, and those which are particularly good are rated as ⊙, those which are good as ○, and those which cannot be recorded or are bad as x.

TABLE 5-1

| Example No. Thickness of B layer | Built-up number of monomolecular films in A layer | Sensitivity | Resolution | Image density |
|---|---|---|---|---|
| Example 5-1 300 Å | 1 | ● | ● | X |
| | 7 | ● | ● | O |
| | 41 | X | O | O |
| | 101 | X | X | O |
| Example 5-1 500 Å | 1 | ● | ● | X |
| | 7 | ● | ● | O |
| | 41 | ◉ | ● | ● |
| | 101 | X | X | ● |
| Example 5-1 1000 Å | 1 | ● | ● | X |
| | 7 | ◉ | ● | O |
| | 41 | ◉ | ● | ◉ |
| | 101 | ◉ | ◉ | ◉ |
| Example 5-1 3000 Å | 1 | ◉ | ◉ | X |
| | 7 | ◉ | ◉ | O |
| | 41 | ◉ | ◉ | ◉ |
| | 101 | ◉ | ◉ | ◉ |
| Example 5-1 5000 Å | 1 | ◉ | ◉ | X |
| | 7 | ◉ | ◉ | O |
| | 41 | ◉ | ◉ | ◉ |
| | 101 | ◉ | ◉ | ◉ |

COMPARATIVE EXAMPLE 5-1

A solution of 3 parts by weight of the pyrylium dye and 1 part by weight of nitrocellulose dissolved in 20 parts by weight of methylene chloride was used as the coating solution, B layer with a thickness of 1000 Å was formed according to the same method as in Example 5-1 and this was provided as such for an optical recording medium.

EXAMPLE 5-2

On the B layer of the optical recording medium formed in Comparative example 5-2, an optical recording medium having a monomolecular built-up film of DA compound of 21 layers was formed in the same manner as Example 5-1.

RECORDING TEST 5-2

Recording was practiced according to the same operation as in Recording test 5-1 except for varying variously the irradiation time of the semiconductor laser beam onto the optical recording medium prepared in Example 5-2 (irradiation time 100 to 800 ns/bit). Also, for the optical recording media of Comparative example 5-1, no UV-ray irradiation was practiced, but the semiconductor laser beam was irradiated on the recording layer surface at the predetermined positions with the same output and various irradiation time (irradiation time 500 ns/bit to 5 $\mu$s/bit) following an input information, thereby practicing recording by formation of pit.

For the optical recording media of Example 5-2, good recording could be practiced when the irradiation time was 200 ns or more, but, for the optical recording media prepared in Comparative example 5-1, it was found necessary to take 2 $\mu$s or longer irradiation time for forming clealy one bit as the result of observation by a microscope.

EXAMPLE 5-3

According to the same procedure as in Example 5-1 except for using a diacetylene derivative compound represented by the formula by $C_8H_{17}$—C≡C—C≡C—$C_2H_4$—COOH in place of the diacetylene derivative compound represented by the formula $C_{12}H_{25}$—C≡C—C≡C—$C_8H_{16}$—COOH, an optical recording medium with a thickness of the B layer of 1000 Å and a built-up degree of 21 of monomolecular layers of the DA compound was prepared.

EXAMPLE 5-4

According to the same procesure as in Example 5-3 except for using a thiopyrylium dye represented by the formula 2-4 in place of the pyrylium dye represented by the formula 2-8, an optical recording medium was prepared.

EXAMPLE 5-5

According to the same procedure an in Example 5-3 except for using a selenapyrylium dye represented by the formula 2-10 in place of the pyrylium dye represented by the formula 2-8, an optical recording medium was prepared.

EXAMPLE 5-6

According to the same procedure as in Example 5-3 except for using a pyrylium dye represented by the formula 2-17 in place of the pyrylium dye represented by the formula 2-8, an optical recording medium was prepared.

EXAMPLE 5-7

According to the same procedure an in Example 5-3 except for using a thiopyrylium dye represented by the formula 2-19 in place of the pyrylium dye represented by the formula 2-8, an optical recording medium was prepared.

EXAMPLE 5-8

A solution of part by weight of a thyopyrylium dye represented by the above formula 2-7 and 2 parts by weight of arachic acid dissolved in chloroform at a concentration of $1 \times 10^{-3}$ mol/liter was spread on an aqueous phase with pH 6.5 and a concentration of cadmium chloride of $1 \times 10^{-3}$ mol/liter. After removal of the solvent chloroform, at a surface pressure maintained constantly, a glass substrate sufficiently cleaned having a hydrophilic surface (including the case having already formed a built-up film consisting of monomolecular films of DA compound, etc.) was moved vertically in the direction transversing the water surface gently at a speed of 1.0 cm/min. 21 times (drying step is practiced as the intermediate step), and the built-up monomolecular films containing pyrylium dyes were transferred onto the substrate.

Subsequently, by use of this substrate, according to the same operation as in Example 5-1, the built-up monomolecular films of 21 layers of the DA compound were transferred onto the built-up monomolecular films containing pyrylium dyes to prepare an optical recording medium.

RECORDING TEST 5-3

By use of the optical recording media prepared in Examples 5-3 to 5-8, recording test was practiced in the same manner as Recording test 5-1. Evaluations of the recording results are shown in Table 5-2.

TABLE 5-2

| Recording medium | Sensitivity | Resolution | Image density |
| --- | --- | --- | --- |
| Example 5-3 | ◉ | ◉ | ◉ |
| Example 5-4 | ◉ | ◉ | ◉ |
| Example 5-5 | ◉ | ◉ | ◉ |
| Example 5-6 | ◉ | ◉ | ◉ |
| Example 5-7 | ◉ | ○ | ◉ |
| Example 5-8 | ◉ | ◉ | ◉ |

EXAMPLE 6-1

A coating solution obtained by dissolving 1 part by weight of a diene compound salt represented by the formula 3-7 and 0.2 part by weight of nitrocellulose in 10 parts by weight of methylene chloride was added dropwise in a small amount at the central portion of a disc substrate made of a glass (thickness 1.5 mm, diameter 200 mm) mounted on a spinner coating machine and coating carried out by rotating the spinner for a predetermined time at a predetermined rotation number, followed by drying at normal temperature, to prepare a number of samples with coated film thicknesses after drying on the substrate of 300 Å, 500 Å, 1000 Å, 3000 Å, and 5000 Å, respectively.

Next, a solution of a diacetylene derivative represented by $C_{12}H_{25}$—C≡C—C≡C—$C_8H_{16}$—COOH dissolved at a concentration of $3 \times 10^{-3}$ mole/liter in chloroform was spread on an aqueous phase with pH 6.5 and a cadmium chloride concentration of $1 \times 10^{-3}$ mole/liter. After removal of the solvent chloroform, at a surface pressure maintained constantly, a glass substrate having the diene compound salt layer previously formed thereon was moved vertically in the direction transversing the water surface gently at a speed of 1.0 cm/min. to have a DA compound monomlecular transferred onto the diene compound salt layer. Thus, optical recording media having a monomolecular film and built-up films of 7 layers, 41 layers and 101 layers of monomolecular film formed on the substrate, respectively, were prepared.

RECORDING TEST 6-1

On each of the optical recording media prepared in Example 6-1, UV-ray of 254 nm was irradiated uniformly and sufficiently to make the recording layer a blue film. Next, a semiconductor laser beam with output of 3 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 6-1. Evaluation was conducted by the overall judgement about whether the recording sensitivity, the image resolution and the image density are good or not, and those which are particularly good are rated as ⊚, those which are good as ○, and those which cannot be recorded or are bad as x.

TABLE 6-1

| Example No. thickness of B layer | Built-up number of monomolecular films is A layer | Sensitivity | Resolution | Image density |
|---|---|---|---|---|
| Example 6-1 300 Å | 1 | ⊚ | ⊚ | X |
| | 7 | ⊚ | ⊚ | X |
| | 41 | ⊚ | ⊚ | ⊚ |
| | 101 | ○ | ○ | ⊚ |
| Example 6-1 500 Å | 1 | ⊚ | ⊚ | X |
| | 7 | ⊚ | ⊚ | X |
| | 41 | ⊚ | ⊚ | ⊚ |
| | 101 | ⊚ | ⊚ | ⊚ |
| Example 6-1 1000 Å | 1 | ⊚ | ⊚ | X |
| | 7 | ⊚ | ⊚ | X |
| | 41 | ⊚ | ⊚ | ⊚ |
| | 101 | ⊚ | ⊚ | ⊚ |
| Exapmle 6-1 3000 Å | 1 | ⊚ | ⊚ | X |
| | 7 | ⊚ | ⊚ | X |
| | 41 | ⊚ | ⊚ | ⊚ |
| | 101 | ⊚ | ⊚ | ⊚ |
| Example 6-1 5000 Å | 1 | ⊚ | ○ | X |
| | 7 | ⊚ | ○ | X |
| | 41 | ⊚ | ⊚ | ⊚ |
| | 101 | ⊚ | ⊚ | ⊚ |

COMPARATIVE EXAMPLE 6-3

A solution of 1 part by weight of the diene compound salt and 1 part by weight of nitrocellulose dissolved in 4 parts by weight of methylene chloride was used as the coating solution, B layer with a thickness of 3000 Å was formed according to the same method as in Example 6-1 and this was provided as such for an optical recording medium.

EXAMPLE 6-2

On the B layer of the optical recording medium formed in Comparative example 6-3, an optical recording medium having a monomolecular built-up film of DA compound of 61 layers was formed in the same manner as Example 6-1.

RECORDING TEST 6-2

Recording was practiced according to the same operation as in Recording test 6-1 except for varying variously the irradiation time of the semiconductor laser beam onto the optical recording medium prepared in Example 6-2 (irradiation time 200 to 800 ns/bit). Also, for the optical recording media of Comparative example 6-3, no UV-ray irradiation was practiced, but the semiconductor layer beam was irradiated on the recording layer surface at the predetermined positions with the same output and various irradiation time (irradiation time 500 ns/bit to 5 μs/bit) following an input information, thereby practicing recording by formation of pits.

For the optical recording media of Example 6-2, good recording could be practiced when the irradiation time was 200 ns or longer, but, for the optical recording media prepared in Comparative example 6-3, it was found necessary to take 2.5 ns or longer irradiation time for forming clearly one pit as the result of observation by a microscope.

EXAMPLE 6-3

According to the same procedure as in Example 6-1 except for using a diacetylene derivative compound represented by the formula by $C_8H_{17}-C\equiv C-C\equiv C-C_2H_4-COOH$ in place of the diacetylene derivative compound represented by the formula $C_{12}H_{25}-C=-C\equiv C-C_8H_{16}-COOH$, an optical recording medium with a thickness of the B layer of 3000 Å and a built-up degree of 61 of monomolecular layers of the DA compound was prepared.

EXAMPLES 6-4 to 6-8

According to the same procedure as in Example 6-3 except for using diene compounds salts represented by the formulae 3-5, 3-10, 3-14, 3-17 and 3-22, respectively, in place of the diene compound salt represented by the formula 3-7, optical recording media were prepared.

RECORDING TEST 6-3

By use of the optical recording media prepared in Examples 6 3 to 6-8, recording test was practiced in the same manner as Recording test 6-1. Evaluations of the recording results are shown in Table 6-2.

TABLE 6-2

| Recording medium | Sensitivity | Resolution | Image density |
|---|---|---|---|
| Example 6-3 | ⊚ | ⊚ | ⊚ |
| Example 6-4 | ⊚ | ⊚ | ⊚ |
| Example 6-5 | ○ | ○ | ○ |
| Example 6-6 | ⊚ | ⊚ | ⊚ |
| Example 6-7 | ⊚ | ⊚ | ⊚ |
| Example 6-8 | ⊚ | ⊚ | ⊚ |

EXAMPLE 7-1

A coating solution obtained by dissolving 1 part by weight of a croconic methine dye represented by the formula 4-5 in 10 parts of ethylene chloride was added dropwise in a small amount at the central portion of a disc substrate made of a glass (thickness 1.5 mm, diameter 200 mm) mounted on a spinner coating machine and coating carried out by rotating the spinner for a predetermined time at a predetermined rotation speed, followed by drying at normal temperature, to prepare a number of samples with coated film thicknesses after drying on the substrate of 100 Å, 200 Å, 1000 Å, 3000 Å and 6000 Å, respectively.

Next, a solution of a diacetylene derivative represented by $C_{12}H_{25}-C\equiv C-C\equiv C-C_8H_{16}-COOH$ dissolved at a concentration of $3\times10^{-3}$ mole/liter in chloroform was spread on an aqueous phase with pH 6.5 and a cadmium chloride concentration of $1\times10^{-3}$ mole/liter. After removal of the solvent chloroform, the surface pressure was enhanced to 20 dyne/cm and at the surface pressure maintained constantly, a glass substrate having the croconic methine dye layer previously formed thereon was moved vertically in the direction transversing the water surface gently at a speed of 1.0 cm/min. to have a DA monomolecular transferred onto the croconic methine dye layer. Thus, optical recording media having a monomolecular film and built-up films of 7 layers, 41 layers, 101 layers and 201 layers of monomolecular film formed on the substrate, respectively, were prepared.

RECORDING TEST 7-1

On each of the optical recording media prepared in Example 7-1, UV-ray of 254 nm was irradiated uniformly and sufficiently to make the recording layer a blue film. Next, a semiconductor layer beam with output of 3 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 7-1. Evaluation was conducted by the overall judgement about whether the recording sensitivity, the image resolution and the image density are good or not, and those which are particularly good are rated as ⊚, those which are good as ○, and those which cannot be recorded or are bad as x.

TABLE 7-1

| Example No. thickness of B layer | Built-up number of monomolecular films is A layer | Sensitivity | Resolution | Image density |
|---|---|---|---|---|
| Example | | | | |
| 100 Å | 1 | ⊚ | ⊚ | X |
| | 7 | ⊚ | ● | ○ |
| | 41 | X | X | X |
| | 101 | X | X | X |
| | 201 | X | X | X |
| 200 Å | 1 | ● | ● | X |
| | 7 | ● | ● | ○ |
| | 41 | ○ | ○ | ○ |
| | 101 | X | X | X |
| | 201 | X | X | X |
| 1000 Å | 1 | ● | ● | X |
| | 7 | ● | ● | ○ |
| | 41 | ● | ● | ● |
| | 101 | ● | ● | ● |
| | 201 | ● | ● | ● |
| 3000 Å | 1 | ● | ⊚ | X |
| | 7 | ● | ● | ○ |
| | 41 | ● | ● | ● |
| | 101 | ● | ● | ⊚ |
| | 201 | ● | ● | ⊚ |
| 6000 Å | 1 | ⊚ | ○ | X |
| | 7 | ⊚ | ○ | ○ |
| | 41 | ● | ○ | ⊚ |
| | 101 | ● | ○ | ⊚ |
| | 201 | ● | ○ | ⊚ |

COMPARATIVE EXAMPLE 7-3

A solution of 3 parts by weight of the croconic methine dye and 1 part by weight of nitrocellulose dissolved in 22 parts by weight of methylene chloride was used as the coating solution, B layer with a thickness of 1000 Å was formed according to the same method as in Example 7-1 and this was provided as such for an optical recording medium.

EXAMPLE 7-2

On the B layer of the optical recording medium formed in Comparative example 7-3, an optical recording medium having a monomolecular built-up film of DA compound of 41 layers was formed in the same manner as Example 7-1.

RECORDING TEST 7-2

Recording was practiced according to the same operation as in Recording test 7-1 except for varying variously the irradiation time of the semiconductor layer beam onto the optical recording medium prepared in Example 7-2 (irradiation time 100 to 800 ns/bit). Also, for the optical recording media of Comparative example 7-3, no UV-ray irradiation was practiced, but the semiconductor laser beam was irradiated on the recording layer surface at the predetermined positions with the same output and various irradiation time (irradiation time 500 ns/bit to 5 μs/bit) following an input information, thereby practicing recording by formation of pits.

For the optical recording media of Example 7-2, good recording could be practiced when the irradiation time was 300 ns or more, but, for the optical recording media prepared in Comparative example 7-3, it was found necessary to take 2 μs or longer irradiation time for forming clearly one pit as the result of observation by a microscope.

EXAMPLE 7-3

According to the same procedure as in Example 7-1 except for using a diacetylene derivative compound represented by the formula by $C_8H_{17}-C\equiv C-C\equiv C-C_2H_4-COOH$ in place of the diacetylene derivative compound represented by the formula $C_{12}H_{25}-C\equiv C-C\equiv C-C_8H_{16}-COOH$, an optical recording medium with a thickness of the B layer of 1000 Å and a built-up degree of 41 of monomolecular layers of the DA compound was prepared.

EXAMPLES 7-4 to 7-12

According to the same procedure as in Example 4-3 except for using croconic methine dyes represented by the formulae 4-12, 4-23, 4-28, 4-31, 4-36, 4-37, 4-39, 4-40 and 4-42, respectively in place of the croconic methine dye represented by the formula 4-5, optical recording media were prepared.

RECORDING TEST 7-3

By use of the optical recording media prepared in Examples 7-3 to 7-12, recording test was practiced in the same manner as Recording test 7-1. Evaluations of the recording results are shown in Table 7-2.

TABLE 7-2

| Recording medium | Sensitivity | Resolution | Image density |
|---|---|---|---|
| Example 7-3 | ⊚ | ⊚ | ⊚ |
| Example 7-4 | ⊚ | ⊚ | ⊚ |

TABLE 7-2-continued

| Recording medium | Sensitivity | Resolution | Image density |
|---|---|---|---|
| Example 7-5 | ● | ◎ | ○ |
| Example 7-6 | ● | ◎ | ◉ |
| Example 7-7 | ● | ○ | ◉ |
| Example 7-8 | ○ | ◉ | ○ |
| Example 7-9 | ◉ | ● | ◎ |
| Example 7-10 | ◉ | ● | ● |
| Example 7-11 | ● | ◉ | ● |
| Example 7-12 | ○ | ○ | ○ |

EXAMPLE 8-1

A coating solution obtained by dissolving 1 part by weight of a polymethine compound represented by the formula 5-16 in 4 parts by weight of methylene chloride was added dropwise in a small amount at the central portion of a disc substrate made of a glass (thickness 1.5 mm, diameter 200 mm) mounted on a spinner coating machine and coating carried out by rotating the spinner for a predetermined time at a predetermined rotation speed, followed by drying at normal temperature, to prepare a number of samples with coated film thicknesses after drying on the substrate of 300 Å, 500 Å, 1000 Å, 3000 Å and 5000 Å, respectively.

Next, a solution of a diacetylene derivative represented by $C_{12}H_{25}-C\equiv C-C\equiv C-C_8C_{16}-COOH$ dissolved at a concentration of $3\times10^{-3}$ mole/liter in chloroform was spread on an aqueous phase with pH 6.5 and a cadmium chloride concentration of $1\times10^{-3}$ mole/liter. After removal of the solvent chloroform, at a surface pressure maintained constantly, a glass substrate having the polymethine compound layer previously formed thereon was moved vertically in the direction transversing the water surface gently at a speed of 1.0 cm/min. to have a DA monomolecular transferred onto the polymethine compound layer. Thus, optical recording media having a monomolecular film and built-up films of 7 layers, 41 layers and 101 layers of monomolecular film formed on the substrate, respectively, were prepared.

RECORDING TEST 8-1

On each of the optical recording media prepared in Example 8-1, UV-ray of 254 nm was irradiated uniformly and sufficiently to make the recording layer a blue film. Next, a semiconductor laser beam with output of 3 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 8-1. Evaluation was conducted by the overall judgement about whether the recording sensitivity, the image resolution and the image density are good or not, and those which are particularly good are rated as ⊚, those which are good as ○, and those which cannot be recorded or are bad as x.

TABLE 8-1

| Example No. thickness of B layer | Built-up number of monomolecular films is A layer | Sensitivity | Resolution | Image density |
|---|---|---|---|---|
| Example 8-1 300 Å | 1 | ⊚ | ⊚ | X |
|  | 7 | ⊚ | ⊚ | X |
|  | 41 | ○ | ○ | ○ |
|  | 101 | X | X | X |
| Example 8-1 500 Å | 1 | ⊚ | ⊚ | X |
|  | 7 | ⊚ | ⊚ | X |
|  | 41 | ⊚ | ⊚ | ⊚ |
|  | 101 | ○ | ○ | ○ |
| Example 8-1 1000 Å | 1 | ⊚ | ⊚ | X |
|  | 7 | ⊚ | ⊚ | X |
|  | 41 | ⊚ | ⊚ | ⊚ |
|  | 101 | ⊚ | ⊚ | ⊚ |
| Example 8-1 3000 Å | 1 | ⊚ | ⊚ | X |
|  | 7 | ⊚ | ⊚ | X |
|  | 41 | ⊚ | ⊚ | ⊚ |
|  | 101 | ⊚ | ⊚ | ⊚ |
| Example 8-1 5000 Å | 1 | ⊚ | ⊚ | X |
|  | 7 | ⊚ | ⊚ | X |
|  | 41 | ⊚ | ⊚ | ⊚ |
|  | 101 | ⊚ | ⊚ | ⊚ |

COMPARATIVE EXAMPLE 8-1

A solution of 3 parts by weight of the polymethine compound and 1 part by weight of nitrocellulose dissolved in 20 parts by weight of methylene chloride was used as the coating solution, B layer with a thickness of 1000 Å was formed according to the same method as in Example 8-1 and this was provided as such for an optical recording medium.

EXAMPLE 8-2

On the B layer of the optical recording medium formed in Comparative example 8-1, an optical recording medium having a monomolecular built-up film of DA compound of 41 layers was formed in the same manner as Example 8-1.

RECORDING TEST 8-2

Recording was practiced according to the same operation as in Recording test 8-1 except for varying variously the irradiation time of the semiconductor laser beam onto the optical recording medium prepared in Example 8-2 (irradiation time 100 to 800 ns/bit). Also, for the optical recording media of Comparative example 8-1, no UV-ray irradiation was practiced, but the semiconductor laser beam was irradiated on the recording layer surface at the predetermined positions with the same output and various irradiation time (irradiation time 500 ns/bit to 4 μs/bit) following an input information, thereby practicing recording by formation of pit.

For the optical recording media of Example 8-2, good recording could be practiced when the irradiation time was 200 ns or more, but, for the optical recording media prepared in Comparative example 8-1, it was found necessary to take 2.5 μs or longer irradiation time for forming clearly one pit as the result of observation by a microscope.

EXAMPLE 8-3

According to the same procedure as in Example 8-1 except for using a diacetylene derivative compound represented by the formula by $C_8H_{17}-C\equiv C-C\equiv C-C_2H_4-COOH$ in place of the diacetylene derivative compound represented by the formula $C_{12}H_{25}-C\equiv C-C\equiv C-C_8H_{16}-COOH$, an optical recording medium with a thickness of the B layer of 1000 Å and a built-up degree of 21 of monomolecular layers of the DA compound was prepared.

EXAMPLES 8-4 to 8-7

According to the same procedure as in Example 8-3 except for using polymethine compounds represented by the formulae 5-3, 5-7, 5-20 and 5-28, respectively, in place of the polymethine compound represented by the formula 5-16, optical recording media were prepared.

EXAMPLE 8-8

A solution of 1 part by weight of a thiopolymethine compound represented by the above formula 5-6 and 2 parts by weight of arachic acid dissolved in chloroform at a concentration of $1\times10^{-3}$ mol/liter was spread on an aqueous phase with pH 6.5 and a concentration of cadmium chloride of $1\times10^{-3}$ mol/liter. After removal of the solvent chloroform, at a surface pressure maintained constantly, a glass substrate sufficiently cleaned having a hydrophilic surface (including the case having already formed a built-up film consisting of monomolecular films of DA compound, etc.) was moved vertically in the direction transversing the water surface gently at a speed of 1.0 cm/min. 40 times (drying step is practiced as the intermediate step), and the built-up monomolecular films of 40 layers containing polymethine compounds were transferred onto the substrate.

Subsequently, by use of this substrate, according to the same operation as in Example 8-1, the built-up monomolecular films of 80 layers of the DA compound were transferred onto the built-up monomolecular films containing polymethine compounds to prepare an optical recording medium.

RECORDING TEST 8-3

By use of the optical recording media prepared in Examples 8-3 to 8-8, recording test was practiced in the same manner as Recording test 8-1. Evaluations of the recording results are shown in Table 8-2.

TABLE 8-2

| Recording medium | Sensitivity | Resolution | Image density |
|---|---|---|---|
| Example 8-3 | ◉ | ◉ | ◉ |
| Example 8-4 | ◉ | ◉ | ◉ |
| Example 8-5 | ● | ○ | ● |
| Example 8-6 | ○ | ○ | ○ |
| Example 8-7 | ◉ | ◉ | ◉ |
| Example 8-8 | ◉ | ◉ | ◉ |

EXAMPLE 9-1

After 1 part by weight of the AZ compound of the formula 1-6 was dissolved in chloroform at a concentration of $5\times10^{-3}$ mol/liter, the solution was spread on an aqueous phase.

After evaporation of the solvent chloroform, the surface pressure was enhanced to 20 dyn/cm. At the surface pressure maintained to be constant, a carrier of a glass substrate with sufficiently clean surface was moved vertically in the direction transversing the water surface gently at a speed of 1.0 cm/min. to have the above AZ compound transferred onto the carrier. Thus, a monomolecular film and monomolecular films built up to 7 layers, 41 layers and 101 layers, respectively, were formed on the substrate.

Next, on another aqueous phase with pH 6.5 and a cadmium chloride solution of $1\times10^{-3}$ mol/liter, a solution of a diacetylene derivative compound represented by $C_{12}H_{23}-C\equiv C-C\equiv C-C_8H_{16}-COOH$ dissolved in chloroform at a concentration of $3\times10^{-3}$ mol/liter was spread.

The above substrates having the monomolecular film of the AZ compound and built-up films thereof laminated thereon were subjected to the same operation as described above to form, on the AZ compound, a monomolecular film of the DA compound and monomolecular films built up to 7 layers, 41 layers and 101 layers, respectively, to prepare optical recording media of the present invention.

EXAMPLE 9-2

Optical recording media were prepared in the same manner as Example 9-1 except for using the AZ compound of the formula 1-25 in place of the AZ compound of the formula 1-6.

EXAMPLE 9-3

According to the same procedure as in Example 9-1 except for using $C_8H_{17}-C\equiv C-C\equiv C-C_2H_4-COOH$ in place of the DA compound represented by $C_{12}H_{25}-C\equiv C-C\equiv C-C_8H_{16}-COOH$, optical recording media were prepared.

EXAMPLE 9-4

According to the same procedure as in Example 9-2 except for using $C_8H_{17}-C\equiv C-C\equiv C-C_2H_4-COOH$ in place of the DA compound represented by $C_{12}H_{25}-C\equiv C-C\equiv C-C_8H_{16}-COOH$, optical recording media were prepared.

EXAMPLE 9-5

Optical recording media were prepared in the same manner as Example 9-1 except for using 2 parts by weight of arachic acid and 1 part by weight of the AZ compound represented by the formula 1-4 in place of the AZ compound of the formula 1-6.

EXAMPLE 9-6

Optical recording media were prepared in the same manner as Example 9-3 except for using 2 parts by weight of arachic acid and 1 part by weight of the AZ compound represented by the formula 1-22 in place of the AZ compound of the formula 1-6.

RECORDING TEST

On each of the optical recording media prepared in Examples 9-1 to 9-6, UV-ray of 254 nm was irradiated uniformly and sufficiently to make the recording layer a blue film. Next, a semiconductor laser beam with output of 3 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 9-1. Evaluation was conducted by judging whether, the recording sensitivity, the image resolution and the image density are good or not, and those which are particularly good are rated as , those which are good as , and those which cannot be recorded or are bad as x.

Also, film forming characteristic was evaluated for film forming percentage and surface irregularity of the film.

The film forming percentage was determined by carrying out the operation of building up 100 monomolecular films on a 20 mm φ circular glass substrate by employing 50 glass substrates, and calculating the rate of the number of operations of the 50 operations when the film was cleanly transferred onto the substrate without occurrence of peeling or peel-off of the monomolecular film during the building-up step:

50% or less: x
50-80%: ○
80% or more: ⊙

The surface irregularity of the film was determined by observing the film surface state with naked eyes and by an optical microscope (magnification×500) and rating the film surface which is uniform as ○ one having peel-off partially occurred as Δ, and one having peel-off occurred over a wide range and showing clear unevenness on the surface as x.

By symbols shown for constituting the media have the following meanings:

(1) G/10* (DA/AZ)

A constitution, in which the monomolecular film of the DA compound and the monomolecular films of the AZ compound were laminated (built up) on the glass substrate (G) one another and it is repeated 10 times;

(2) G/30DA/20AZ/30DA

A constitution, in which 30 layers of the monomolecular film of the DA compound were laminated on the glass substrate, then 20 layers of the monomolecular film of the AZ compound laminated thereon and further 30 layers of the DA compound laminated thereon.

Examples 10-3 to 10-5 were also prepared in the same manner as described above as shown in Table 10-1.

TABLE 9-1

| Recording medium | Built-up number of AZ compound | Built-up number of DA compounds | Sensitivity | Resolution | Image density | Film forming percentage | Surface irregularity |
|---|---|---|---|---|---|---|---|
| Example 9-1 | 1 | 1 | ⊙ | ⊙ | X | ⊙ | ○ |
|  | 7 | 7 | ⊙ | ⊙ | ⊙ | ⊙ | ○ |
|  | 41 | 41 | ⊙ | ⊙ | ⊙ | ⊙ | ○ |
|  | 101 | 101 | ○ | ○ | ⊙ | ⊙ | ○ |
| Example 9-2 | 1 | 1 | ⊙ | ⊙ | X | ⊙ | ○ |
|  | 7 | 7 | ⊙ | ⊙ | ⊙ | ⊙ | ○ |
|  | 41 | 41 | ⊙ | ⊙ | ⊙ | ⊙ | ○ |
|  | 101 | 101 | ○ | ○ | ⊙ | ⊙ | ○ |
| Example 9-3 | 1 | 1 | ⊙ | ⊙ | X | ⊙ | ○ |
|  | 7 | 7 | ⊙ | ⊙ | ⊙ | ⊙ | ○ |
|  | 41 | 41 | ⊙ | ⊙ | ⊙ | ⊙ | ○ |
|  | 101 | 101 | ○ | ○ | ⊙ | ⊙ | ○ |
| Example 9-4 | 1 | 1 | ⊙ | ⊙ | X | ⊙ | ○ |
|  | 7 | 7 | ⊙ | ⊙ | ⊙ | ⊙ | ○ |
|  | 41 | 41 | ⊙ | ⊙ | ⊙ | ⊙ | ○ |
|  | 101 | 101 | ○ | ○ | ⊙ | ⊙ | ○ |
| Example 9-5 | 1 | 1 | ○ | ○ | X | X | Δ |
|  | 7 | 7 | ○ | ○ | ⊙ | X | Δ |
|  | 41 | 41 | ○ | ○ | ⊙ | X | Δ |
|  | 101 | 101 | X | ○ | ⊙ | X | Δ |
| Example 9-6 | 1 | 1 | ○ | ○ | X | X | Δ |
|  | 7 | 7 | ○ | ○ | ⊙ | X | Δ |
|  | 41 | 41 | ○ | ○ | ⊙ | X | Δ |
|  | 101 | 101 | X | ○ | ⊙ | X | Δ |

EXAMPLES 10-1 to 10-5

A solution of 1 part by weight of the AZ compound of the formula 1-6 dissolved in chloroform at a concentration of $5 \times 10^{-3}$ mol/liter was spread on an aqueous phase.

After removal of the solvent chloroform, at a surface pressure maintained to be constant, a glass substrate with sufficiently clean surface and having a hydrophilic surface was moved vertically in the direction transversing the water surface gently at a speed of 1.0 cm/min. to have a monomolecular film of the AZ compound or built-up films thereof transferred onto the substrate.

Next, on another aqueous phase with pH 6.5 and a cadmium chloride solution of $1 \times 10^{-3}$ mol/liter, a solution of 1 part by weight of a diacetylene derivative compound represented by $C_{12}H_{25}-C\equiv C-C\equiv C-C_8H_{16}-COOH$ dissolved in chloroform at a concentration of $3 \times 10^{-3}$ mol/liter was spread.

The above substrates having the monomolecular fiml of the AZ compound or built-up films thereof laminated thereon were subjected to the same operation as described above to have a monomolecular film or built-up films thereof transferred thereon.

By repeating this operation, the optical recording media as shown in Table 10-1 were prepared.

EXAMPLES 10-6 to 10-7

Optical recording media were prepared in the same manner as Examples 10-1 to 10-2 except for using 2 parts by weight of arachic acid and 1 part by weight of the AZ compound represented by the formula 1-4 in place of 1 part by weight of the AZ compound of the formula 1-6 in Examples 10-1 to 10-2.

EXAMPLES 10-8 to 10-12

According to the same procedure as in Examples 10-1 to 10-5 except for using $C_8H_{17}-C\equiv C-C\equiv C-C_2H_4-COOH$ in place of $C_{12}H_{25}-C\equiv C-C\equiv C-C_8H_{16}-COOH$ and the compound of the formula 1-25 in place of the compound of the formula 1-6 in Examples 10-1 to 10-5, optical recording media were prepared. See Table 10-2.

EXAMPLES 10-13 to 10-14

According to the same procedure as in Examples 10-8 to 10-9 except for using 2 parts by weight of arachic acid (hereinafter called AR compound) and 1 part by weight of the compound represented by the formula 1-22 (hereinafter called AZ* compound) in place of the compound of the formula 1-25, optical recording media were prepared. See Table 10-2.

RECORDING TEST

On each of the optical recording media prepared in Examples 10-1 to 10-14, UV-ray of 254 nm was irradiated uniformly and sufficiently to make the recording layer a blue film. Next, a semiconductor laser beam with output of 2 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 10-3. Evaluation was conducted by judging whether the image resolution is good or not, and those which are particularly good are rated as ⊙ those which are good as ○ and those which cannot be recorded or are bad as x. Also, the recording sensitivity was evaluated by the minimum irradiation time for practicing the color change recording capable of reading when the irradiation time of laser beam was altered at the same lutput.

Reading was conducted by irradiating a visible light of 500 to 750 nm and detecting its reflected light.

Also, film forming characteristic was evaluated for film forming percentage and surface irregularity of the film.

The film forming percentage was determined by carrying out the operation of building up monomolecular film on a 20 mm φ calculating the rate of the number of operations of the 50 operations when the film was cleanly transferred onto the substrate without occurrence of peeling or peel-off of the monomolecular film during the built-up step:

50% or less: x
50–80%: ○
80% or more: ⊙

The surface irregularity of the film was determined by observing the film surface state with naked eyes and by an optical microscope (magnification×500) and rating the film surface which is uniform as ○ one having peel-off partially occurred as Δ, and one having peel-off occurred over a wide range and showing clear unevenness on the surface as x.

TABLE 10-1

| Optical recording medium | Constitution of optical recording medium |
|---|---|
| Example 10-1 | G/10* (AZ/DA) |
| Example 10-2 | G/30DA/20AZ/30DA |
| Example 10-3 | G/20* (2AZ/3DA) |
| Example 10-4 | B/3* (2AZ/2DA) |
| Example 10-5 | G/5* (5AZ/10DA) |
| Example 10-6 | G/10* (AR · AZ*/2DA) |
| Example 10-7 | G/30DA/20AR · AZ*/30DA |

TABLE 10-2

| Optical recording medium | Constitution of optical recording medium |
|---|---|
| Example 10-8 | G/10* (AZ/DA) |
| Example 10-9 | G/30DA/20AZ/30DA |
| Example 10-10 | G/20* (2AZ/3DA) |
| Example 10-11 | G/3* (2AZ/2DA) |
| Example 10-12 | G/5* (5AZ/10DA) |
| Example 10-13 | G/10* (AR · AZ*/2DA) |
| Example 10-14 | G/30DA/20AR · AZ*/30DA |

TABLE 10-3

| Optical recording medium | Sensitivity (ns) | Resolution | Film forming percentage | Surface irregularity |
|---|---|---|---|---|
| Example 10-1 | 70 | ⊙ | ⊙ | ○ |
| Example 10-2 | 150 | ○ | ⊙ | ○ |
| Example 10-3 | 90 | ⊙ | ⊙ | ○ |
| Example 10-4 | 80 | ⊙ | ⊙ | ○ |
| Example 10-5 | 90 | ⊙ | ⊙ | ○ |
| Example 10-6 | 180 | ○ | x | Δ |
| Example 10-7 | 180 | ○ | x | Δ |
| Example 10-8 | 80 | ⊙ | ⊙ | ○ |
| Example 10-9 | 160 | ⊙ | ⊙ | ○ |
| Example 10-10 | 100 | ⊙ | ⊙ | ○ |
| Example 10-11 | 90 | ⊙ | ⊙ | ○ |
| Example 10-12 | 100 | ⊙ | ⊙ | ○ |
| Example 10-13 | 190 | ○ | x | Δ |
| Example 10-14 | 190 | ○ | x | Δ |

EXAMPLE 11-1

Preparation of monomolecular film of diacetylene derivative compound or buit-up film thereof After a diacetylene derivative compound of the formula $C_{12}H_{25}-C{\equiv}C-C{\equiv}C-C_6H_{12}-COOH$ was dissolved in chloroform at a concentration of $3\times10^{-3}$ mol/liter, the solution was spread on an aqueous phase of pH 6.5 and a cadmium chloride concentration of $1\times10^{-3}$ mol/liter.

After evaporation of the solvent chloroform, the surface pressure was enhanced to 20 dyn/cm. At the surface pressure maintained to be constant, a glass of a glass substrate with sufficiently clean surface (including the case when a built-up film, etc. constituted of monomolecular film of azulenium compound had been already attached) was moved vertically in the direction transversing the water surface gently at a speed of 1.0 cm/min. for desired number of times (including intermediate drying steps) to have monomolecular films of the diacetylene derivative compound transferred onto the carrier, thereby forming a monomolecular film of the diacetylene derivative compound or built-up films thereof.

Preparation of monomolecular film of azulenium salt compound or built-up film thereof After a mixture of 1 part of the azulenium salt compound shown by the formula 1-10 in the specification and 2 parts of arachic acid was dissolved in chloroform at a concentration of $3\times10^{-3}$ mol/liter, the solution was spread on an aqueous phase with pH 6.5 and a cadmium chloride concentration of $1\times10^{-3}$ mol/liter.

After evaporation of the solvent chloroform, the surface pressure was enhanced to 20 dyn/cm. At the surface pressure maintained to be constant, a carrier of a glass substrate with sufficiently clean surface (including the case when a built-up film, etc. constituted of monomolecular film of azulenium compound had been already attached) was moved vertically in the direction transversing the water surface gently at a speed of 1.0 cm/min. for desired number of times (including intermediate drying steps) to have monomolecular films of the azulenium salt compound transferred onto the carrier, thereby forming a monomolecular film of the azulenium salt compound or built-up films thereof.

Preparation of hetero-built-up film

Based on the preparation processes of the monomolecular film of the diacetylene derivative compound and built-up films thereof as well as the monomolecular film of the azulenium salt compound and built-up films thereof, hetero-built-up films were prepared from a suitable combination thereof.

The built-up films prepared (recording media) are shown in Table 11-1.

The symbols and the numerals shown for constitution of media have the following meanings.

G/20AZ/60DA/20AZ

A recording medium having a constitution built-up in the order of glass substrate (G)→20 layers of monomolecular films of the azulenium salt compound→60 layers of monomolecular films of the diacetylene derivative compound→20 layers of the azulenium salt compound.

G/10*(2AZ/6DA)

A recording medium having a constitution built up, repeatedly 10 times, of 2 layers of monomolecular films of the azulenium salt compound and 6 layers of monomolecular films of the diacetylene derivative compound alternately on the glass substrate (G).

RECORDING TEST 11-1

On each of the optical recording media prepared in example 11-1, UV-ray of 254 nm was irradiated uniformly and sufficiently to make the recording layer a blue film.

Next, a semiconductor laser beam with output of 8 mW, wavelength of 830 nm (beam diameter: 4 μm) was irradiated following an input information. The results are shown in Table 11-1. Evaluation was conducted by judging from possibility and quality of recording, and those which gave particularly good recording are rated as ⊚ those which gave good recording as ○ and those which gave inferior recording as x.

EXAMPLE 11-2

Recording media were prepared in the same manner as Example 11-1 except for using $C_8H_{17}C\equiv C-C\equiv C-C_4H_8-COOH$ as the diacetylene derivative compound (Table 11-2).

RECORDING TEST 11-2

Recording was performed in the same manner as Recording test 11-1 except for using the recording media of Example 11-2. The results are shown in Table 11-2.

EXAMPLE 11-3

Recording media were prepared in the same manner as Example 11-1 except for using the compound represented by the formula 1-36 in the specification as the azulenium compound.

RECORDING TEST 11-3

Recording was performed in the same manner as Recording test 11-1 except for using the recording media of Example 11-3.

Substantially the same results as shown in Table 11-1 and 11-2 were obtained.

TABLE 11-1

| No. | Medium constitution | Sensitivity | Recording |
|---|---|---|---|
| 1 | C/40AZ/60DA | 2000 | ○ |
| 2 | G/20AZ/60DA/20AZ | 900 | ⊚ |
| 3 | G/20AZ/40AZ/30DA | 900 | ⊚ |
| 4 | G/20* (2AZ/3DA) | 400 | ⊚ |
| 5 | G/10* (4AZ/6DA) | 300 | ⊚ |
| 6 | G/3* (2AZ/2DA) | 500 | ○ |
| 7 | G/5* (2AZ/2DA) | 500 | ⊚ |
| 8 | G/10* (5AZ/5DA) | 400 | ⊚ |

TABLE 11-2

| No. | Medium constitution | Sensitivity | Recording |
|---|---|---|---|
| 9 | G/40AZ/60DA | 2500 | ○ |
| 10 | G/20AZ/60DA/20AZ | 1000 | ⊚ |
| 11 | G/30DA/40AZ/30DA | 1000 | ⊚ |
| 12 | G/20* (2AZ/3DA) | 500 | ⊚ |
| 13 | G/10* (4AZ/6DA) | 400 | ⊚ |
| 14 | G/3* (2AZ/2DA) | 500 | ○ |
| 15 | G/5* (2AZ/2DA) | 500 | ⊚ |
| 16 | G/10* (5AZ/5DA) | 450 | ⊚ |

EXAMPLE 12-1

Preparation of monomolecular film of DA compound

A solution of a diacetylene derivative compound of the formula $C_{12}H_{25}-C\equiv C-C\equiv C-C_8H_{16}-COOH$ dissolved in chloroform at a concentration of $1\times 10^{-3}$ mol/liter was spread on an aqueous phase of pH 6.5 and a cadmium chloride concentration of $1\times 10^{-3}$/liter. After evaporation of the solvent chloroform, at a surface pressure maintained constantly, a glass substrate with sufficiently clean surface having a hydrophilic surface (including the case when a built-up film, etc. constituted of monomolecular film of pyrylium dyes had been already attached) was moved vertically in the direction transversing the water surface gently at a speed of 1.0 cm/min. for predetermined number of times (including intermediate drying steps) to have monomolecular films of the diacetylene derivative compound transferred onto the substrate, thereby forming a monomolecular film of the DA compound or built-up films thereof. (Preparation of monomolecular film containing pyrilium dyes)

A solution of a mixture of 1 part of the thiopyrylium dye represented by the above formula 2-7 and 2 parts of arachidinic acid was dissolved in chloroform at a concentration of $1\times 10^{-3}$ mol/liter was spread on an aqueous phase with pH 6.5 and a cadmium chloride concentration of $1\times 10^{-3}$ mol/liter. After removal of the solvent chloroform, at a surface pressure maintained constantly, a glass substrate with sufficiently clean surface having a hydrophilic surface (including the case when a built-up film, etc. constituted of monomolecular film of DA compound had been already attached) was moved vertically in the direction transversing the water surface gently at a speed of 1.0 cm/min. for predetermined number of times (including intermediate drying steps) to have monomolecular films containing pyrylium dyes transferred onto the substrate, thereby forming a monomolecular film containing pyrylium dyes or built-up films thereof.

Preparation of hetero-built-up film

Based on the preparation processes of the monomolecular film of the DA compound as well as the monomolecular film containing pyrylium dyes, 8 kinds of hetero-built-up films were prepared on glass substrates by suitable combinations thereof. The hetero-built-up films thus prepared (optical recording media) are shown in Table 12-1.

when the irradiation time of layer beam was altered at the same output.

TABLE 12-1

| Example No. | Sample No. | Constitution of optical recording medium | Sensitivity | Resolution | Image density |
|---|---|---|---|---|---|
| 12-1 | 1 | G/40PL/60DA (Comparative example) | 190 ns | ○ | ◎ |
| | 2 | G/20PL/60DA/20PL | 150 ns | ○ | ◎ |
| | 3 | G/30DA/40PL/30DA | 170 ns | ○ | ◎ |
| | 4 | G/20X(2PL/3DA) | 80 ns | ◎ | ◎ |
| | 5 | G/10X(4PL/6DA) | 100 ns | ◎ | ◎ |
| | 6 | G/3X(2PL/2DA) | 80 ns | ◎ | ◎ |
| | 7 | G/5X(2PL/2DA) | 80 ns | ◎ | ◎ |
| | 8 | G/10X(5PL/5DA) | 100 ns | ◎ | ◎ |
| Comparative example 12-1 | | G/41DA | x | x | x |
| Comparative example 12-2 | | G/Radiation absorbing layer/41DA | 500 ns | x | x |

The symbols and the numerals shown for constitution of media have the following meanings.

G/20PL/60DA/20PL

A recording medium having a constitution built-up in the order of glass substrate (G)→20 layers of monomolecular films containing pyrylium dyes→60 layers of monomolecular films of the diacetylene derivative compound→20 layers of molecular films containing pyrylium dyes.

G/10X(2PL/6DA

A recording medium having a constitution built up, repeatedly 10 times, of 2 layers of monomolecular films containing pyrylium dyes and 6 layers of monomolecular films of the DA compound alternately on the glass substrate (G).

COMPARATIVE EXAMPLE 12-1

An optical recording medium was prepared having only 41 layers of the monomolecular built-up films of the DA compound formed on a glass substrate.

COMPARATIVE EXAMPLE 12-2

On a glass substrate, a radiation absorbing layer of Gd·Tb·Fe with a film thickness of 1500 Å was provided according to the sputtering method. An optical recording medium was prepared having 41 layers of monomolecular built-up films formed on the radiation absorbing layer of the substrate.

RECORDING TEST 12-1

On each of the optical recording media prepared in Examples 12-1 and Comparative examples 12-1, 12-2, UV-ray of 254 nm was irradiated uniformly and sufficiently to make the recording layer a blue film. Next, a semiconductor laser beam with output of 2 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 12-1. Evaluation was conducted by judging whether the image resolution and the image density are good or not, and those which are particularly good are rated as ⊚ those which are good as ○ and those which cannot be recorded or are bad as x. Also, the recording sensitivity was evaluated by the minimum irradiation time for practicing a legible color change recording

COMPARATIVE EXAMPLE 12-3

A coating solution obtained by dissolving 3 parts by weight of a thiopyrylium dye represented by the above formula 2-7 and 1 part by weight of nitrocellulose in 20 parts by weight of methylene chloride added dropwise in a small amount at the central portion of a disc substrate made of a glass (thickness 1.5 mm, diameter 200 mm) mounted on a spinner coating machine and coating carried out by rotating the spinner for a predetermined time at a predetermined rotation speed, followed by drying at normal temperature, to prepare a number of samples with a coated film thickness after drying on the substrate of 1000 Å.

RECORDING TEST 12-2

For the optical recording medium of Comparative example 12-3, no UV-ray irradiation was practiced, but the semiconductor laser beam was irradiated directly on the recording layer surface at the predetermined positions with the same output as in Recording test 12-1 and various irradiation time (irradiation time 500 ns/bit to 5 μs/bit) following an input information, thereby practicing recording by formation of pit. In this recording medium, it was found necessary to take 4 μs or longer irradiation time for forming clearly one pit as the result of observation by a microscope.

EXAMPLE 12-2

According to the same procedure as in Example 12-1 except for using a compound $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, optical recording media were prepared.

EXAMPLE 12-3

According to the same procedure as in Example 12-1 except for using a pyrylium dye represented by the formula 2-8 in place of the thiopyrylium dye represented by the formula 2-7, optical recording media were prepared.

EXAMPLE 12-4

According to the same procedure as in Example 12-5 except for using a selenapyrylium dye represented by the formula 2-10 in place of the thiopyrylium dye represented by the formula 2-7, optical recording media were prepared.

EXAMPLE 12-5

According to the same procedure as in Example 12-8 except for using a pyrylium dye represented by the formula 2-17 in place of the thiopyrylium dye represented by the formula 2-7, optical recording media were prepared.

EXAMPLE 12-6

According to the same procedure as in Example 12-8 except for using a thiopyrylium dye represented by the formula 2-19 in place of the thiopyrylium dye represented by the formula 2-7, optical recording media were prepared.

RECORDING TEST 12-3

By use of the recording media prepared in Example 12-2 to 12-6, recording tests were practiced in the same manner as Recording test 12-1. Evaluations of the recording tests are listed in Table 12-2.

TABLE 12-2

| Example No. | Sample No. | Constitution of optical recording medium | Sensitivity | Resolution | Image density |
|---|---|---|---|---|---|
| 12-2 | 1 | G/40PL/60DA (Comparative example) | 190 ns | ○ | ⊙ |
|  | 2 | G/20PL/60DA/20PL | 130 ns | ○ | ⊙ |
|  | 3 | G/30DA/40PL/30DA | 170 ns | ○ | ⊙ |
|  | 4 | G/20X(2PL/3DA) | 80 ns | ⊙ | ⊙ |
|  | 5 | G/10X(4PL/6DA) | 100 ns | ⊙ | ⊙ |
|  | 6 | G/3X(2PL/2DA) | 80 ns | ⊙ | ○ |
|  | 7 | G/5X(2PL/2DA) | 80 ns | ⊙ |  |
|  | 8 | G/10X(5PL/5DA) | 90 ns | ⊙ | ⊙ |
| 12-3 | — | G/20X(2PL/3DA) | 90 ns | ⊙ | ⊙ |
| 12-4 | — | " | 80 ns | ⊙ | ⊙ |
| 12-5 | — | " | 100 ns | ⊙ | ⊙ |
| 12-6 | — | " | 100 ns | ⊙ | ⊙ |

EXAMPLE 13-1

Preparation of monomolecular film of DA compound

A solution of a diacetylene derivative compound of the formula $C_{12}H_{25}-C\equiv C-C\equiv C-C_8H_{16}-COOH$ dissolved in chloroform at a concentration of $1\times 10^{-3}$ mol/liter was spread on an aqueous phase of pH 6.5 and a cadmium chloride concentration of $1\times 10^{-3}$/ liter. After removal of the solvent chloroform, at a surface pressure maintained constantly, a glass substrate with sufficiently clean surface having a hydrophilic surface (including the case when a built-up film, etc. constituted of monomolecular film containing a diene compound salt had been already attached) was moved vertically in the direction transversing the water surface gently at a speed of 1.0 cm/min. for predetermined number of times (including intermediate drying steps) to have monomolecular films of the DA compound transferred onto the substrate, thereby forming a monomolecular film of the DA compound or built-up films thereof.

Preparation of monomolecular film containing a diene compound salt

A solution of a mixture of 1 part by weight of the diene compound salt represented by the above formula 3-3 and 2 parts of arachic acid was dissolved in chloroform at a concentration of $1\times 10^{-3}$ mol/liter was spread on an aqueous phase with pH 6.5 and a cadmium chloride concentration of $1\times 10^{-3}$ mol/liter. After removal of the solvent chloroform, at a surface pressure maintained constantly, a glass substrate with sufficiently clean surface having a hydrophilic surface (including the case when a built-up film, etc. constituted of monomolecular film of DA compound had been already formed) was moved vertically in the direction transversing the water surface gently at a speed of 1.0 cm/min. for desired numbers of times (including intermediate drying steps) to have monomolecular films containing the diene compound salt transferred onto the substrate, thereby forming a monomolecular film containing the diene compound salt or built-up films thereof.

Preparation of hetero-built-up film

Based on the preparation processes of the monomolecular film of the DA compound as well as the monomolecular film containing the diene compound salt, 8 kinds of hetero-built-up films were prepared on glass substrates by suitable combinations thereof. The built-up films prepared (recording media) are shown in Table 13-1.

The symbols and the numerals shown for constitution of media have the following meanings.

(1) G/20DE/60DA/20DE

A recording medium having a constitution builtup in the order of glass substrate (G)→20 layers of monomolecular films containing the diene compound salt→ 60 layers of monomolecular films of the diacetylene derivative compound→20 layers of molecular films containing the diene compound salt.

(2) G/10x(2DE/6DA)

An optical recording medium having a constitution built up, repeatedly 10 times, of 2 layers of monomolecular films containing the diene compound salt and 6 layers of monomolecular films of the DA compound alternately on the glass substrate (G).

RECORDING TEST 13-1

On each of the optical recording media prepared in Examples 13-1, UV-ray of 254 nm was irradiated uniformly and sufficiently to make the recording layer a blue film. Next, a semiconductor laser beam with output of 3 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 13-1. Evaluation was conducted by judging whether the image resolution and the image density are good or not, and those which are particularly good are rated as ⊙, those which are good as ○, and those which cannot be recorded or are bad as x. Also, the recording sensitivity was evaluated by the minimum irradiation time for practicing a legible color change recording when the irradiation time of laser beam was altered at the same output.

TABLE 13-1

| Example No. | Sample No. | Constitution of optical recording medium | Sensitivity | Resolution | Image density |
|---|---|---|---|---|---|
| 13-1 | 1 | G/40DE/60DA (Comparative example) | 200 ns | ○ | ◉ |
| | 2 | G/20DE/60DA/20DE | 170 ns | ○ | ◉ |
| | 3 | G/30DA/40DE/30DA | 190 ns | ○ | ◉ |
| | 4 | G/20X(2DE/3DA) | 80 ns | ◉ | ◉ |
| | 5 | G/10X(4DE/6DA) | 110 ns | ◉ | ◉ |
| | 6 | G/3X(2DE/2DA) | 80 ns | ◉ | ○ |
| | 7 | G/5X(2DE/2DA) | 80 ns | ◉ | ○ |
| | 8 | G/10X(5DE/5DA) | 100 ns | ◉ | ◉ |

COMPARATIVE EXAMPLE 13-1

A coating solution obtained by dissolving 3 parts by weight of a thiodiene compound salt represented by the above formula 3-6 and 1 part by weight of nitrocellulose in 20 parts by weight of methylene chloride added dropwise in a small amount at the central portion of a disc substrate made of a glass (thickness 1.5 mm, diameter 200 mm) mounted on a spinner coating machine and coating carried out by rotating the spinner for a predetermined time at a predetermined rotation speed, followed by drying at normal temperature, to prepare a number of samples with a coated film thickness after drying on the substrate of 1000 Å.

RECORDING TEST 13-2

For the optical recording medium of Comparative example 13-1, no UV-ray irradiation was practiced, but the semiconductor laser beam was irradiated directly on the recording layer surface at the predetermined positions with the same output as in Recording test 13-1, and various irradiation time (irradiation time 500 ns/bit to 5 μs/bit) following an input information, thereby practicing recording by formation of pit. In this recording medium, it was found necessary to take 4 μs or longer irradiation time for forming clearly one pit as the result of observation by a microscope.

EXAMPLE 13-2

According to the same procedure as in Example 13-1 except for using a diacetylene derivative compound represented by compound $C_8H_{17}$—C≡C—C≡C—$C_2H_4$—COOH in place of the diacetylene derivative compound represented by $C_{12}H_{25}$—C≡C—C≡C—$C_8H_{16}$—COOH, optical recording media were prepared.

EXAMPLES 13-3 to 13-7

According to the same procedure as in Example 13-1 except for using the diene compound salts represented by the formulae 3-5, 3-10, 3-14, 3-17 and 3-22, respectively, in place of the diene compound salt represented by formula 3-3, optical recording media with the same layer constitution as Sample No. 4 in Example 13-1 were prepared.

RECORDING TEST 13-3

By use of the optical recording media prepared in Examples 13-2 to 13-8, recording tests were practiced in the same manner as Recording test 13-1. Evaluations of the recording results are shown in Table 13-2.

TABLE 13-2

| Example No. | Sample No. | Constitution of optical recording medium | Sensitivity | Resolution | Image density |
|---|---|---|---|---|---|
| 13-2 | 1 | G/40DE/60DA (Comparative example) | 200 ns | ○ | ◉ |
| | 2 | G/20DE/60DA/20DE | 150 ns | ○ | ◉ |
| | 3 | G/30DA/40DE/30DA | 190 ns | ○ | ◉ |
| | 4 | G/20X(2DE/3DA) | 90 ns | ◉ | ◉ |
| | 5 | G/10X(4DE/6DA) | 110 ns | ◉ | ◉ |
| | 6 | G/3X(2DE/2DA) | 90 ns | ◉ | ○ |
| | 7 | G/5X(2DE/2DA) | 100 ns | ◉ | ○ |
| | 8 | G/10X(5DE/5DA) | 100 ns | ◉ | ◉ |
| 13-3 | — | G/20X(2DE/3DA) | 100 ns | ◉ | ◉ |
| 13-4 | — | G/20X(2DE/3DA) | 90 ns | ◉ | ◉ |
| 13-5 | — | G/20X(2DE/3DA) | 90 ns | ◉ | ◉ |
| 13-6 | — | G/20X(2DE/3DA) | 90 ns | ◉ | ◉ |
| 13-7 | — | G/20X(2DE/3DA) | 100 ns | ◉ | ◉ |

EXAMPLE 14-1

Preparation of monomolecular film of DA compound

A solution of a diacetylene derivative compound of the formula $C_{12}H_{25}$—C≡C—C≡C—$C_8H_{16}$—COOH dissolved in chloroform at a concentration of $1 \times 10^{-3}$ mol/liter was spread on an aqueous phase of pH 6.5 and a cadmium chloride concentration of $1 \times 10^{-3}$ mol/liter. After removal of the solvent chloroform, the surface pressure was enhanced to 20 dyne/cm and at the surface pressure maintained constantly, a glass substrate with sufficiently clean surface having a hydrophilic surface (including the case when a built-up film, etc. constituted of monomolecular film of a croconic methine dye had been already attached) was moved vertically in the direction transversing the water surface gently at a speed of 1.0 cm/min. for predetermined number of times (including intermediate drying steps) to have monomolecular films of the diacetylene derivative compound transferred onto the substrate, thereby forming a monomolecular films of the DA compound or built-up films thereof.

Preparation of monomolecular film containing a croconic methine dye

A solution of a mixture of 1 part by weight of the croconic methine dye represented by the above formula 4-3 and 2 parts of arachic acid was dissolved in chloroform at a concentration of $1 \times 10^{-3}$ mol/liter was spread on an aqueous phase with pH 6.5 and a cadmium chloride concentration of $1\times10^{-3}$ mol/liter. After removal of the solvent chloroform, the surface pressure was enhanced to 20 dyne/cm and at the surface pressure maintained constantly, a glass substrate with sufficiently clean surface having a hydrophilic surface (including the case when a built-up film, etc. constituted of monomolecular film of DA compound had been already attached) was moved vertically in the direction transversing the water surface gently at a speed of 1.0 cm/min. for predetermined number of times (including intermediate drying steps) to have monomolecular films containing the croconic methine dye transferred onto the substrate, thereby forming a monomolecular film containing the croconic methine dye or built-up films thereof.

Preparation of hetero-built-up film

Based on the preparation processes of the monomolecular film of the DA compound as well as the monomolecular film containing the croconic methine dye, 8 kinds of hetero-built-up films were prepared on glass substrates by suitable combinations thereof. The hetero-built-up films prepared (recording media) are shown in Table 14-1.

The symbols and the numerals shown for constitution of media have the following meanings.

(1) G/20CR/60DA/20CR

A recording medium having a consittution built-up in the order of glass substrate (G)→20 layers of monomolecular films containing the croconic methine dye salt→60 layers of monomolecular films of the diacetylene derivative compound→20 layers of molecular films containing the croconic methine dye.

(2) G/10x(2CR/60DA)

An optical recording medium having a constitution built up, repeatedly for 10 times, of 2 layers of monomolecular films containing the croconic methine dye and 6 layers of monomolecular films of the DA compound alternately on the glass substrate (G).

RECORDING TEST 14-1

On each of the optical recording media prepared in Example 14-1, UV-ray of 254 nm was irradiated uniformly and sufficiently to make the recording layer a blue film. Next, a semiconductor laser beam with output of 3 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 14-1. Evaluation was conducted by judging whether the image resolution and the image density are good or not, and those which are particularly good are rated as ⊚, those which are good as ○, and those which cannot be recorded or are bad as x. Also, the recording sensitivity was evaluated by the minimum irradiation time for practicing a legible color change recording when the irradiation time of laser beam was altered at the same output.

TABLE 14-1

| Example No. | Sample No. | Constitution of optical recording medium | Sensitivity | Resolution | Image density |
|---|---|---|---|---|---|
| 14-1 | 1 | G/40CR/60DA | 200 ns | ○ | ⊚ |
|  | 2 | G/20CR/60DA/20PL | 170 ns | ○ | ⊚ |
|  | 3 | G/30DA/40CR/30DA | 190 ns | • | ⊚ |
|  | 4 | G/20X(2CR/3DA) | 90 ns | ⊚ | ⊚ |
|  | 5 | G/10X(4CR/6DA) | 110 ns | ⊚ | ⊚ |
|  | 6 | G/3X(2CR/2DA) | 90 ns | ⊚ | ○ |
|  | 7 | G/5X(2CR/2DA) | 90 ns | ⊚ | • |
|  | 8 | G/10X(5CR/5DA) | 110 ns | ⊚ | ⊚ |

CR: croconic methine dye
DA: diacetylene derivative containing layer
G: glass substrate

COMPARATIVE EXAMPLE 14-1

A coating solution obtained by dissolving 3 parts by weight of a croconic methine dye represented by the above formula 4-3 and 1 part by weight of nitrocellulose in 20 parts by weight of methylene chloride added dropwise in a small amount at the central portion of a disc substrate made of a glass (thickness 1.5 mm, diameter 200 mm) mounted on a spinner coating machine and coating carried out by rotating the spinner for a predetermined time at a predetermined rotation speed, followed by drying at normal temperature, to prepare a number of samples with a coated film thickness after drying on the substrate of 1000 Å.

RECORDING TEST 14-2

For the optical recording medium of Comparative example 14-1, no UV-ray irradiation was practiced, but the semiconductor laser beam was irradiated directly on the recording layer surface at the predetermined positions with the same output as in Recording test 14-1 and various irradiation time (irradiation time 500 ns/bit to 5 μs/bit) following an input information, thereby practicing recording by formation of pit. In this recording medium, it was found necessary to take 5 μs or longer irradiation time for forming clearly one bit as the result of observation by a microscope.

EXAMPLE 14-2

According to the same procedure as in Example 14-1 except for using a diacetylene derivative compound represented by compound $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, optical recording media were prepared.

EXAMPLES 14-3 to 14-11

According to the same procedure as in Example 14-1 except for using the croconic methine dyes represented by the formulae 4-12, 4-23, 4-28, 4-31, 4-36, 4-37, 4-39, 4-40 and 4-42, respectively, in place of the croconic methine dye represented by the formula 4-3, optical recording media with the same layer constitution as Sample No. 8 in Example 14-1 were prepared.

RECORDING TEST 14-3

By use of the optical recording media prepared in Examples 14-2 to 14-11, recording tests were practiced in the same manner as Recording test 14-1. Evaluations of the recording results are shown in Table 14-2.

TABLE 14-2

| Example No. | Sample No. | Constitution of optical recording medium | Sensitivity | Resolution | Image density |
|---|---|---|---|---|---|
| 14-2 | 1 | G/40CR/60DA | 200 ns | ◉ | ◉ |
|  | 2 | G/20CR/60DA/20PL | 150 ns | ◉ | ◉ |
|  | 3 | G/30DA/40CR/30DA | 190 ns | ◉ | ◉ |
|  | 4 | G/20X(2CR/3DA) | 90 ns | ◉ | ◉ |
|  | 5 | G/10X(4CR/6DA) | 110 ns | ◉ | ◉ |
|  | 6 | G/3X(2CR/2DA) | 90 ns | ◉ | ◉ |
|  | 7 | G/5X(2CR/2DA) | 90 ns | ◉ | ◉ |
|  | 8 | G/10X(5CR/5DA) | 100 ns | ◉ | ◉ |
| 14-3 | 8 | G/10X(5CR/5DA) | 100 ns | ◉ | ◉ |
| 14-4 | 8 | G/10X(5CR/5DA) | 100 ns | ◉ | ◉ |
| 14-5 | 8 | G/10X(5CR/5DA) | 110 ns | ◉ | ◉ |
| 14-6 | 8 | G/10X(5CR/5DA) | 90 ns | ◉ | ◉ |
| 14-7 | 8 | G/10X(5CR/5DA) | 120 ns | ◉ | ◉ |
| 14-8 | 8 | G/10X(5CR/5DA) | 130 ns | ◉ | ◉ |
| 14-9 | 8 | G/10X(5CR/5DA) | 100 ns | ◉ | ◉ |
| 14-10 | 8 | G/10X(5CR/5DA) | 110 ns | ◉ | ◉ |
| 14-11 | 8 | G/10X(5CR/5DA) | 100 ns | ◉ | ◉ |

EXAMPLE 15-1

Preparation of monomolecular film of DA compound

A solution of a diacetylene derivative compound of the formula $C_{12}H_{25}$—C≡C—C≡C—$C_8H_{16}$—COOH dissolved in chloroform at a concentration of $1 \times 10^{-3}$ mol/liter was spread on an aqueous phase of pH 6.5 and a cadmium chloride concentration of $1 \times 10^{-3}$ mol/liter. After removal of the solvent chloroform, at a surface pressure maintained constantly, a glass substrate with sufficiently clean surface having a hydrophilic surface (including the case when a built-up film, etc. constituted of monomolecular film of a polymethine compound had been already attached) was moved vertically in the direction transversing the water surface gently at a speed of 1.0 cm/min. predetermined number of times (including intermediate drying steps) to have monomolecular films of the diacetylene derivative compound transferred onto the substrate, thereby forming a monomolecular film of the DA compound or built-up films thereof.

Preparation of monomolecular film containing a polyethine compound

A solution of a mixture of 1 part by weight of the polymethine compound represented by the above formula 5-16 and 2 parts of arachic acid was dissolved in chloroform at a concentration of $1 \times 10^{-3}$ mol/liter was spread on an aqueous phase with pH 6.5 and a cadmium chloride concentration of $1 \times 10^{-3}$ mol/liter. After removal of the solvent chloroform, at a surface pressure maintained constantly, a glass substrate with sufficiently clean surface having a hydrophilic surface (including the case when a built-up film, etc. constituted of monomolecular film of DA compound had been already attached) was moved vertically in the direction transversing the water surface gently at a speed of 1.0 cm/min. for predetermined number of times (including intermediate drying steps) to have monomolecular films containing the polymethine compound transferred onto the substrate, thereby forming a monomolecular film containing the polymethine compound or built-up films thereof.

Preparation of hetero-built-up film

Based on the preparation processes of the monomolecular film of the DA compound as well as the monomolecular film containing the polymethine compound, 8 kinds of hetero-built-up films were prepared on glass substrates by suitable combinations thereof. The built-up films prepared (recording media) are shown in Table 15-1.

The symbols and the numbers shown for constitution of media have the following means.

(1) G/20PM/60DA/20PM

A recording medium having a constitution built-up in the order of glass substrate (G)→20 layers of monomolecular films containing the polymethine compound→ 60 layers of monomolecular films of the diacetylene derivative compound→20 layers of monomolecular films containing the polymethine compound.

(2) G/10x(2PM/6DA)

An optical recording medium having a constitution built up, repeatedly for 10 times, of 2 layers of monomolecular films containing the polymethine compound and 6 layers of monomolecular films of the DA compound alternately on the glass substrate (G).

RECORDING TEST 15-1

On each of the optical recording media prepared in Example 15-1, UV-ray of 254 nm was irradiated uniformly and sufficiently to make the recording layer a blue film. Next, a semiconductor laser beam with output of 2 mW, wavelength of 830 nm and 1 μm of beam diameter was irradiated following an input information at the predetermined position on each recording medium surface (irradiation time 200 ns/1 bit) to form a red recorded image on the blue recording layer.

Evaluations of the recording results are shown in Table 15-1. Evaluation was conducted by judging whether the image resolution and the image density are good or not, and those which are particularly good are rated as ◉, those which are good as ○, and those which cannot be recorded or are bad as x. Also, the recording sensitivity was evaluated by the minimum irradiation time for practicing a legible color change recording when the irradiation time of laser beam was altered at the same output.

TABLE 15-1

| Example No. | Sample No. | Constitution of optical recording medium | Sensitivity | Resolution | Image density |
|---|---|---|---|---|---|
| 15-1 | 1 | G/40PM/60DA (Comparative example) | 190 ns | ○ | ◉ |
|  | 2 | G/20PM/60DA/20PM | 160 ns | ○ | ◉ |
|  | 3 | G/30DA/40PM/30DA | 180 ns | ○ | ◉ |
|  | 4 | G/20X(2PM/3DA) | 100 ns | ◉ | ◉ |
|  | 5 | G/10X(4PM/6DA) | 120 ns | ● | ● |
|  | 6 | G/3X(2PM/2DA) | 90 ns | ● | ○ |
|  | 7 | G/5X(2PM/2DA) | 90 ns | ● | ● |
|  | 8 | G/10X(5PM/5DA) | 110 ns | ● | ● |

COMPARATIVE EXAMPLE 15-1

A coating solution obtained by dissolving 3 parts by weight of a thiopolymethine compound represented by the above formula 5 - 16 and 1 part by weight of nitrocellulose in 20 parts by weight of methylene chloride added dropwise in a small amount at the central portion of a disc substrate made of a glass (thickness 1.5 mm, diameter 200 mm) mounted on a spinner coating machine and coating carried out by rotating the spinner for a predetermined time at a predetermined rotation speed, followed by drying at normal temperature, to prepare a number of samples with a coated film thickness after drying on the substrate of 1000 Å.

RECORDING TEST 15-2

For the optical recording medium of Comparative example 15-1, no UV-ray irradiation was practiced, but the semiconductor laser beam was irradiated directly on the recording layer surface at the predetermined positions with the same output as in Recording test 15-1 and various irradiation time (irradiation time 500 ns/bit to 5 $\mu$s/bit) following an input information, thereby practicing recording by formation of pit. In this recording medium, it was found necessary to take 4 $\mu$s or longer irradiation time for forming clearly one pit as the result of observation by a microscope.

EXAMPLE 15-2

According to the same procedure as in Example 15-1 except for using a diacetylene derivative compound represented by compound $C_8H_{17}$—C≡C—C≡C—$C_2H_4$—COOH in place of the diacetyle derivative compound represented by $C_{12}H_{25}$—C≡C—C≡C—$C_8H_{16}$—COOH, optical recording media were prepared.

EXAMPLES 15-3 TO 15-11

According to the same procedure as in Example 15-1 except for using the polymethine compounds represented by the above formulae 5-3, 5-7, 5-20 and 5-28, respectively, in place of the polymethine compound represented by the formula 5-16, respectively, optical recording media were prepared.

RECORDING TEST 15-3

By use of the optical recording media prepared in Examples 15-2 to 15-6, recording tests were practiced in the same manner as Recording test 15-1. Evaluations of the recording results are shown in Table 15-2.

TABLE 15-2

| Example No. | Sample No. | Constitution of optical recording medium | Sensitivity | Resolution | Image density |
|---|---|---|---|---|---|
| 15-2 | 1 | G/40PM/60DA (Comparative example) | 190 ns | ○ | ● |
|  | 2 | G/20PM/60DA/20PM | 150 ns | ○ | ● |
|  | 3 | G/30DA/40PM/30DA | 170 ns | ○ | ◉ |
|  | 4 | G/20X(2PM/3DA) | 100 ns | ● | ● |
|  | 5 | G/10X(4PM/6DA) | 120 ns | ◉ | ● |
|  | 6 | G/3X(2PM/2DA) | 80 ns | ● | x |
|  | 7 | G/5X(2PM/2DA) | 80 ns | ● | ○ |
|  | 8 | G/10X(5PM/5DA) | 90 ns | ● | ◉ |
| 15-3 | — | G/20X(2PM/3DA) | 90 ns | ● | ● |
| 15-4 | — | G/20X(2PM/3DA) | 100 ns | ● | ◉ |
| 15-5 | — | G/20X(2PM/3DA) | 80 ns | ◉ | ● |
| 15-6 | — | G/20X(2PM/3DA) | 100 ns | ◉ | ◉ |

EXAMPLE 16-1

A coating solution was prepared by adding 1 part by weight of fine crystalline powder of a diacetylene derivative compound represented by the formula $C_{12}H_{25}$—C≡C—C≡C—$C_8H_{16}$—COOH and 1 part by weight of the AZ compound salt represented by the above formula 1-1 into 4 parts by weight of methylene chloride, followed by thorough stirring.

Next, a glass disc made of a glass (thickness 1.5 mm, diameter 20 mm) was mounted on a spinner coating machine, and the above coating solution was added dropwise in a small amount at the central portion of the disc substrate, and coating was carried out by rotating the spinner at a predetermined rotational number for a predetermined time, followed by drying at normal temperature, to prepare optical recording media with thicknesses after drying on the substrate of 500 Å, 1000 Å and 2000 Å, respectively.

On each of the recording media, a UV-ray of 254 nm was irradiated uniformly and sufficiently to polymerize the DA compound in the recording medium to convert the recording medium to a blue film, and then recording was practiced under the conditions shown below, following input informations.

Semiconductor laser wavelength: 830 nm
Laser beam diameter: 1 $\mu$m
Laser output: 3 mW
Irradiation time of laser beam per 1 bit: 200 ns When laser beam was irradiated on the blue optical recording medium surface, the irradiated portion changed in color to red to effect recording. Evaluations of recording were practiced as follows. The optical density at the recorded (red) portion was measured. The resolution and the sensitivity were judged by observation by observing correspondence of the recorded image to laser beam diameter by means of a microscope, and those with very good results were rated as ⊙, those with good results as ○, those which could not be recorded or were inferior in correspondence as x. Evaluations of the recording results are shown in Table 16-1.

EXAMPLE 16-2

On each of the three kinds of the recording media prepared in Example 16-1, a UV-ray of 254 nm was irradiated uniformly and sufficiently to convert the recording layer to a blue film, and then recording was practiced under the recording conditions shown below, following input informations:
Laser wavelength: 870 nm
Laser beam diameter: 1 μm
Laser output: 3 mW.

Evaluations of recording were conducted according to the same standards as in Example 16-1 and the evaluation results are listed in Table 16-1.

EXAMPLE 16-3

On each of the three kinds of the recording media prepared in Example 16-1, a UV-ray of 254 nm was irradiated uniformly and sufficiently to convert the recording layer to a blue film, and then recording was practiced under the recording conditions shown below, following input informations:
Laser wavelength: 790 nm
Laser beam diameter: 1 μm
Laser output: 3 mW.

Evaluations of recording were conducted according to the same standards as in Example 16-1 and the evaluation results are listed in Table 16-1.

EXAMPLE 16-4

On the same disc substrate made of a glass as used in Example 16-1, first a coated film with a thickness after drying of 1000 Å was formed in the same manner as Example 16-1 by use of a coating solution obtained by dissolving 1 part by weight of the AZ compound salt represented by the formula 1-15 in 2 parts by weight of methylene chloride. Subsequently, a coated film with a thickness after drying of 1000 Å was prepared on a diene compound salt film in the same manner as previously described from a coating solution obtained by dispersing and dissolving 1 part by weight of fine crystalline powder the same diacetylene derivative compound as used in Example 16-1 and 1 part by weight of nitrocellulose as the binder in 4 parts by weight of methylene chloride, to prepare an optical recording medium having a recording layer with a structure of two separated layers. After the recording layer of the optical recording medium was converted to a blue film, recording was practiced under the same conditions as in Example 16-1. Evaluations of recording were performed according to the same standards as in Example 16-1 to obtain the results shown in Table 16-1.

COMPARATIVE EXAMPLE 16-1

Without use of the AZ compound salt, a solution prepared by dissolving 1 part by weight of the diacetylene derivative compound and 1 part by weight of nitrocellulose in 2 parts by weight of methylene chloride was used as the coating solution to prepare recording media according to the same procedure as in Example 16-1. For the optical recording media, recording was practiced according to the three kinds of conditions as employed in Examples 16-1, 16-2 and 16-3. Evaluations are listed in Table 16-1.

TABLE 16-1

| Example No. | Film thickness of recording layer | Recording conditions | Sensitivity | Resolution | Image density |
|---|---|---|---|---|---|
| Example 16-1 | 500 Å | Example 16-1 | ⊙ | ⊙ | 1.6 |
|  | 1000 Å | Example 16-1 | ⊙ | ⊙ | 2.1 |
|  | 2000 Å | Example 16-1 | ⊙ | ⊙ | 2.6 |
| Example 16-2 | 500 Å | Example 16-2 | ○ | ⊙ | 1.2 |
|  | 1000 Å | Example 16-2 | ○ | ○ | 1.9 |
|  | 2000 Å | Example 16-2 | ○ | ○ | 2.2 |
| Example 16-3 | 500 Å | Example 16-3 | x | x | x |
|  | 1000 Å | Example 16-3 | x | x | x |
|  | 2000 Å | Example 16-3 | ○ | ○ | 2.1 |
| Example 16-4 | 1000 Å | Example 16-1 | ⊙ | ⊙ | 2.5 |
| Comparative example 16-1 | 1000 Å | Example 16-1 | x | x | x |
|  | 1000 Å | Example 16-2 | x | x | x |
|  | 1000 Å | Example 16-3 | x | x | x |

EXAMPLE 16-5

According to the same procedure as in Example 16-1 except for using a diacetylene derivative compound represented by compound $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, optical recording media were prepared. For the optical recording media, recording was practiced under the same recording condition as in Example 16-1. The evaluation results are shown in Table 16-2.

EXAMPLES 16-6 TO 16-10

Optical recording media were prepared in the same manner as Example 16-1 except for using the AZ compounds represented by the formulae 1-10, 1-22, 1-28, 1-38 and 1-37, respectively, in place of the AZ compound salt represented by the compound 1-1. For each of the optical recording media, recording was practiced under the same recording condition as in Example 16-1. The evaluation results are shown in Table 16-2.

TABLE 16-2

| Recording medium | Film thickness | Sensitivity | Resolution | Image density |
|---|---|---|---|---|
| Example 16-5 | 500 Å | ⊙ | ⊙ | 1.5 |
|  | 1000 Å | ⊙ | ⊙ | 2.0 |
|  | 2000 Å | ⊙ | ⊙ | 2.4 |
| Example 16-6 | 500 Å | ⊙ | ⊙ | 1.6 |
|  | 1000 Å | ⊙ | ⊙ | 2.2 |
|  | 2000 Å | ⊙ | ⊙ | 2.6 |
| Example 16-7 | 500 Å | ○ | ⊙ | 1.4 |
|  | 1000 Å | ⊙ | ⊙ | 2.0 |
|  | 2000 Å | ⊙ | ○ | 2.4 |

TABLE 16-2-continued

| Recording medium | Film thickness | Sensitivity | Resolution | Image density |
|---|---|---|---|---|
| Example 16-8 | 500 Å | ◕ | ◕ | 1.6 |
|  | 1000 Å | ◉ | ◕ | 2.2 |
|  | 2000 Å | ● | ● | 2.6 |
| Example 16-9 | 500 Å | ● | ◔ | 1.5 |
|  | 1000 Å | ◉ | ● | 2.2 |
|  | 2000 Å | ● | ● | 2.5 |
| Example 16-10 | 500 Å | ○ | ◕ | 1.4 |
|  | 1000 Å | ● | ● | 1.9 |
|  | 2000 Å | ◉ | ○ | 2.3 |

EXAMPLE 17-1

A coating solution was prepared by adding 1 part by weight of fine crystalline powder of a diacetylene derivative compound represented by the formula $C_{12}H_{25}—C≡C—C≡C—C_8H_{16}—COOH$ and 1 part by weight of the pyrylium dye represented by the above formula 2-8 to 4 parts by weight of methylene chloride, followed by thorough stirring.

Next, a glass disc substrate made of a glass (thickness 1.5 mm, diameter 200 mm) was mounted on a spinner coating machine, and the above coating solution was added dropwise in a small amount at the central portion of the disc substrate, and coating was carried out by rotating the spinner at a predetermined rotational number for a predetermined time, followed by drying, to prepare optical recording media with coating film thicknesses after drying of 500 Å, 1000 Å and 2000 Å, respectively, on the substrate.

With a UV-ray of 254 nm each of the recording media was irradiated uniformly and sufficiently to polymerize the DA compound in the recording layer to convert the recording medium to a blue film, and then recording was practiced under the conditions shown below, following input information.

Semiconductor laser (HLP-1000, produced by Hitachi Seisakusho)
Semiconductor laser wavelength: 830 nm
Laser beam diameter: 1 μm
Laser output: 3 mW
Irradiation time of laser beam per 1 bit: 300 ns When the blue optical recording medium surface beam was irradiated with laser, the irradiated portion changed in color to red to effect recording. Evaluations of recording were practiced as follows. The optical density at the recorded (red) portion was measured. The resolution and the sensitivity were judged by observing correspondence of the recorded image to laser beam diameter by means of a microscope, and those with very good results were rated as ⊙, those with good results as ○, those which could not be recorded or were inferior in correspondence as X. Evaluations of the recording results are shown in Table 17-1.

EXAMPLE 17-2

With a UV-ray of 254 nm, each of the three kinds of the recording media prepared in Example 17-1 was irradiated uniformly and sufficiently to convert the recording layer to a blue film, and then recording was practiced under the recording conditions shown below, with the laser used for recording being changed, following input information:

Semiconductor laser (HLP-7802, produced by Hitachi Seisakusho)
Laser wavelength: 800 nm
Laser beam diameter: 1 μm
Laser output: 3 mW.
Irradiation time of laser beam per 1 bit: 300 ns Evaluations of recording were conducted according to the same standards as in Example 17-1 and the evaluation results are listed in Table 17-1.

EXAMPLES 17-3, 17-4, 17-5

The lasers used for recording were changed to those shown below, respectively, and recording was practiced under the recording conditions shown below, following otherwise the same conditions as in Example 17-1, to obtain the evaluation results as shown in Table 17-1.

EXAMPLE 17-3 semiconductor laser (Ga-As laser of heterostructure), laser wavelength: 890 nm.

EXAMPLE 17-4 semiconductor laser (Ga-As laser of heterostructure), laser wavelength: 950 nm.

EXAMPLE 17-5 xenon gas laser, laser wavelength: 752 nm.

EXAMPLE 17-6

On the same disc substrate made of a glass as used in Example 17-1, first a coated film with a thickness after drying of 3000 Å was formed in the same manner as Example 17-1 by use of a coating solution obtained by dissolving 1 part by weight of the pyrylium dye represented by the formula 2-8 in 2 parts by weight of methylene chloride. Subsequently, a coated film with a thickness after drying of 3000 Å was prepared in the same manner as previously described from a coating solution obtained by dispersing 1 part by weight of fine crystalline powder the same diacetylene derivative compound as used in Example 17-1 and 1 part by weight of nitrocellulose as the binder in 4 parts by weight of methylene chloride, to prepare an optical recording medium having a recording layer with a structure of two separated layers. After the recording layer of the optical recording medium was converted to a blue film, recording was practiced under the same conditions as in Example 17-1. Evaluations of recording were performed according to the same standards as in Example 17-1 to obtain the results shown in Table 17-1.

COMPARATIVE EXAMPLE 17-1

Without use of the pyrylium dye, a solution prepared by dissolving 1 part by weight of the diacetylene derivative compound and 1 part by weight of nitrocellulose in 4 parts by weight of methylene chloride was used as the coating solution to prepare recording media according to the same procedure as in Example 17-1. For the optical recording media, recording was practiced according to the three kinds of conditions as employed in Examples 17-1, 17-4 and 17-5. Evaluation results are listed in Table 17-1.

TABLE 17-1

| Example No. | Film thickness of recording layer | Recording conditions | Sensitivity | Resolution | Image density |
|---|---|---|---|---|---|
| Example 17-1 | 500 Å | Example 17-1 | ● | ◉ | 1.5 |
| | 1000 Å | Example 17-1 | ◉ | ● | 2.2 |
| | 2000 Å | Example 17-1 | ● | ● | 2.5 |
| Example 17-2 | 500 Å | Example 17-2 | o | ● | 1.2 |
| | 1000 Å | Example 17-2 | o | ● | 2.0 |
| | 2000 Å | Example 17-2 | ● | ● | 2.4 |
| Example 17-3 | 500 Å | Example 17-3 | o | o | 1.0 |
| | 1000 Å | Example 17-3 | o | o | 2.0 |
| | 2000 Å | Example 17-3 | o | o | 2.2 |
| Example 17-4 | 500 Å | Example 17-4 | x | x | — |
| | 1000 Å | Example 17-4 | x | x | — |
| | 2000 Å | Example 17-4 | o | o | 0.6 |
| Example 17-5 | 500 Å | Example 17-5 | x | x | — |
| | 1000 Å | Example 17-5 | x | x | — |
| | 2000 Å | Example 17-5 | x | x | — |
| Example 17-6 | 3000 Å | Example 17-1 | ● | ● | 2.5 |
| Comparative example 17-1 | 3000 Å | Example 17-1 | x | x | — |
| | 3000 Å | Example 17-4 | x | x | — |
| | 3000 Å | Example 17-5 | x | x | — |

COMPARATIVE EXAMPLE 17-2

Without use of the diacetylene derivative compound, a solution prepared by dissolving 1 part by weight of the pyrylium dye and 1 part by weight of nitrocellulose in 3 parts by weight of methylene chloride was used as the coating solution to prepare recording media having a thickness of the recording layer of 5000 Å according to the same procedure as in

EXAMPLE 17-1

For the optical recording medium, no UV-ray irradiation was practiced, but the semiconductor laser beam was irradiated directly on the recording layer surface at the predetermined positions with the same output as in Example 17-1 and various wavelengths and irradiation time of the laser beam (irradiation time 500 ns/bit to 5 μs/bit) following input information, thereby practicing recording by formation of pit. In this recording medium, it was found necessary to take 2 μs or longer irradiation time for forming clearly one pit as the result of observation by a microscope.

EXAMPLE 17-7

According to the same procedure as in Example 17-1 except for using a diacetylene derivative compound represented by compound $C_8H_{17}$—C≡C—C≡C—$C_2H_4$—COOH in place of the diacetylene derivative compound represented $C_{12}H_{25}$—C≡C—C≡C—$C_8H_{16}$—COOH, optical recording media were prepared. For the optical recording media, recording was practiced under the same recording condition as in Example 17-1. The evaluation results are shown in Table 17-2.

EXAMPLE 17-8

According to the same procedure as in Example 17-1 except for using a thiopyrylium dye represented by the formula 2-10 in place of the pyrylium dye represented by the formula 2-8, optical recording media were prepared. For the optical recording media, recording was practiced under the same conditions as in Example 17-1 to obtain the evaluation results shown in Table 17-2.

EXAMPLE 17-9

According to the same procedure as in Example 17-1 except for using a selenapyrylium dye represented by the formula 2-9 in place of the pyrylium dye represented by the formula 2-8, optical recording media were prepared. For the optical recording media, recording was practiced under the same conditions as in Example 17-1 to obtain the evaluation results shown in Table 17-2.

EXAMPLE 17-10

According to the same procedure as in Example 17-1 except for using a pyrylium dye represented by the formula 2-17 in place of the pyrylium dye represented by the formula 2-8, optical recording media were prepared. For the optical recording media, recording was practiced under the same conditions as in Example 17-1 to obtain the evaluation results shown in Table 17-2.

EXAMPLE 17-11

According to the same procedure as in Example 17-1 except for using a pyrylium dye represented by the formula 2-19 in place of the pyrylium dye represented by the formula 2-8, optical recording media were prepared. For the optical recording media, recording was practiced under the same conditions as in Example 17-1 to obtain the evaluation results shown in Table 17-2.

TABLE 17-2

| Example No. | Film thickness of recording layer | Sensitivity | Resolution | Image density |
|---|---|---|---|---|
| Example 17-7 | 500 Å | ● | ● | 1.3 |
| | 1000 Å | ● | ● | 1.9 |
| | 2000 Å | ● | ● | 2.2 |
| Example 17-8 | 500 Å | o | o | 1.0 |
| | 1000 Å | o | o | 2.0 |
| | 2000 Å | ● | ● | 2.2 |
| Example 17-9 | 500 Å | ◉ | ● | 1.6 |
| | 1000 Å | ◉ | ● | 2.4 |
| | 2000 Å | ◉ | ● | 2.7 |
| Example 17-10 | 500 Å | o | o | 1.0 |
| | 1000 Å | ◉ | ◉ | 1.8 |
| | 2000 Å | ● | ● | 2.3 |
| Example 17-11 | 500 Å | ● | ● | 1.5 |
| | 1000 Å | ● | ● | 2.2 |
| | 2000 Å | ◉ | ◉ | 2.5 |

EXAMPLE 18-1

A coating solution was prepared by adding 1 part by weight of fine crystalline powder of a diacetylene derivative compound represented by the formula $C_{12}H_{25}$—C≡C—C≡C—$C_8H_{16}$—COOH and 1 part by weight of the diene compound salt represented by the above formula 3-3 to 4 parts by weight of methylene chloride, followed by thorough stirring.

Next, a glass disc substrate made of a glass (thickness 1.5 mm, diameter 200 mm) was mounted on a spinner coating machine, and the above coating solution was added dropwise in a small amount at the central portion of the disc substrate, and coating was carried out by rotating the spinner at a predetermined rotational speed for a predetermined time, followed by drying, to prepare optical recording media with coating film thicknesses after drying of 500 Å, 1000 Å and 2000 Å, respectively, on the substrate.

With a UV-ray of 254 nm each of the recording media was iradiated uniformly and sufficiently to polymerize the DA compound in the recording layer to convert the recording medium to a blue film, and then recording was practiced under the conditions shown below, following input information.

Semiconductor laser (HLP-1500, produced by Hitachi Seisakusho)
Semiconductor laser wavelength: 830 nm
Laser beam diameter: 1 μm
Laser output: 3 mW
Irradiation time of laser beam per 1 bit: 300 ns When the blue optical recording medium surface was irradiated with laser beam, the irradiated portion changed in color to red to effect recording. Evaluations of recording were practiced as follows. The optical density at the recorded (red) portion was measured. The resolution and the sensitivity were judged by observing correspondence of the recorded image to laser beam diameter by means of a microscope, and those with very good results were rated as ⊚, those with good results as O, those which could not be recorded or were inferior in correspondence as X. Evaluations of the recording results are shown in Table 18-1.

EXAMPLE 18-2

With a UV-ray of 254 nm, each of the three kinds of the recording media prepared in Example 18-1 was irradiated uniformly and sufficiently to convert the recording layer to a blue film, and then recording was practiced under the recording conditions shown below, with the laser used for recording being changed, following input information:

Semiconductor laser (HLP-7802, produced by Hitachi Seisakusho)
Laser wavelength: 800 nm
Laser beam diameter: 1 μm
Laser output: 3 mW.
Irradiation time of laser beam per 1 bit: 300 ns Evaluations of recording were conducted according to the same standards as in Example 18-1 and the evaluation results are listed in Table 18-1.

EXAMPLE 18-3, 18-4, 18-5

The lasers used for recording were changed to those shown below, respectively, and recording was practiced under the recording conditions shown below, following otherwise the same conditions as in Example 18-1, to obtain the evaluation results as shown in Table 18-1.

EXAMPLE 18-3 semiconductor laser (Ga-As laser of heterostructure), laser wavelength: 890 nm.

EXAMPLE 18-4 semiconductor laser (Ga-As laser of heterostructure), laser wavelength: 950 nm.

EXAMPLE 18-5 xenon gas laser, laser wavelength: 752 nm.

EXAMPLE 18-6

On the same disc substrate made of a glass as used in Example 18-1, first a coated film with a thickness after drying of 1000 Å was formed in the same manner as Example 18-1 by use of a coating solution obtained by dissolving 1 part by weight of the diene compound salt represented by the formula 3-7 in 2 parts by weight of methylene chloride. Subsequently, a coated film with a thickness after drying of 1000 Å was prepared in the same manner as previously described from a coating solution obtained by dispersing 1 part by weight of fine crystalline powder the same diacetylene derivative compound as used in Example 18-1 and 1 part by weight of nitrocellulose as the binder in 4 parts by weight of methylene chloride, to prepare an optical recording medium having a recording layer with a structure of two separated layers. After the recording layer of the optical recording medium was converted to a blue film, recording was practiced under the same conditions as in Example 18-1. Evaluations of recording were performed according to the same standards as in Example 18-1 to obtain the results shown in Table 18-1.

COMPARATIVE EXAMPLE 18-1

Without use of the diene compound salt, a solution prepared by dissolving 1 part by weight of the diacetylene derivative compound and 1 part by weight of nitrocellulose in 1 part by weight of methylene chloride was used as the coating solution to prepare recording media according to the same procedure as in Example 18-1. For the optical recording media, recording was practiced according to the three kinds of conditions as employed in Examples 18-1, 18-4 and 18-5. Evaluation results are listed in Table 18-1.

TABLE 18-1

| Example No. | Film thickness of recording layer | Recording conditions | Sensitivity | Resolution | Image density |
|---|---|---|---|---|---|
| Example 18-1 | 500 Å | Example 18-1 | ⊚ | ⊚ | 1.5 |
| | 1000 Å | Example 18-1 | ⊚ | ⊚ | 2.0 |
| | 2000 Å | Example 18-1 | ⊚ | ⊚ | 2.5 |
| Example 18-2 | 500 Å | Example 18-2 | o | ⊚ | 1.2 |
| | 1000 Å | Example 18-2 | o | ⊚ | 1.9 |
| | 2000 Å | Example 18-2 | ⊚ | ⊚ | 2.3 |
| Example 18-3 | 500 Å | Example 18-3 | o | ⊚ | 1.3 |
| | 1000 Å | Example 18-3 | o | o | 1.8 |
| | 2000 Å | Example 18-3 | o | o | 2.3 |
| Example 18-4 | 500 Å | Example 18-4 | x | x | — |
| | 1000 Å | Example 18-4 | x | x | — |
| | 2000 Å | Example 18-4 | o | o | 0.7 |

TABLE 18-1-continued

| Example No. | Film thickness of recording layer | Recording conditions | Sensitivity | Resolution | Image density |
|---|---|---|---|---|---|
| Example 18-5 | 500 Å | Example 18-5 | x | x | x |
|  | 1000 Å | Example 18-5 | x | x | x |
|  | 2000 Å | Example 18-5 | x | x | x |
| Example 18-6 | 1000 Å | Example 18-1 | ⊚ | ⊚ | 2.4 |
| Comparative example 18-1 | 1000 Å | Example 18-1 | x | x | x |
|  | 1000 Å | Example 18-4 | x | x | x |
|  | 1000 Å | Example 18-5 | x | x | x |

COMPARATIVE EXAMPLE 18-2

Without use of the diacetylene derivative compound, a solution prepared by dissolving 1 part by weight of the diene compound salt and 1 part by weight of nitrocellulose in 4 parts by weight of methylene chloride was used as the coating solution to prepare a recording medium having a thickness of the recording layer of 1000 Å according to the same procedure as in Example 18-1.

For the optical recording medium, no UV-ray irradiation was practiced, but the semiconductor laser beam was irradiated directly on the recording layer surface at the predetermined positions with the same output as in Example 17-1 and various wavelengths and irradiation time of the laser beam (irradiation time 500 ns/bit to 5 μs/bit) following input information, thereby practicing recording by formation of pit. In this recording medium, it was found necessary to take 4 μs or longer irradiation time for forming clearly one pit as the result of observation by a microscope.

EXAMPLE 18-7

According to the same procedure as in Example 18-1 except for using a diacetylene derivative compound represented by compound $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, optical recording media were prepared. For the optical recording media, recording was practiced under the same recording condition as in Example 18-1. The evaluation results are shown in Table 18-2.

EXAMPLES 18-8 TO 18-12

Optical recording media were prepared in the same manner as Example 18-1 except for using the diene compound salts represented by the formulae 3-5, 3-10, 3-14, 3-17 and 3-22, respectively, in place of the diene compound salt represented by the compound 3-3. For each of the optical recording media, recording was practiced under the same recording condition as in Example 18-1. The evaluation results are shown in Table 18-2.

TABLE 18-2

| Recording medium | Film thickness | Sensitivity | Resolution | Image density |
|---|---|---|---|---|
| Example 18-7 | 500 Å | ⊚ | ⊚ | 1.4 |
|  | 1000 Å | ⊚ | ⊚ | 1.9 |
|  | 2000 Å | ⊚ | ⊚ | 2.4 |
| Example 18-8 | 500 Å | ⊚ | ⊚ | 1.6 |
|  | 1000 Å | ⊚ | ⊚ | 2.1 |
|  | 2000 Å | ⊚ | ⊚ | 2.6 |
| Example 18-9 | 500 Å | o | o | 1.2 |
|  | 1000 Å | o | o | 1.8 |
|  | 2000 Å | o | o | 2.3 |
| Example 18-10 | 500 Å | ⊚ | ⊚ | 1.5 |
|  | 1000 Å | ⊚ | ⊚ | 2.1 |
|  | 2000 Å | ⊚ | ⊚ | 2.5 |
| Example 18-11 | 500 Å | ⊚ | ⊚ | 1.4 |
|  | 1000 Å | ⊚ | ⊚ | 2.1 |
|  | 2000 Å | ⊚ | ⊚ | 2.4 |
| Example 18-12 | 500 Å | o | o | 1.3 |
|  | 1000 Å | o | o | 1.8 |
|  | 2000 Å | o | o | 2.2 |

EXAMPLE 19-1

A coating solution was prepared by adding 1 part by weight of fine crystalline powder of a diacetylene derivative compound represented by the formula $C_{12}H_{25}-C\equiv C-C\equiv C-C_8H_{16}-COOH$ and 15 parts by weight of the croconic methine dye represented by the above formula 4-14 to 20 parts by weight of methylene chloride, followed by thorough stirring.

Next, a glass disc substrate made of a glass (thickness 1.5 mm, diameter 200 mm) was mounted on a spinner coating machine, and the above coating solution was added dropwise in a small amount at the central portion of the disc substrate, and coating was carried out by rotating the spinner at a predetermined rotational speed for a predetermined time, followed by drying, to prepare optical recording media with coating film thicknesses after drying of 500 Å, 1000 Å and 2000 Å, respectively on the substrate.

Each of the recording media was irradiated uniformly with a UV-ray of 254 nm and sufficiently to polymerize the DA compound in the recording layer to convert the recording medium to a blue film, and then recording was practiced under the conditions shown below, following input information.

Semiconductor laser (HLP-1500, produced by Hitachi Seisakusho)
Semiconductor laser wavelength: 830 nm
Laser beam diameter: 1 μm
Laser output: 3 mW
Irradiation time of laser beam per 1 bit: 300 ns When the blue optical recording medium surface was irradiated with laser beam, the irradiated portion changed in color to red to effect recording. For reading of recording, a semiconductor laser of wavelength 680 nm and output of 1 mW was used as the reading light source, and its reflected light was received by a photodetector (PN-junction photodiode).

Evaluations of recording were practiced as follows. The optical density at the recorded (red) portion was measured. The resolution and the sensitivity were judged by observing correspondence of the recorded image to laser beam diameter by means of a microscope, and those with very good results were rated as ⊚, those with good results as O, those which could not be recorded or were inferior in correspondence as x. Reading of recording was evaluated by measuring the conveyance/noise (C/N) ratio. Evaluations of the recording results are shown in Table 19-1.

EXAMPLE 19-2

With a UV-ray of 254 nm, each of the three kinds of the recording media prepared in Example 19-1 was irradiated uniformly and sufficiently to convert the recording layer to a blue film, and then recording was practiced under the recording conditions shown below, with the laser used for recording being changed, following input information:

Semiconductor laser (HLP-7802, produced by Hitachi Seisakusho)
Laser wavelength: 800 nm
Laser beam diameter: 1 $\mu$m
Laser output: 3 mW.
Irradiation time of laser beam per 1 bit: 300 ns Evaluations of recording were conducted according to the same standards as in Example 19-1 and the evaluation results are listed in Table 19-1.

EXAMPLES 19-3, 19-4, 19-5

The lasers used for recording were changed to those shown below, respectively, and recording was practiced under the recording conditions shown below, following otherwise the same conditions as in Example 19-1, to obtain the evaluation results as shown in Table 19-1.

EXAMPLE 19-3 semiconductor laser (Ga-As laser of heterostructure), laser wavelength: 890 nm.

EXAMPLE 19-4 semiconductor laser (Ga-As laser of heterostructure), laser wavelength: 950 nm.

EXAMPLE 19-5

Xenon gas laser, laser wavelength: 752 nm.

EXAMPLE 19-6

On the same disc substrate made of a glass as used in Example 19-1, first a coated film with a thickness after drying of 3000 Å was formed in the same manner as Example 19-1 by use of a coating solution obtained by dissolving 1 part by weight of the croconic methine dye represented by the formula 4-5 in 2 parts by weight of methylene chloride. Subsequently, a coated film with a thickness after drying of 3000 Å was formed on the above coated croconic methine dye in the same manner as previously described from a coating solution obtained by dispersing 1 part by weight of fine crystalline powder the same diacetylene derivative compound as used in Example 19-1 and 1 part by weight of nitrocellulose as the binder in 4 parts by weight of methylene chloride, to prepare an optical recording medium having a recording layer with a structure of two separated layers. After the recording layer of the optical recording medium was converted to a blue film, writing and reading of recording were practiced under the same conditions as in Example 18-1. Evaluations of recording were performed according to the same standards as in Example 19-1 to obtain the results shown in Table 19-1.

COMPARATIVE EXAMPLE 19-1

Without use of the croconic methine dye, a solution prepared by dissolving 1 part by weight of the diacetylene derivative compound and 1 part by weight of nitrocellulose in 4 parts by weight of methylene chloride was used as the coating solution to prepare recording media according to the same procedure as in Example 19-1. For the optical recording media, writing and reading of recording were practiced according to the three kinds of conditions as employed in Example 19-1, 19-4 and 19-5. Evaluation results are listed in Table 19-1.

TABLE 19-1

| Example No. | Film thickness of recording layer | Writing conditions | Sensitivity | Resolution | Image density |
| --- | --- | --- | --- | --- | --- |
| Example 19-1 | 500 Å | Example 19-1 | ⊚ | ⊚ | 1.4 |
| | 1000 Å | Example 19-1 | ⊚ | ⊚ | 2.1 |
| | 2000 Å | Example 19-1 | o | ⊚ | 2.6 |
| Example 19-2 | 500 Å | Example 19-2 | o | ⊚ | 1.1 |
| | 1000 Å | Example 19-2 | o | ⊚ | 2.0 |
| | 2000 Å | Example 19-2 | ⊚ | ⊚ | 2.5 |
| Example 19-3 | 500 Å | Example 19-3 | ⊚ | ⊚ | 1.3 |
| | 1000 Å | Example 19-3 | ⊚ | ⊚ | 2.2 |
| | 2000 Å | Example 19-3 | ⊚ | ⊚ | 2.4 |
| Example 19-4 | 500 Å | Example 19-4 | o | ⊚ | 1.0 |
| | 1000 Å | Example 19-4 | ⊚ | o | 2.1 |
| | 2000 Å | Example 19-4 | ⊚ | o | 2.1 |
| Example 19-5 | 500 Å | Example 19-5 | x | x | — |
| | 1000 Å | Example 19-5 | x | x | — |
| | 2000 Å | Example 19-5 | x | x | — |
| Example 19-6 | 3000 Å | Example 19-1 | ⊚ | | 2.6 |
| Comparative example 19-1 | 3000 Å | Example 19-1 | x | x | — |
| | 3000 Å | Example 19-4 | x | x | — |
| | 3000 Å | Example 19-5 | x | x | — |

EXAMPLE 19-7

According to the same procedure as in Example 19-1 except for using a diacetylene derivative compound represented by compound $C_8H_{17}$—C≡C—C≡C—$C_2H_4$—COOH in place of the diacetylene derivative compound represented by $C_{12}H_{25}$—C≡C—C≡C—$C_8H_{16}$—COOH, optical recording media were prepared. For the optical recording media, recording was practiced under the same recording condition as in Example 19-1. The evaluation results are shown in Table 19-2.

EXAMPLES 19-8 TO 19-11

Optical recording media were prepared in the same manner as Example 18-1 except for using the croconic methine dyes represented by the formulae 4-3, 3-31, 3-36 and 4-41, respectively, in place of the croconic methine dye represented by the compound 4-14. For each of the optical recording media, recording was practiced under the same recording condition as in Example 19-1. The evaluation results are shown in Table 19-2.

TABLE 19-2

| Recording medium | Film thickness | Sensitivity | Resolution | Image density |
|---|---|---|---|---|
| Example 19-7 | 500 Å | ⊚ | ⊚ | 1.3 |
|  | 1000 Å | ⊚ | ⊚ | 2.0 |
|  | 2000 Å | ⊚ | ⊚ | 2.4 |
| Example 19-8 | 500 Å | ⊚ | ⊚ | 1.4 |
|  | 1000 Å | ⊚ | ⊚ | 2.2 |
|  | 2000 Å | ⊚ | ⊚ | 2.5 |
| Example 19-9 | 500 Å | ⊚ | ⊚ | 1.3 |
|  | 1000 Å | ⊚ | ⊚ | 2.2 |
|  | 2000 Å | ⊚ | ⊚ | 2.6 |
| Example 19-10 | 500 Å | o | o | 1.2 |
|  | 1000 Å | o | o | 2.0 |
|  | 2000 Å | ⊚ | ⊚ | 2.4 |
| Example 19-11 | 500 Å | ⊚ | o | 1.2 |
|  | 1000 Å | ⊚ | ⊚ | 2.1 |
|  | 2000 Å | ⊚ | ⊚ | 2.5 |

EXAMPLE 20-1

A solution of 1 part by weight of a diacetylene derivative represented by $C_{12}H_{25}-C\equiv C-C\equiv C-C_8H_{16}-COOH$ and 1 part by weight of an AZ compound represented by the above formula 1-1 dissolved at a concentration of $1\times 10^{-3}$ mole/liter in chloroform was spread on an aqueous phase with pH 6.5 and a cadmium chloride concentration of $1\times 10^{-3}$ mole/liter. After evaporation of the solvent chloroform, the surface pressure was raised to 20 dyne/cm and at the surface pressure maintained constantly, a glass substrate sufficiently cleaned having a hydrophilic surface was moved up and down in the direction transversing the water surface gently at a speed of 1.0 cm/min. to have a mixed monomolecular film of the DA compound and the AZ compound transferred onto the substrate. Thus, optical recording media having a mixed monomolecular film and mixed monomolecular built-up films built up in 21 layers, 41 layers and 81 layers formed on the substrate, respectively, were prepared.

With a UV-ray of 254 nm each of the recording media was irradiated uniformly and sufficiently to polymerize the DA compound in the recording layer to convert the recording medium to a blue film, and then recording was practiced under the conditions shown below, following input information.
Semiconductor laser wavelength: 830 nm
Laser beam diameter: 1 μm
Laser output: 3 mW
Irradiation time of laser beam per 1 bit: 200 ns When the blue optical recording medium surface was irradiated with laser beam, the irradiated portion changed in color to red to effect recording. Evaluations of recording were practiced as follows. The optical density at the recorded (red) portion was measured. The resolution and the sensitivity were judged by observing correspondence of the recorded image to laser beam diameter by means of a microscope, and those with very good results were rated as ⊚, those with good results as O, those which could not be recorded or were inferior in correspondence as x. Evaluations of the recording results are shown in Table 20-1.

EXAMPLE 20-2

With a UV-ray of 254 nm each of the four kinds of the recording media prepared in Example 18-1 was irradiated uniformly and sufficiently to convert the recording layer to a blue film, and then recording was practiced under the recording conditions shown below, following input information:
Laser wavelength: 870 nm
Laser beam diameter: 1 μm
Laser output: 3 mW
Irradiation time of laser beam per 1 bit: 200 ns Evaluations of recording were conducted according to the same standards as in Example 20-1 and the evaluation results are listed in Table 20-1.

EXAMPLE 20-3

With a UV-ray of 254 nm each of the four kinds of the recording media prepared in Example 20-1 was irradiated uniformly and sufficiently to convert the recording layer to a blue film, and then recording was practiced under the recording conditions shown below, following input information:
Laser wavelength: 790 nm
Laser beam diameter: 1 μm
Laser output: 3 mW.
Irradiation time of laser beam per 1 bit: 200 ns Evaluations of recording were conducted according to the same standards as in Example 20-1 and the evaluation results are listed in Table 20-1.

COMPARATIVE EXAMPLE 20-1

Without use of the AZ compound, optical recording media were prepared in the same manner as Example 20-1. For the optical recording media, recording was practiced under the recording conditions in Example 20-1. The evaluation results are shown in Table 20-1.

TABLE 20-1

| Recording medium | Built-up number of films | Sensitivity | Resolution | Image density |
|---|---|---|---|---|
| Example 20-1 | 1 | ⊚ | ⊚ | 0.9 |
|  | 21 | ⊚ | ⊚ | 2.4 |
|  | 41 | ⊚ | ⊚ | 2.8 |
|  | 81 | ⊚ | ⊚ | 3.2 |
| Example 20-2 | 1 | x | x | x |
|  | 21 | x | x | x |
|  | 41 | ⊚ | ⊚ | 1.8 |
|  | 81 | ⊚ | ⊚ | 2.1 |
| Example 20-3 | 1 | x | x | x |
|  | 21 | x | x | x |
|  | 41 | x | x | x |
|  | 81 | ⊚ | ⊚ | 1.6 |
| Example 20-1 | 1 | x | x | x |
|  | 21 | x | x | x |
|  | 41 | x | x | x |
|  | 81 | x | x | x |

EXAMPLE 20-4

According to the same procedure as in Example 20-1 except for using a diacetylene derivative compound represented by compound $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, an optical recording medium with a built-up number of 41 was prepared. For the optical recording medium, recording was practiced under the same recording condition as in Example 20-1. The evaluation results are shown in Table 20-2.

EXAMPLES 20-5 TO 20-9

Optical recording media were prepared in the same manner as Example 20-1 except for using the azulenium compounds represented by the formulae 1-10, 1-22, 1-28, 1-38 and 1-37, respectively, in place of the azulenium salt compound represented by the formula 1-1. For each of the optical recording media, recording was practiced under the same recording condition as in Example 20-1. The evaluation results are shown in Table 20-2.

TABLE 20-2

| Recording medium | Built-up number of films | Sensitivity | Resolution | Image density |
|---|---|---|---|---|
| Example 20-4 | 41 | ⊚ | ⊚ | 2.8 |
| Example 20-5 | 41 | ⊚ | ⊚ | 2.5 |
| Example 20-6 | 41 | ⊚ | ⊚ | 2.8 |
| Example 20-7 | 41 | ⊚ | ⊚ | 2.5 |
| Example 20-8 | 41 | ⊚ | ⊚ | 2.6 |
| Example 20-9 | 41 | ⊚ | ⊚ | 2.7 |

EXAMPLE 20-10

A coating solution obtained by dissolving 10 parts by weight of the AZ compound represented by the formula 1-1 in 20 parts by methylene chloride was added dropwise in a small amount at the central portion of a disc substrate made of a glass (thickness 1.5 mm, diameter 200 mm) mounted on a spinner coating machine and coating was carried out by rotating the spinner for a predetermined time at a predetermined rotation speed, followed by drying at normal temperature, to prepare a number of samples with coated film thicknesses after drying of 200 Å and 3000 Å, respectively, on the substrate.

Next, a solution of the DA compound represented by $C_{12}H_{25}-C\equiv C-C\equiv C-C_8H_{16}-COOH$ dissolved at a concentration of $3\times 10^{-3}$ mole/liter in chloroform was spread on an aqueous phase with pH 6.5 and a cadmium chloride concentration of $1\times 10^{-3}$ mole/liter. After removal of the solvent chloroform by evaporation, the surface pressure was enchanced to 20 dyne/cm and at the surface pressure maintained constantly, a glass substrate having the AZ compound layer previously formed thereon was moved up and down in the direction transversing the water surface gently at a speed of 1.0 cm/min. to have a DA monomolecular film transferred onto the AZ compound layer. Thus, optical recording media having a monomolecular film and built-up films of 7 layers, 41 layers, 101 layers and 201 layers of monomolecular film formed on the substrate, respectively, were prepared.

With UV-ray of 254 nm, each of these optical recording media was irradiated uniformly and sufficiently to polymerize the DA compound in the recording layer, thereby converting the recording layer to a blue film, and then recording was practiced under the same recording conditions as in Example 20-1. Evaluation was conducted in the same manner as in Example 20-1 to obtain the reuslts as shown in Table 20-3.

TABLE 20-3

| Thickness of B layer | Built-up number of monomolecular films in A layer | Sensitivity | Resolution | Image density |
|---|---|---|---|---|
| 200 Å | 1 | ⊚ | ⊚ | 0.9 |
| | 7 | ⊚ | ⊚ | 1.6 |
| | 41 | ⊚ | ⊚ | 2.0 |
| | 101 | ⊚ | ⊚ | 2.3 |
| | 201 | x | x | x |
| 3000 Å | 1 | ⊚ | ⊚ | 0.9 |
| | 7 | ⊚ | ⊚ | 1.6 |
| | 41 | ⊚ | ⊚ | 3.0 |

TABLE 20-3-continued

| Thickness of B layer | Built-up number of monomolecular films in A layer | Sensitivity | Resolution | Image density |
|---|---|---|---|---|
| | 101 | ⊚ | ⊚ | 3.2 |
| | 201 | ⊚ | ⊚ | 3.4 |

EXAMPLE 20-11

A solution of the DA compound of the formula $C_{12}H_{25}-C\equiv C-C\equiv C-C_8H_{16}-COOH$ dissolved in chloroform at a concentration of $1\times 10^{-3}$ mole/liter was spread on an aqueous phase of pH 6.5 and a cadmium chloride concentration of $1\times 10^{-3}$ mole/liter. After evaporation of the solvent chloroform, the surface pressure was enhanced to 20 dyne/cm and at the surface pressure maintained constantly, a glass substrate sufficiently cleaned having a hydrophilic surface (including the case when a built-up film, etc. constituted of monomolecular film containing an AZ compound had been already attached) was moved up and down in the direction transversing the water surface gently at a speed of 1.0 cm/min. for the desired number of times (including intermediate drying steps) to have monomolecular films of the DA compound transferred onto the substrate, thereby forming a monomolecular film of the DA compound or built-up films thereof.

A mixture of 1 part by weight of the AZ compound represented by the above formula 1-1 and 2 parts of arachic acid was dissolved in chloroform at a concentration of $1\times 10^{-3}$ mole/liter. The resulting solution was spread on an aqueous phase with pH 6.5 and a cadmium chloride concentration of $1\times 10^{-3}$ mole/liter. After evaporation of the solvent chloroform, the surface pressure was enhanced to 20 dyne/cm and at the surface pressure maintained constantly, a glass substrate sufficiently cleaned having a hydrophilic surface (including the case when a built-up film, etc. constituted of monomolecular film of DA compound had been already attached) was moved up and down in the direction transversing the water surface gently at a speed of 1.0 cm/min. for the desired number of times (including intermediate drying steps) to have monomolecular films containing the AZ compound transferred onto the substrate, thereby forming a monomolecular film containing the AZ compound or built-up films thereof.

Based on the preparation processes of the monomolecular film of the DA compound as well as the monomolecular film containing the AZ compound, 8 kinds of hetero-built-up films were prepared on glass substrates by suitable combinations thereof. The built-up films thus prepared (optical recording media) are shown in Table 20-4.

The symbols and the numerals shown for constitution of optical recording media have the following meanings.

G/20AZ/60DA/20AZ

A recording medium having a constitution built-up in the order of 20 layers of monomolecular films containing the AZ compound→60 layers of monomolecular films of the DA compound→20 layers of molecular films containing the AZ compound laminated on the glass substrate (G).

G/10x(2AZ/6DA)

An optical recording medium having a constitution built-up, repeatedly for 10 times, of 2 layers of monomolecular films containing the AZ compound and 6 layers of monomolecular films of the DA compound alternately on the glass substrate (G).

With UV-ray of 254 nm, each of the optical recording media was irradiated uniformly and sufficiently to make the recording layer a blue film, and then recording was practiced under the same conditions as in Example 20-1, following input information. Evaluation was conducted in the same manner as in Example 20-1 to obtain the results shown in Table 20-4.

TABLE 20-4

| Example No. | Sample No. | Constitution of recording medium | Sensitivity | Resolution | Image density |
|---|---|---|---|---|---|
| 20-11 | 1 | G/40AZ/60DA | ◉ | ● | 3.1 |
| | 2 | G/20AZ/60DA/20DA | ● | ● | 3.2 |
| | 3 | G/30DA/40AZ/30DA | ● | ● | 3.2 |
| | 4 | G/20x(2AZ/3DA) | ● | ● | 3.3 |
| | 5 | G/10x(4AZ/6DA) | ● | ● | 3.3 |
| | 6 | G/3x(2AZ/2DA) | ● | ◉ | 1.8 |
| | 7 | G/5x(2AZ/2DA) | ● | ● | 1.9 |
| | 8 | G/10x(5AZ/5DA) | ● | ● | 3.2 |

EXAMPLE 21-1

A solution of 1 part by weight of a diacetylene derivative represneted by $C_{12}H_{25}$—C≡C—C≡C—$C_8H_{16}$—COOH and 1 part by weight of a thiopyrylium dye represented by the above formula 2-10 dissolved at a concentration of $1 \times 10^{-3}$ mole/liter in chloroform was spread on an aqueous phase with pH 6.5 and a cadmium chloride concentration of $1 \times 10^{-3}$ mole/liter. After evaporation of the solvent chloroform, the surface pressure was raised to 20 dyne/cm and at the surface pressure maintained constantly, a glass substrate sufficiently cleaned having a hydrophilic surface was moved up and down in the direction transversing the water surface gently at a speed of 1.0 cm/min. to have a mixed monomolecular film of the DA compound and the thiopyrylium dye transferred onto the substrate. Thus, optical recording media having a mixed monomolecular film and mixed diacetylene monomolecular built-up films built up in 21 layers, 41 layers and 81 layers formed on the substrate, respectively, were prepared.

With a UV-ray of 254 nm, each of the optical recording media was irradiated uniformly and sufficiently to polymerize the DA compound in the recording layer to convert the recording medium to a blue film, and then recording was practiced under the conditions shown below, following input information.

Semiconductor laser (HLP-1500, produced by Hitachi Seisakusho)
Semiconductor laser wavelength: 830 nm
Laser beam diameter: 1 μm
Laser output: 3 mW
Irradiation time of laser beam per 1 bit: 300 ns When the blue optical recording medium surface was irradiated with laser beam, the irradiated portion changed in color to red to effect recording. Evaluations of recording were practiced as follows. The optical density at the recorded (red) portion was measured. The resolution and the sensitivity were judged by observing correspondence of the recorded image to laser beam diameter by means of a microscope, and those with very good results were rated as ⊙, those with good results as O, those which could not be recorded or were inferior in correspondence as x. Evaluations of the recording results are shown in Table 21-1.

EXAMPLE 21-2

With a UV-ray of 254 nm, each of the four kinds of the recording media prepared in Example 21-1 was irradiated uniformly and sufficiently to convert the recording layer to a blue film, and then recording was practiced under the recording conditions shown below, with the semiconductor used for recording being changed, following input information:

Semiconductor laser (HLP-7802, produced by Hitachi Seisakusho)
Laser wavelength: 800 nm
Laser beam diameter: 1 μm
Laser output: 3 mW
Irradiation time of laser beam per 1 bit: 300 ns Evaluations of recording were conducted according to the same standards as in Example 21-1 and the evaluation results are listed in Table 21-1.

EXAMPLES 21-3, 21-4, 21-5

The lasers used for recording were changed to those shown below, respectively, and recording was practiced under the recording conditions shown below, following otherwise the same conditions as in Example 21-1, to obtain the evaluation results as shown in Table 21-1.

EXAMPLE 21-3 semiconductor laser (Ga-As laser of heterostructure), laser wavelength: 890 nm.

EXAMPLE 21-4 semiconductor laser (Ga-As laser of heterostructure), laser wavelength: 950 nm.

EXAMPLE 21-5 xenon gas laser, laser wavelength: 752 nm.

TABLE 21-1

| Example No. | Built-up number of films | Writing condition | Sensitivity | Resolution | Image density | C/N ratio |
|---|---|---|---|---|---|---|
| Example 21-1 | 1 | Example 21-1 | ● | ● | 1.5 | 5 |
| | 21 | Example 21-1 | ◉ | ● | 2.3 | 40 |
| | 41 | Example 21-1 | ◉ | ● | 3.0 | 51 |
| | 81 | Example 21-1 | ● | ● | 3.1 | 51 |
| Example 21-2 | 1 | Example 21-2 | O | ● | 0.8 | 4 |
| | 21 | Example 21-2 | O | ● | 1.9 | 31 |
| | 41 | Example 21-2 | ◉ | ● | 2.2 | 42 |
| | 81 | Example 21-2 | ● | ● | 2.6 | 47 |
| Example 21-3 | 1 | Example 21-3 | O | O | 0.5 | 3 |
| | 21 | Example 21-3 | O | O | 1.6 | 25 |
| | 41 | Example 21-3 | O | O | 1.8 | 30 |
| | 81 | Example 21-3 | ◉ | ● | 2.2 | 40 |
| Example 21-4 | 1 | Example 21-1 | x | x | — | — |
| | 21 | Example 21-1 | x | x | — | — |
| | 41 | Example 21-1 | x | x | — | — |
| | 81 | Example 21-1 | O | O | 0.7 | 4 |

TABLE 21-1-continued

| Example No. | Built-up number of films | Writing condition | Sensitivity | Resolution | Image density | C/N ratio |
|---|---|---|---|---|---|---|
| Example 21-5 | 1 | Example 21-1 | x | x | — | — |
|  | 21 | Example 21-1 | x | x | — | — |
|  | 41 | Example 21-1 | x | x | — | — |
|  | 81 | Example 21-1 | x | x | — | — |

EXAMPLE 21-6

According to the same procedure as in Example 21-1 except for using a diacetylene derivative compound represented by compound $C_8H_{17}$—C≡C—C≡C—$C_2H_4$—COOH in place of the diacetylene derivative compound represented by $C_{12}H_{25}$—C≡C—C≡C—$C_8H_{16}$—COOH, an optical recording medium with a built-up number of 41 was prepared. For the optical recording medium, recording was practiced under the same recording condition as in Example 21-1. The evaluation results are shown in Table 21-2.

EXAMPLES 21-7 TO 21-10

According to the same procedure as in Example 21-1 except for using pyrylium dyes represented by the formulae 2-8, 2-9, 2-17 and 2-19, respectively, in place of the thiopyrylium dye represented by the formula 2-10, optical recording media with a built-up number of 41 were prepared. For the optical recording medium, recording was practiced under the same recording condition as in Example 21-1. The evaluation results are shown in Table 21-2.

TABLE 21-2

| Recording medium | Built-up number of films | Sensitivity | Resolution | Image density |
|---|---|---|---|---|
| Example 21-6 | 41 | ● | ● | 3.0 |
| Example 21-7 | 41 | ● | ● | 2.7 |
| Example 21-8 | 41 | ● | ● | 2.8 |
| Example 21-9 | 41 | ● | ● | 2.9 |
| Example 21-10 | 41 | ● | ● | 2.7 |

EXAMPLE 20-11

A coating solution obtained by dissolving 10 parts by weight of the thiopyrylium dye represented by the formula 2-10 in 20 parts by methylene chloride was added dropwise in a small amount at the central portion of a disc substrate made of a glass (thickness 1.5 mm, diameter 200 mm) mounted on a spinner coating machine and coating was carried out by rotating the spinner for a predetermined time at a predetermined rotation speed, followed by drying at normal temperature, to prepare a number of samples with coated film thicknesses after drying of 200 Å and 3000 Å, respectively, on the substrate.

Next, a solution of the DA compound represented by $C_{12}H_{25}$—C≡C—C≡C—$C_8H_{16}$—COOH dissolved at a concentration of $3 \times 10^{-3}$ mole/liter in chloroform was spread on an aqueous phase with pH 6.5 and a cadmium chloride concentration of $1 \times 10^{-3}$ mole/liter. Atfer removal of the solvent chloroform by evaporation, the surface pressure was enhanced to 20 dyne/cm and at the surface pressure maintained constantly, a glass substrate having the thiopyrylium dye layer previously formed thereon was moved up and down in the direction transversing the water surface gently at a speed of 1.0 cm/min. to have a DA monomolecular film transferred onto the thiopyrylium dye layer. Thus, optical recording media having a monomolecular film and built-up films of 7 layers, 41 layers, 101 layers and 201 layers of monomolecular film formed on the substrate, respectively, were prepared.

With UV-ray of 254 nm, each of these optical recording media was irradiated uniformly and sufficiently to polymerize the DA compound in the recording layer, thereby converting the recording layer to a blue film, and then recording was practiced under the same conditions as in Example 21-1, following input information.

When the blue optical recording medium surface was irradiated with laser beam the irradiated portion changed in color to red to effect recording. Evaluation of the recording was practiced in the same manner as in Example 21-1 to obtain the results shown in Table 21-3.

TABLE 21-1

| Thickness of B layer | Built-up number of monomolecular films in A layer | Sensitivity | Resolution | Image density |
|---|---|---|---|---|
| 200 Å | 1 | ● | ● | 1.4 |
|  | 7 | ● | ● | 1.5 |
|  | 41 | ● | ● | 2.7 |
|  | 101 | ○ | ○ | 3.0 |
|  | 201 | x | x | x |
| 3000 Å | 1 | ● | ● | 1.3 |
|  | 7 | ● | ● | 1.4 |
|  | 41 | ● | ● | 2.8 |
|  | 101 | ● | ◉ | 3.4 |
|  | 201 | ◉ | ● | 3.6 |

EXAMPLE 21-12

A solution of the diacetylene derivative compound of the formula $C_{12}H_{25}$—C≡C—C≡C—$C_8H_{16}$—COOH dissolved in chloroform at a concentration of $1 \times 10^{-3}$ mole/liter was spread on an aqueous phase of pH 6.5 and a cadmium chloride concentration of $1 \times 10^{-3}$ mole/liter. After evaporation of the solvent chloroform, the surface pressure was enhanced to 20 dyne/cm and at the surface pressure maintained constantly, a glass substrate sufficiently cleaned having a hydrophilic surface (including the case when a built-up film, etc. constituted of monomolecular film containing a pyrylium dye had been already attached) was moved up and down in the direction transversing the water surface gently at a speed of 1.0 cm/min. for the desired number of times (including intermediate drying steps) to have monomolecular films of the DA compound transferred onto the substrate, thereby forming a monomolecular film of the DA compound or built-up films thereof.

A mixture of 1 part by weight of the thiopyrylium dye represented by the above formula 2-10 and 2 parts by arachidinic acid was dissolved in chloroform at a concentration of $1 \times 10^{-3}$ mole/liter The resulting solution was spread on an aqueous phase with pH 6.5 and a cadmium chloride concentration of $1 \times 10^{-3}$ mole/liter. After evaporation of the solvent chloroform, the surface pressure was enhanced to 20 dyne/cm and at the surface pressure maintained constantly, a glass substrate sufficiently cleaned having a hydrophilic surface (including the case when a built-up film, etc. constituted of monomolecular film of DA compound had been already formed) was moved up and down in the direction transversing the water surface gently at a speed of 1.0 cm/min. for the desired number of times (including intermediate drying steps) to have monomolecular films containing thiopyrylium transferred onto the substrate, thereby forming a monomolecular film containing the thiopyrylium dye or built-up films thereof.

Based on the preparation processes of the monomolecular film of the DA compound as well as the monomolecular film containing the thiopyrylium dye, 8 kinds of hetero-built-up films were prepared on glass substrates by suitable combinations thereof. The built-up films thus prepared (optical recording media) are shown in Table 21-4.

The symbols and the numerals shown for constitution of optical recording media have the following meanings.

G/20PL/60DA/20PL

A recording medium having a constitution built-up in the order of 20 layers of monomolecular films containing the thiopyrylium dye→60 layers of monomolecular films of the DA compound→20 layers of molecular films containing the thiopyrylium laminated on the glass substrate (G).

G/10x(2PL/6DA)

An optical recording medium having a constitution built-up, repeatedly for 10 times, of 2 layers of monomolecular films containing the thiopyrylium dye and 6 layers of monomolecular films of the DA compound alternately on the glass substrate (G).

With UV-ray of 254 nm, each of the optical recording media was irradiated uniformly and sufficiently to make the recording layer a blue film, and then recording was practiced under the same conditions as in Example 20-1, following input information.

When the blue optical recording medium surface was irradiated with laser beam, the irradiated portion changed in color to red to effect recording. Evaluation was conducted in the same manner as in Example 21-1 to obtain the results shown in Table 21-4.

TABLE 21-4

| Example No. | Sample No. | Constitution of recording medium | Sensitivity | Resolution | Image density |
|---|---|---|---|---|---|
| 21-12 | 1 | G/40PL/60DA | ● | ● | 3.3 |
|  | 2 | G/20PL/60DA/20PL | ● | ● | 3.4 |
|  | 3 | G/30DA/40PL/30DA | ● | ● | 3.4 |
|  | 4 | G/20x(2PL/3DA) | ● | ● | 3.6 |
|  | 5 | G/10x(4PL/6DA) | ● | ● | 3.6 |
|  | 6 | G/3x(2PL/2DA) | ● | ● | 2.4 |
|  | 7 | G/5x(2PL/2DA) | ● | ● | 2.8 |
|  | 8 | G/10x(5PL/5DA) | ● | ● | 3.6 |

G: Glass substrate
PL: Pyrylium dye
DA: Diacetylene derivative compound

EXAMPLE 22-1

A solution of 1 part by weight of a diacetylene derivative represented by $C_{12}H_{25}-C\equiv C-C\equiv C-C_8H_{16}-COOH$ and 1 part by weight of a diene compound salt represented by the above formula 3-3 dissolved at a concentration of $1\times 10^{-3}$ mole/liter in chloroform was spread on an aqueous phase with pH 6.5 and a cadmium chloride concentration of $1\times 10^{-3}$ mole/liter. After evaporation of the solvent chloroform, the surface pressure was raised to 20 dyne/cm and at the surface pressure maintained constantly, a glass substrate sufficiently cleaned having a hydrophilic surface was moved up and down in the direction transversing the water surface gently at a speed of 1.0 cm/min. to have a mixed monomolecular film of the DA compound and the diene compound salt transferred onto the substrate. Thus, optical recording media having a mixed monomolecular film and mixed monomolecular built-up films built up in 21 layers, 41 layers and 81 layers formed on the substrate, respectively, were prepared.

With a UV-ray of 254 nm, each of the optical recording media was irradiated uniformly and sufficiently to polymerize the DA compound in the recording layer to convert the recording medium to a blue film, and then recording was practiced under the conditions shown below, following input information.

Semiconductor laser (HLP-1500, produced by Hitachi Seisakusho)
Laser beam diameter: 1 μm
Laser output: 3 mW
Irradiation time of laser beam per 1 bit: 300 ns When the optical recording medium surface was irradiated with laser beam, the irradiated portion changed in color to red to effect recording. Evaluations of recording were practiced as follows. The optical density at the recorded (red) portion was measured. The resolution and the sensitivity were judged by observing correspondence of the recorded image to laser beam diameter by means of a microscope, and those with very good results were rated as ⊚, those with good results as ○, those which could not be recorded or were inferior in correspondence as x. Evaluations of the recording results are shown in Table 22-1.

EXAMPLE 22-2

With UV-ray of 254 nm, each of the four kinds of the recording media prepared in Example 22-1 was irradiated uniformly and sufficiently to convert the recording layer to a blue film, and then recording was practiced under the recording conditions shown below, with the semiconductor used for recording being changed, following input information:

Semiconductor laser (HLP-7802, produced by Hitachi Seisakusho)
Laser beam diameter: 1 μm
Laser output: 3 mW
Irradiation time of laser beam per 1 bit: 300 ns Evaluations of recording were conducted according to the same standards as in Example 22-1 and the evaluation results are listed in Table 22-1.

EXAMPLES 22-3, 22-4, 22-5

The lasers used for recording were changed to those shown below, respectively, and writing and reading of recording were practiced under the recording conditions shown below, following otherwise the same conditions as in Exmaple 22-1, to obtain the evaluation results as shown in Table 22-1.

EXAMPLE 22-3 semiconductor laser (Ga-As laser of heterostructure), laser wavelength: 890 nm.

EXAMPLE 22-4 semiconductor laser (Ga-As laser of heterostructure), laser -wavelength: 950 nm.

EXAMPLE 22-5 xenon gas laser, laser wavelength: 752 nm.

TABLE 22-1

| Recording medium | Built-up number of films | Sensitivity | Resolution | Image density |
|---|---|---|---|---|
| Example 22-1 | 1 | ● | ● | 1.0 |
|  | 21 | ● | ● | 2.0 |
|  | 41 | ● | ● | 2.4 |
|  | 81 | ● | ● | 2.8 |
| Example 22-2 | 1 | ○ | ● | 0.7 |
|  | 21 | ○ | ● | 1.8 |
|  | 41 | ● | ● | 2.1 |
|  | 81 | ● | ● | 2.6 |
| Example 22-3 | 1 | ○ | ○ | 0.5 |
|  | 21 | ○ | ○ | 1.6 |
|  | 41 | ○ | ○ | 1.8 |
|  | 81 | ● | ● | 2.1 |
| Example 22-4 | 1 | x | x | — |
|  | 21 | x | x | — |
|  | 41 | x | x | — |
|  | 81 | ○ | ○ | 0.8 |
| Example 22-5 | 1 | x | x | — |
|  | 21 | x | x | — |
|  | 41 | x | x | — |
|  | 81 | x | x | — |

EXAMPLE 22-6

According to the same procedure as in Example 22-1 except for using a diacetylene derivative compound represented by compound $C_8H_{17}$—$C\equiv C$—$C\equiv C$—$C_2H_4$—COOH in place of the diacetylene derivative compound represented by $C_{12}H_{25}$—$C\equiv C$—$C\equiv C$—$C_8H_{16}$—COOH, an optical recording medium with a built-up number of 21 was prepared. For the optical recording medium, recording was practiced under the same recording condition as in Example 22-1. The evaluation results are shown in Table 22-2.

EXAMPLES 22-7 TO 22-11

According to the same procedure as in Example 22-1 except for using the diene compound salts represented by the formulae 3-5, 3-10, 3-14, 3-17 and 3-22, respectively, in place of the diene compound salt represented by the formula 3-3, optical recording media were prepared. For the optical recording media, recording was practiced under the same recording conditions as in Example 22-1. The evaluation results are shown in Table 22-2.

TABLE 22-2

| Optical recording medium | Build-up number of films | Sensitivity | Resolution | Image density |
|---|---|---|---|---|
| Example 22-6 | 41 | ◉ | ◉ | 2.6 |
| Example 22-7 | 41 | ◉ | ◎ | 2.3 |
| Example 22-8 | 41 | ◉ | ◉ | 2.2 |
| Example 22-9 | 41 | ◉ | ◎ | 2.3 |
| Example 22-10 | 41 | ◉ | ◎ | 2.4 |
| Example 22-11 | 41 | ◎ | ◎ | 2.5 |

EXAMPLE 22-12

A coating solution obtained by dissolving 10 parts by weight of the diene compound salt represented by the formula 3-3 in 20 parts by methylene chloride was added dropwise in a small amount at the central portion of a disc substrate made of a glass (thickness 1.5 mm, diameter 200 mm) mounted on a spinner coating machine and coating was carried out by rotating the spinner for a predetermined time at a predetermined rotation speed, followed by drying at normal temperature, to prepare a number of samples with coated film thicknesses after drying of 200 Å and 3000 Å, respectively, on the substrate.

Next, a solution of the DA compound represented by $C_{12}H_{25}$—$C\equiv C$—$C\equiv C$—$C_8H_{16}$—COOH dissolved at a concentration of $3\times10^{-3}$ mole/liter in chloroform was spread on an aqueous phase with pH 6.5 and a cadmium chloride concentration of $1\times10^{-3}$ mole/liter. After removal of the solvent chloroform by evaporation, the surface pressure was enhanced to 20 dyne/cm and at the surface pressure maintained constantly, a glass substrate having the diene compound salt layer previously formed thereon was moved up and down in the direction transfersing the water surface gently at a speed of 1.0 cm/min. to have a DA monomolecular film transferred onto the diene compound salt layer. Thus, optical recording media having a monomolecular film and built-up films of 5 layers, 21 layers and 41 layers of monomolecular film formed on the substrate, respectively, were prepared.

With UV-ray of 254 nm, each of these optical recording media was irradiated uniformly and sufficiently to polymerize the DA compound in the recording layer, thereby converting the recording layer to a blue film, and then recording was practiced under the same recording conditions as in Example 22-1. Evaluation was conducted in the same manner as in Example 22-1 to obtain the results as shown in Table 22-3.

TABLE 22-3

| Thickness of B layer | Built-up number of monomolecular films in A layer | Sensitivity | Resolution | Image density |
|---|---|---|---|---|
| 200 Å | 1 | ◎ | ◎ | 1.1 |
|  | 7 | ◎ | ◎ | 1.5 |
|  | 41 | ◎ | ◎ | 2.5 |
|  | 101 | ○ | ○ | 2.3 |
|  | 201 | x | x | — |
| 3000 Å | 1 | ◎ | ◎ | 1.1 |
|  | 7 | ◎ | ◎ | 1.5 |
|  | 41 | ◎ | ◎ | 2.9 |
|  | 101 | ◎ | ◎ | 3.0 |
|  | 201 | ◎ | ◎ | 3.1 |

EXAMPLE 22-13

A solution of the DA compound of the formula $C_{12}H_{25}$—$C\equiv C$—$C\equiv C$—$C_8H_{16}$—COOH dissolved in chloroform at a concentration of $1\times10^{-3}$ mole/liter was spread on an aqueous phase of pH 6.5 and a cadmium chloride concentration of $1\times10^{-3}$ mole/liter. After evaporation of the solvent chloroform, the surface pressure was enhanced to 20 dyne/cm and at the surface pressure maintained constantly, a glass substrate sufficiently cleaned having a hydrophilic surface (including the case when a built-up film, etc. constituted of monomolecular film containing a diene compound salt had been already formed) was moved up and down in the direction transversing the water surface gently at a speed of 1.0 cm/min. for the desired number of times (including intermediate drying steps) to have monomolecular films of the DA compound transferred onto the substrate, thereby forming a monomolecular film of the DA compound or built-up films thereof.

A mixture of 1 part by weight of the diene compound salt represented by the above formula 3-3 and 2 parts of arachic acid was dissolved in chloroform at a concentration of $1\times10^{-3}$ mole/liter. The resulting solution was spread on an aqueous phase with pH 6.5 and a cadmium chloride concentration of $1\times10^{-3}$ mole/liter. After evaporation of the solvent chloroform, the surface pressure was enhanced to 20 dyne/cm and at the surface pressure maintained constantly, a glass substrate sufficiently cleaned having a hydrophilic surface (including the case when a built-up film, etc. constituted of monomolecular film containing DA compound had been already formed) was moved up and down in the direction transversing the water surface gently at a speed of 1.0 cm/min. for the desired number of times (including intermediate drying steps) to have monomolecular films containing the diene compound salt transferred onto the substrate, thereby forming a monomolecular film containing the diene compound salt or built-up films thereof.

Based on the preparation processes of the monomolecular film of the DA compound as well as the monomolecular film containing the diene compound salt, 8 kinds of hetero-built-up films were prepared on glass substrates by suitable combinations thereof. The built-up films thus prepared (optical recording media) are shown in Table 22-4.

The symbols and the numerals shown for constitution of optical recording media have the following meanings.

G/20DE/60DA/20DE

A recording medium having a constitution built-up in the order of 20 layers of monomolecular films containing the diene compound salt→60 layers of monomolecular films of the DA compound→20 layers of molecular films containing the diene compound salt laminated on the glass substrate (G).

G/10x(2DE/6DA)

An optical recording medium having a constitution built-up, repeatedly for 10 times, of 2 layers of monomolecular films containing the diene compound salt and 6 layers of monomolecular films of the DA compound alternately on the glass substrate (G).

With UV-ray of 254 nm each of the optical recording media was irradiated uniformly and sufficiently to make the recording layer a blue film, and then recording was practiced under the same conditions as in Example 22-1, following input information. Evaluation was conducted in the same manner as in Example 22-1 to obtain the results shown in Table 22-4.

TABLE 22-4

| Example No. | Sample No. | Constitution of recording medium | Sensitivity | Resolution | Image density |
|---|---|---|---|---|---|
| 22-13 | 1 | G/40DE/60DA | ⊚ | ⊚ | 3.0 |
|  | 2 | G/20DE/60DA/20DE | ⊚ | ⊚ | 3.1 |
|  | 3 | G/30DA/40DE/30DA | ⊚ | ⊚ | 3.1 |
|  | 4 | G/20x(2DE/3DA) | ⊚ | ⊚ | 3.2 |
|  | 5 | G/10x(4DE/6DA) | ⊚ | ⊚ | 3.2 |
|  | 6 | G/3x(2DE/2DA) | ⊚ | ⊚ | 1.7 |
|  | 7 | G/5x(2DE/2DA) | ⊚ | ⊚ | 1.8 |
|  | 8 | G/10x(5DE/5DA) | ⊚ | ⊚ | 3.2 |

EXAMPLE 23-1

A solution of 1 part by weight of a diacetylene derivative represented by $C_{12}H_{25}-C\equiv C-C\equiv C-C_8H_{16}-COOH$ and 1 part by weight of a croconic methine dye represented by the above formula 4-3 dissolved at a concentration of $1 \times 10^{-3}$ mole/liter in chloroform was spread on an aqueous phase with pH 6.5 and a cadmium chloride concentration of $1 \times 10^{-3}$ mole/liter. After evaporation of the solvent chloroform, the surface pressure was raised to 20 dyne/cm and at the surface pressure maintained constantly, a glass substrate sufficiently cleaned having a hydrophilic surface was moved up and down in the direction transversing the water surface gently at a speed of 1.0 cm/min. to have a mixed monomolecular film of the DA compound and the croconic methine dye transferred onto the substrate. Thus, optical recording media having a mixed monomolecular film and mixed monomolecular built-up films built up in 21 layers, 41 layers and 81 layers formed on the substrate, respectively, were prepared.

With a UV-ray of 254 nm, each of the optical recording media was irradiated uniformly and sufficiently to polymerize the DA compound in the recording medium to convert the recording medium to a blue film, and then recording was practiced under the conditions shown below, following input information.

Semiconductor laser (HLP-1500, produced by Hitachi Seisakusho)
Semiconductor laser beam wavelength: 830 nm
Laser beam diameter: 1 μm
Laser output: 3 mW
Irradiation time of laser beam per 1 bit: 300 ns When the blue optical recording medium surface was irradiated with laser beam, the irradiated portion changed in color to red to effect recording. Evaluations of recording were practiced as follows. The optical density at the recorded (red) portion was measured. The resolution and the sensitivity were judged by observing correspondence of the recorded image to laser beam diameter by means of a microscope, and those with very good results were rated as ⊚, those with good results as ○, those which could not be recorded or were inferior in correspondence as x. Evaluations of the recording results are shown in Table 23-1.

EXAMPLE 23-2

With UV-ray of 254 nm, each of the four kinds of the recording media prepared in Example 23-1 was irradiated uniformly and sufficiently to convert the recording layer to a blue film, and then recording was practiced under the recording conditions shown below, with the semiconductor used for recording being changed, following input information:

Semiconductor laser (HLP-7802, produced by Hitachi Seisakusho)
Laser wavelength: 800 nm
Laser beam diameter: 1 μm
Laser output: 3 mW
Irradiation time of laser beam per 1 bit: 300 ns Evaluations of recording were conducted according to the same standards as in Example 23-1 and the evaluation results are listed in Table 23-1.

EXAMPLES 23-3, 23-4, 23-5

The lasers used for recording were changed to those shown below, respectively, and recording was practiced under the recording conditions shown below, following otherwise the same conditions as in Example 23-1, to obtain the evaluation results as shown in Table 23-1.

EXAMPLE 23-3 semiconductor laser (Ga-As laser of heterostructure), laser wavelength: 890 nm.

EXAMPLE 23-4 semiconductor laser (GA-As laser of heterostructure), laser wavelength: 950 nm.

EXAMPLE 23-5 xenon gas laser, laser wavelength: 752 nm.

TABLE 23-1

| Example No. | Built-up number of films | Writing condition | Sensitivity | Resolution | Image density |
|---|---|---|---|---|---|
| Example 23-1 | 1 | Example 23-1 | ◉ | ◉ | 0.9 |
|  | 21 | Example 23-1 | ◉ | ◉ | 2.4 |
|  | 41 | Example 23-1 | ◉ | ◉ | 3.0 |
|  | 81 | Example 23-1 | ◉ | ◉ | 3.2 |
| Example 23-2 | 1 | Example 23-2 | ○ | ◉ | 0.8 |
|  | 21 | Example 23-2 | ◉ | ◉ | 2.1 |
|  | 41 | Example 23-2 | ◉ | ◉ | 2.4 |
|  | 81 | Example 23-2 | ◉ | ◉ | 2.6 |
| Example 23-3 | 1 | Example 23-3 | ○ | ○ | 0.5 |
|  | 21 | Example 23-3 | ○ | ◉ | 1.7 |
|  | 41 | Example 23-3 | ○ | ◉ | 1.9 |
|  | 81 | Example 23-3 | ◉ | ◉ | 2.3 |
| Example 23-4 | 1 | Example 23-1 | x | x | — |
|  | 21 | Example 23-1 | x | x | — |
|  | 41 | Example 23-1 | x | x | — |
|  | 81 | Example 23-1 | ○ | ○ | 0.8 |
| Example 23-5 | 1 | Example 23-1 | x | x | — |
|  | 21 | Example 23-1 | x | x | — |
|  | 41 | Example 23-1 | x | x | — |
|  | 81 | Example 23-1 | x | x | — |

EXAMPLE 23-6

According to the same procedure as in Exmaple 23-1 except for using a diacetylene derivative compound represented by compound $C_8H_{17}$—C≡C—C≡C—$C_2H_4$—COOH in place of the diacetylene derivative compound represented by $C_{12}H_{25}$—C≡C—C≡C—$C_8H_{16}$—COOH, an optical recording medium with a built-up number of 41 was prepared. For the optical recording medium, recording was practiced under the same recording condition as in Exmaple 23-1. The evaluation results are shown in Table 23-2.

EXAMPLES 23-7 to 23-10

According to the same procedure as in Example 22-1 except for using the croconic methine dyes represented by the formulae 4-25, 4-31, 4-39, and 4-42, respectively, in place of the croconic methine dye represented by the formula 4-3, optical recording media with a built-up number of 21 were prepared. For the optical recording media, recording was practiced under the same recording conditions as in Example 23-1. The evaluation results are shown in Table 23-2.

TABLE 23-2

| Recording medium | Build-up number of films | Sensitivity | Resolution | Image density |
|---|---|---|---|---|
| Example 23-6 | 41 | ◉ | ◉ | 2.9 |
| Example 23-7 | 41 | ◉ | ◉ | 3.0 |
| Example 23-8 | 41 | ◉ | ◉ | 2.9 |
| Example 23-9 | 41 | ◉ | ◉ | 3.0 |
| Example 23-10 | 41 | ◉ | ◉ | 3.0 |

EXAMPLE 23-11

A coating solution obtained by dissolving 10 parts by weight of the croconic methine dye represented by the formula 4-3 in 20 parts of methylene chloride was added dropwise in a small amount at the central portion of a disc substrate made of a glass (thickness 1.5 mm, diameter 20 mm) mounted on a spinner coating machine and coating was carried out by rotating the spinner for a predetermined time at a predetermined rotation speed, followed by drying at normal temperature, to prepare a number of samples with coated film thicknesses after drying of 200 Å and 3000 Å, respectively, on the substrate.

Next, a solution of the DA compound represented by $C_{12}H_{25}$—C≡C—C≡C—$C_8H_{16}$—COOH dissolved at a concentration of $3 \times 10^{-3}$ mole/liter in chloroform was spread on an aqueous phase with pH 6.5 and a cadmium chloride concentration of $1 \times 10^{-3}$ mole/liter. After removal of the solvent chloroform by evaporation, the surface pressure was enhanced to 20 dyne/cm and at the surface pressure maintained constantly, a glass substrate having the croconic methine dye layer previously formed thereon was moved up and down in the direction transversing the water surface gently at a speed of 1.0 cm/min. to have a DA monomolecular film transferred onto the croconic methine dye layer. Thus, optical recording media having a monomolecular film and built-up films of 7 layers, 41 layers, 101 layers and 201 layers of monomolecular film formed on the substrate, respectively, were prepared.

With UV-ray of 254 nm, each of these optical recording media was irradiated uniformly and sufficiently to polymerize the DA compound in the recording layer, thereby converting the recording layer to a blue film, and then recording was practiced under the recording conditions shown below, following input information:

Semiconductor laser: (HLP-1500, produced by Hitachi Seisakusho)
Semiconductor laser wavelength: 830 nm
Laser beam diameter: 1 μm
Laser output: 3 mW
Irradiation time of laser beam per 1 bit: 300 ns When the blue optical recording medium surface was irradiated with laser beam, the irradiated portion changed in color to red to effect recording. Evaluation of recording was conducted in the same manner as in Example 23-1 to obtain the results as shown in Table 23-3.

TABLE 23-3

| Thickness of B layer | Built-up number of monomolecular films in A layer | Sensitivity | Resolution | Image density |
|---|---|---|---|---|
| 200 Å | 1 | ◉ | ◉ | 1.3 |
|  | 7 | ◉ | ◉ | 1.5 |
|  | 41 | ◉ | ◉ | 2.6 |
|  | 101 | ○ | ○ | 2.6 |
|  | 201 | x | x | 2.7 |

TABLE 23-3-continued

| Thickness of B layer | Built-up number of monomolecular films in A layer | Sensitivity | Resolution | Image density |
|---|---|---|---|---|
| 3000 Å | 1 | ◉ | ◉ | 1.2 |
| | 7 | ◉ | ◉ | 1.6 |
| | 41 | ◉ | ◉ | 3.0 |
| | 101 | ◉ | ◉ | 3.4 |
| | 201 | ◉ | ◉ | 3.5 |

EXAMPLE 23-12

A solution of the diacetylene derivative compound of the formula $C_{12}H_{25}-C\equiv C-C\equiv C-C_8H_{16}-COOH$ dissolved in chloroform at a concentration of $1\times10^{-3}$ mole/liter was spread on an aqueous phase of pH 6.5 and a cadmium chloride concentration of $1\times10^{-3}$ mole/liter. After evaporation of the solvent chloroform, the surface pressure was enhanced to 20 dyne/cm and at the surface pressure maintained constantly, a glass substrate sufficiently cleaned having a hydrophilic surface (including the case when a built-up film, etc. constituted of monomolecular film containing a croconic methine dye had been already formed) was moved up and down in the direction transversing the water surface gently at a speed of 1.0 cm/min. for the desired number of times (including intermediate drying steps) to have monomolecular films of the DA compound transferred onto the substrate, thereby forming a monomolecular film of the DA compound or built-up films thereof.

A mixture of 1 part by weight of the croconic methine dye represented by the above formula 4-3 and 2 parts by weight of arachic acid was dissolved in chloroform at a concentration of $1\times10^{-3}$ mole/liter. The resulting solution was spread on an aqueous phase with pH 6.5 and a cadmium chloride concentration of $1\times10^{-3}$ mole/liter. After evaporation of the solvent chloroform, the surface pressure was enhanced to 20 dyne/cm and at the surface pressure maintained constantly, a glass substrate sufficiently cleaned having a hydrophilic surface (including the case when a built-up film, etc. constituted of monomolecular film containing DA compound had been already formed) was moved up and down in the direction transversing the water surface gently at a speed of 1.0 cm/min. for the desired number of times (including intermediate drying steps) to have monomolecular films containing the croconic methine dye transferred onto the substrate, thereby forming a monomolecular film or built-up films thereof.

Based on the preparation processes of the monomolecular film of the DA compound as well as the monomolecular film containing the croconic methine dye, 8 kinds of hetero-built-up films were prepared on glass substrates by suitable combinations thereof. The built-up films thus prepared (optical recording media) are shown in Table 23-4.

The symbols and the numerals shown for constitution of optical recording media have the following meanings.

G/20CR/60DA/20CR

A recording medium having a constitution built-up in the order of 20 layers of monomolecular films containing the croconic methine dye→60 layers of monomolecular films of the DA compound→20 layers of monomolecular films containing the croconic methine dye laminated on the glass substrate (G).

G/10x(2CR/6DA)

An optical recording medium having a constitution built-up, repeatedly for 10 times, of 2 layers of monomolecular films containing the croconic methine dye and 6 layers of monomolecular films of the DA compound alternately on the glass substrate (G).

With UV-ray of 254 nm, each of the optical recording media, was irradiated uniformly and sufficiently to make the recording layer a blue film, and then recording was practiced under the recording conditions shown below, following input information:

Semiconductor laser: (HLP-1500, produced by Hitachi Seisakusho)
Semiconductor laser wavelength: 830 nm
Laser beam diameter: 1 μm
Laser output: 3 mW
Irradiation time of laser beam per 1 bit: 300 ns When the blue optical recording medium surface was irradiated with laser beam, the irradiated portion changed in color to red to effect recording. Evaluation of recording was conducted in the same manner as in Example 23-1 to obtain the results as shown in Table 23-4.

TABLE 23-4

| Example No. | Sample No. | Constitution of recording medium | Sensitivity | Resolution | Image density |
|---|---|---|---|---|---|
| 23-12 | 1 | G/40CR/60DA | ◉ | ◉ | 3.2 |
| | 2 | G/20CR/60DA/20CR | ◉ | ◉ | 3.2 |
| | 3 | G/30DA/40CR/30DA | ◉ | ◉ | 3.3 |
| | 4 | G/20x(2CR/3DA) | ◉ | ◉ | 3.5 |
| | 5 | G/10x(4CR/6DA) | ◉ | ◉ | 3.4 |
| | 6 | G/3x(2CR/2DA) | ◉ | ◉ | 1.8 |
| | 7 | G/5x(2CR/2DA) | ◉ | ◉ | 2.5 |
| | 8 | G/10x(5CR/5DA) | ◉ | ◉ | 3.2 |

G : Glass substrate
CR : Croconic methine dye
DA : Diacetylene derivative compound

EXAMPLE 24-1

A solution of 1 part by weight of a diacetylene derivative represented by $C_{12}H_{25}-C\equiv C-C\equiv C-C_8H_{16}-COOH$ and 1 part by weight of a polymethine compound represented by the above formula 5-16 dissolved at a concentration of $1\times10^{-3}$ mole/liter in chloroform was spread on an aqueous phase with pH 6.5 and a cadmium chloride concentration of $1\times10^{-3}$ mole/liter. After evaporation of the solvent chloroform, the surface pressure was raised to 20 dyne/cm and at the surface pressure maintained constantly, a glass substrate sufficiently cleaned having a hydrophilic surface was moved up and down in the direction transversing the water surface gently at a speed of 1.0 cm/min. to have a mixed monomolecular film of the DA compound and the polymethine compound transferred onto the substrate. Thus, optical recording media having a mixed monomolecular film and mixed monomolecular built-up films built up in 21 layers, 41 layers and 81 layers formed on the substrate, respectively, were prepared.

With a UV-ray of 254 nm, each of the optical recording media was irradiated uniformly and sufficiently to polymerize the DA compound in the recording layer to convert the recording medium to a blue film, and then recording was practiced under the conditions shown below, following input information.

Semiconductor laser (HLP-1500, produced by Hitachi Seisakusho)
Laser beam diameter: 1 μm
Laser output: 3 mW Irradiation time of laser beam per 1 bit: 300 ns When the blue optical recording medium surface was irradiated with laser beam, the irradiated portion changed in color to red to effect recording. Evaluations of recording were practiced as follows. The optical density at the recorded (red) portion was measured. The resolution and the sensitivity were judged by observing correspondence of the recorded image to laser beam diameter by means of a microscope, and those with very good results were rated as ⊚, those with good results as ○, those which could not be recorded or were inferior in correspondence as x. Evaluations of the recording results are shown in Table 24-1.

EXAMPLE 24-2

Each of the four kinds of the recording media prepared in Example 23-1, was irradiated with UV-ray of 254 nm uniformly and sufficiently to convert the recording layer to a blue film, and then recording was practiced under the recording conditions shown below, with the semiconductor used for recording being changed, following input information:

Semiconductor laser (HLP-7802, produced by Hitachi Seisakusho)
Laser beam diameter: 1 μm
Laser output: 3 mW
Irradiation time of laser beam per 1 bit: 300 ns Evaluations of recording were conducted according to the same standards as in Example 23-1 and the evaluation results are listed in Table 23-1.

EXAMPLES 24-3, 24-4, 24-5

The lasers used for recording were changed to those shown below, respectively, and writing and reading of the record were practiced under the recording conditions shown below, following otherwise the same conditions as in Example 24-1, to obtain the evaluation results as shown in Table 24-1.

EXAMPLE 24-3 semiconductor laser (Ga-As laser of heterostructure), laser wavelength: 890 nm.

EXAMPLE 24-4 semiconductor laser (Ga-As laser of heterostructure), laser wavelength: 950 nm.

EXAMPLE 24-4 xenon gas laser, laser wavelength: 752 nm.

TABLE 24-1

| Recording medium | Built-up number of films | Sensitivity | Resolution | Image density |
|---|---|---|---|---|
| Example 24-1 | 1 | ⊚ | ⊚ | 0.8 |
|  | 21 | ⊚ | ⊚ | 1.9 |
|  | 41 | ⊚ | ⊚ | 2.4 |
|  | 81 | ⊚ | ⊚ | 2.8 |
| Example 24-2 | 1 | ○ | ⊚ | 0.4 |
|  | 21 | ○ | ⊚ | 1.6 |
|  | 41 | ⊚ | ⊚ | 2.1 |
|  | 81 | ⊚ | ⊚ | 2.6 |
| Example 24-3 | 1 | ○ | ⊚ | 0.5 |
|  | 21 | ○ | ⊚ | 1.6 |
|  | 41 | ○ | ⊚ | 1.8 |
|  | 81 | ⊚ | ⊚ | 2.4 |
| Example 24-1 | 1 | x | x | — |
|  | 21 | x | x | — |
|  | 41 | x | x | — |
|  | 81 | ○ | ○ | 0.9 |
| Example | 1 | x | x | — |

TABLE 24-1-continued

| Recording medium | Built-up number of films | Sensitivity | Resolution | Image density |
|---|---|---|---|---|
| 24-2 | 21 | x | x | — |
|  | 41 | x | x | — |
|  | 81 | x | x | — |

EXAMPLE 24-6

According to the same procedure as in Example 24-1 except for using a diacetylene derivative compound represented by compound $C_8H_{17}-C\equiv C-C\equiv C-C_2H_4-COOH$ in place of the diacetylene derivative compound represented by $C_{12}H_{25}-C\equiv C-C\equiv C-C_8H_{16}-COOH$, an optical recording medium with a built-up number of 21 was prepared. For the optical recording medium, recording was practiced under the same recording condition as in Example 23-1. The evaluation results are shown in Table 24-2.

EXAMPLES 24-7 to 24-10

According to the same procedure as in Example 22-1 except for using the polymethine compounds represented by the formulae 5-3, 5-7, 5-20 and 5-28, respectively, in place of the polymethine compound represented by the formula 5-16, optical recording media were prepared. For the optical recording media, recording was practiced under the same recording conditions as in Example 24-1. The evaluation results are shown in Table 24-2.

TABLE 24-2

| Optical recording medium | Build-up number of films | Sensitivity | Resolution | Image density |
|---|---|---|---|---|
| Example 24-6 | 41 | ⊚ | ⊚ | 2.6 |
| Example 24-7 | 41 | ⊚ | ⊚ | 2.6 |
| Example 24-8 | 41 | ⊚ | ⊚ | 2.4 |
| Example 24-9 | 41 | ⊚ | ⊚ | 2.5 |
| Example 24-10 | 41 | ⊚ | ⊚ | 2.5 |

EXAMPLE 24-11

A coating solution obtained by dissolving 10 parts by weight of the polymethine compound represented by the formula 5-16 in 20 parts of methylene chloride was added dropwise in a small amount at the central portion of a disc substrate made of a glass (thickness 1.5 mm, diameter 200 mm) mounted on a spinner coating machine and coating was carried out by rotating the spinner for a predetermined time at a predetermined rotation speed, followed by drying at normal temperature, to prepare a number of samples with coated film thicknesses after drying of 300 Å and 3000 Å, respectively, on the substrate.

Next, a solution of the DA compound represented by $C_{12}H_{25}-C\equiv C-C\equiv C-C_8H_{16}-COOH$ dissolved at a concentration of $3\times10^{-3}$ mole/liter in chloroform was spread on an aqueous phase with pH 6.5 and a cadmium chloride concentration of $1\times10^{-3}$ mole/liter. After removal of the solvent chloroform by evaporation, the surface pressure was enhanced to 20 dyne/cm and at the surface pressure maintained constantly, a glass substrate having the polymethine compound layer previously formed thereon was moved up and down in the direction transversing the water surface gently at a speed of 1.0 cm/min. to have a DA monomolecular film transferred onto the polymethine compound layer. Thus, optical recording media having a monomolecular film and built-up films of 7 layers, 41 layers, 101 layers and 201 layers of monomolecular film formed on the substrate, respectively, were prepared.

With UV-ray of 254 nm, each of these optical recording media was irradiated uniformly and sufficiently to polymerize the DA compound in the recording layer, thereby converting the recording layer to a blue film, and then recording was practiced under the same recording conditions as in Example 24-1. Evaluation of recording was conducted in the same manner as in Example 24-1 to obtain the results as shown in Table 24-3.

TABLE 24-3

| Thickness of B layer | Built-up number of monomolecular films in A layer | Sensitivity | Resolution | Image density |
|---|---|---|---|---|
| 200 Å | 1 | ⊚ | ⊚ | 1.1 |
|  | 7 | ⊚ | ⊚ | 1.5 |
|  | 41 | ○ | ○ | 2.5 |
|  | 101 | x | x | — |
|  | 201 | x | x | — |
| 3000 Å | 1 | ⊚ | ⊚ | 0.8 |
|  | 7 | ⊚ | ⊚ | 1.2 |
|  | 41 | ⊚ | ⊚ | 2.7 |
|  | 101 | ⊚ | ⊚ | 2.9 |
|  | 201 | ⊚ | ⊚ | 3.1 |

EXAMPLE 24-12

A solution of the DA compound of the formula $C_{12}H_{25}-C\equiv C-C\equiv C-C_8H_{16}-COOH$ dissolved in chloroform at a concentration of $1\times10^{-3}$ mole/liter was spread on an aqueous phase of pH 6.5 and a cadmium chloride concentration of $1\times10^{-3}$ mole/liter. After evaporation of the solvent chloroform, the surface pressure was enhanced to 20 dyne/cm and at the surface pressure maintained constantly, a glass substrate sufficiently cleaned having a hydrophilic surface (including the case when a built-up film, etc. constituted of monomolecular film containing a polymethine compound had been already formed) was moved up and down in the direction transversing the water surface gently at a speed of 1.0 cm/min. for the desired number of times (including intermediate drying steps) to have monomolecular films of the DA compound transferred onto the substrate, thereby forming a monomolecular film of the DA compound or built-up films thereof.

A mixture of 1 part by weight of the polymethine compound represented by the above formula 5-16 and 2 parts of arachic acid was dissolved in chloroform at a concentration of $1\times10^{-3}$ mole/liter. The resulting solution was spread on an aqueous phase with pH 6.5 and a cadmium chloride concentration of $1\times10^{-3}$ mole/liter. After evaporation of the solvent chloroform, the surface pressure was enhanced to 20 dyne/cm and at the surface pressure maintained constantly, a glass substrate sufficiently cleaned having a hydrophilic surface (including the case when a built-up film, etc. constituted of monomolecular film containing DA compound had been already formed) was moved up and down in the direction transversing the water surface gently at a speed of 1.0 cm/min. for the desired number of times (including intermediate drying steps) to have monomolecular films containing the polymethine compound transferred onto the substrate, thereby forming a monomolecular film or built-up films thereof.

Based on the preparation processes of the monomolecular film of the DA compound as well as the monomolecular film containing the polymethine compound, 8 kinds of hetero-built-up films were prepared on glass substrates by suitable combinations thereof. The built-up films thus prepared (optical recording media) are shown in Table 24-4.

The symbols and the numerals shown for constitution of optical recording media have the following meanings.

G/20PM/60DA/20PM

A recording medium having a constitution built-up in the order of 20 layers of monomolecular films containing the polymethine compound→60 layers of monomolecular films of the DA compound→ 20 layers of molecular films containing the polymethine compound laminated on the glass substrate (G).

G/10x(2PM/6DA)

An optical recording medium having a constitution built-up, repeatedly for 10 times, of 2 layers of monomolecular films containing the polymethine compound and 6 layers of monomolecular films of the DA compound alternately on the glass substrate (G).

With UV-ray of 254 nm, each of the optical recording media was irradiated uniformly and sufficiently to make the recording layer a blue film, and then recording was practiced under the same conditions as in Example 24-1, following input information. Evaluation of recording was conducted in the same manner as in Example 24-1 to obtain the results as shown in Table 24-4.

TABLE 24-4

| Example No. | Sample No. | Constitution of recording medium | Sensitivity | Resolution | Image density |
|---|---|---|---|---|---|
| 24-12 | 1 | G/40PM/60DA | ○ | ○ | 2.9 |
|  | 2 | G/20PM/60DA/20PM | ⊚ | ○ | 3.0 |
|  | 3 | G/30DA/40PM/30DA | ⊚ | ○ | 3.0 |
|  | 4 | G/20x(2PM/3DA) | ⊚ | ⊚ | 3.2 |
|  | 5 | G/10x(4PM/6DA) | ⊚ | ⊚ | 3.2 |
|  | 6 | G/3X(2PM/2DA) | ⊚ | ⊚ | 1.6 |
|  | 7 | G/5x(2PM/2DA) | ⊚ | ⊚ | 1.7 |
|  | 8 | G/10x(5PM/5DA) | ⊚ | ⊚ | 3.2 |

By use of the present optical recording medium having a diacetylene derivative compound and at least one selected from the group consisting of azulenium salt compounds, pyrylium dyes, diene compounds, croconic methines and polymethine compounds, optical recording having higher sensitivity and higher resolution than when using a diacetylene derivative compound alone could be practiced.

In the following, the effects obtained by the recording medium and the recording method of the present invention are enumerated.

(1) Since the recording layer is formed of a monomolecular film of a DA compound alone or a mixture thereof or a built-up film thereof, it has high density and high orderliness, with few pinholes, and therefore has high signal/noise ratio to enable highly dense and uniform recording of high reliability.

(2) Since the recording layer contains at least one of azulenium salt compounds, pyrylium dyes, diene compounds, croconic methine dyes and polymethine compounds which can generate heat by absorbing IR-rays of 700 to 1000 nm, optical recording can be practiced by use of a semiconductor laser of small scale and light weight.

(3) Since recording by utilizing change in hue of the recording layer by light irradiation is possible, high speed, high sensitivity and high density optical recording can be practiced.

We claim:

1. An optical recording medium comprising a diacetylene compound and at least one compound selected from the group consisting of: (i) azulenium salt compounds, represented by the formula (II):

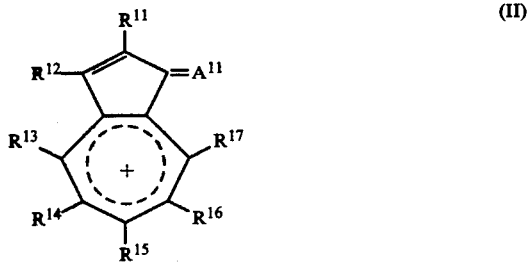

wherein $R^{11}$ to $R^{17}$ each represent a hydrogen atom, a halogen atom or a monovalent organic radical, and $A^{11}$ represents a divalent organic radical; (ii) diene compounds represented by the formula (III) or the formula (IV) shown below:

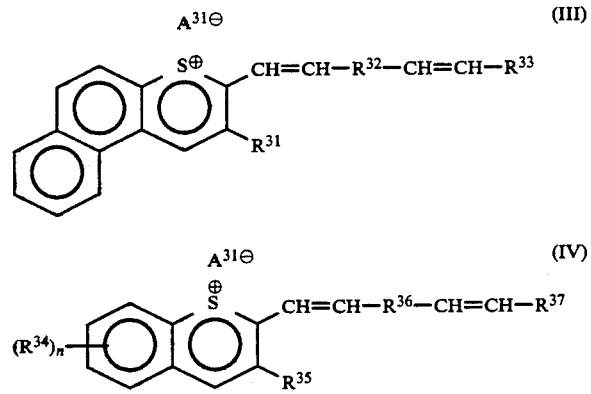

wherein $R^{31}$ represents an alkyl group, a phenyl or styryl group which may have a substituent, $R^{32}$ and $R^{36}$ represent arylene groups which may have a substituent for forming conjugated double bond systems with the two adjacent —CH=CH— groups, $R^{33}$ and $R^{37}$ represent phenyl or naphthyl groups which may have a substituent, $R^{34}$ represents an alkoxy group, $R^{35}$ represents an alkyl group and $A^{31\ominus}$ represents an anion residue; and (iii) croconic methine compounds having the following basic structure:

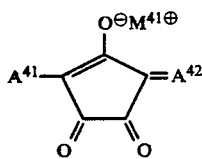

wherein $M^{41\oplus}$ represents a cation and $A^{41}$ and $A^{42}$ represent substituents containing an aromatic ring and-/or a heterocyclic ring; wherein either said diacetylene or at least one compound selected from the group consisting of said azulenium salt compounds, diene compounds, and croconic methine compounds has a Langmuir-Blodgett film structure.

2. An optical recording medium according to claim 1, wherein said diacetylene compound is represented by the formula (I):

$$H(CH_2)_m—C\equiv C—C\equiv C—(CH_2)_n—X \quad (I)$$

wherein X represents a hydrophilic group for forming hydrophilic site, and m and n represent integers.

3. An optical recording medium according to claim 1 comprising a mixed monomolecular film or a mixed monomolecular built-up film of said diacetylene compound and of the compound selected from the group consisting of azulenium salt compounds, diene compounds, and croconic methine compounds.

4. An optical recording medium according to claim 3, wherein said mixed monomolecular film or mixed monomolecular built-up film has a thickness ranging from about 500 Å to about 2 μm.

5. An optical recording medium according to claim 3, wherein the weight ratio of the diacetylene compound to the azulenium salt compound within a recording layer comprising said mixed monomolecular film or mixed monomolecular built-up film is about 1/15 to 15/1.

6. An optical recording medium according to claim 1 comprising a layer containing a monomolecular film of said diacetylene compound or a built-up film thereof, and a layer containing the compound selected from the group consisting of azulenium salt compounds, diene compounds, and croconic methine compounds.

7. An optical recording medium according to claim 6, wherein each of the two layers constituting the recording medium has a thickness ranging from about 100 Å to about 1 μm.

8. An optical recording medium according to claim 1 comprising at least one layer comprising a monomolecular film or said diacetylene compound or a built-up film thereof and at least one layer of a monomolecular film containing the compound selected from the group consisting of azulenium salt compounds, diene compounds, and croconic methine compounds or a built-up film thereof.

9. An optical recording medium according to claim 8, wherein the total film thickness of the diacetylene compound layers and the total film thicknesses of the layers of the compound selected from the group consisting of azulenium salt compounds, diene compounds, and croconic methine compounds are respectively in the range of about 100 Å to about 1 μm.

10. An optical recording medium according to claim 1 wherein a monomolecular film or a mixed monomolecular built-up film is formed from a molecular carrier composed of an organic compound having a salt of a compound selected from said group consisting of azulenium salt compounds, diene compounds, and croconic methine compounds.

11. An optical recording method comprising:
(a) a step of irradiating a diacetylene compound with a polymerizing radiation to form a polydiacetylene compound; and
(b) a step of writing onto an optical recording medium by irradiating with a radiation beam corresponding to recording information, said recording medium containing said polydiacetylene compound and at least one compound selected from the group consisting of (i) azulenium salt compounds represented by the formula (II):

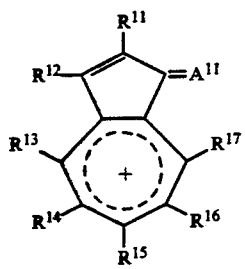

(II)

wherein $R^{11}$ to $R^{17}$ each represent a hydrogen atom, a halogen atom or a monovalent organic radical, and $A^{11}$ represents a divalent organic radical;

(ii) diene compounds represented by the formula (III) or the formula (IV) shown below:

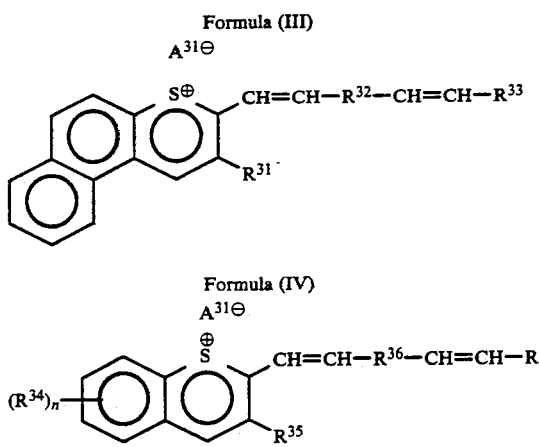

wherein $R^{31}$ represents an alkyl group, a phenyl or styryl group which may have a substitutent, $R^{32}$ and $R^{36}$ represent arylene groups which may have a substitutent for forming conjugated double bond systems with the two adjacent —CH=CH— groups, $R^{33}$ and $R^{37}$ represent phenyl or naphthyl groups which may have a substitutent, $R^{34}$ represents an alkoxy group, $R^{35}$ represents an alkyl group and $A^{31(-)}$ represents an anion residue;

(iii) croconic methine compounds having the following basic structure:

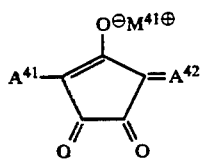

wherein $M^{41(+)}$ represents a cation and $A^{41}$ and $A^{42}$ represent substituents containing an aromatic ring and/or a heterocyclic ring; and (iv) polymethine compounds represented by the formula (V) or the formula (VI) shown below:

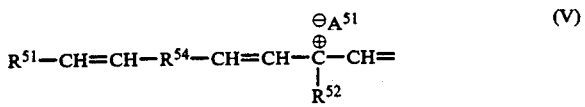
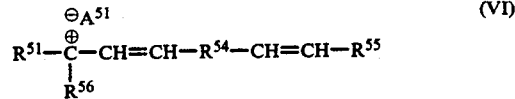

wherein $R^{51}$, $R^{52}$ and $R^{53}$ each independently represent an aryl group which may have a substituent, $R^{54}$ and $R^{55}$ represent arylene groups which may have a substituent for forming conjugated double bond systems with the adjacent two —CH=CH— groups, $R^{56}$ represents hydrogen or an aryl group which may have a substituent and $A^{51(-)}$ represents an anion residue to cause color change of the polydiacetylene compound.

12. An optical recording method according to claim 11 wherein said radiation beam is a ray of 700 to 1000 nm.

13. An optical recording medium, comprising a diacetylene compound and a polymethine compound represented by formulas (V) or (VI):

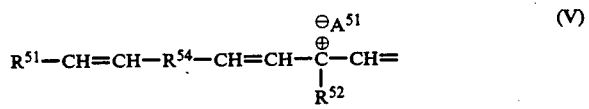
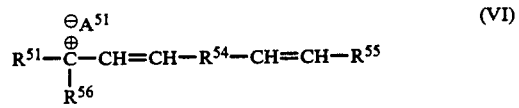

wherein $R^{51}$, $R^{52}$ and $R^{53}$ each independently represent an aryl group which may have a substituent, $R^{54}$ and $R^{55}$ represent arylene groups which may have a substituent for forming conjugated double bond systems with the adjacent two —CH=CH— groups, $R^{56}$ represents hydrogen or an aryl group which may have a substituent and $\oplus A^{51}$ represents an anion residue, wherein either said diacetylene compound or said polymethine compound has a Langmuir-Blodgett film structure.

14. An optical recording medium according to claim 13, wherein said diacetylene compound is represented by the formula (I):

wherein X represents a hydrophilic group for forming hydrophilic site, and m and n represent integers.

15. An optical recording medium according to claim 13, comprising a mixed monomolecular film or a mixed monomolecular built-up film of said diacetylene compound and said polymethine compound.

16. An optical recording medium according to claim 15, wherein said mixed monomolecular film or mixed monomolecular built-up film has a thickness ranging from about 500 Å to about 2 μm.

17. An optical recording medium according to claim 13, comprising a layer containing a monomolecular film of said diacetylene compound or a built-up film thereof, and a layer containing said polymethine compound.

18. An optical recording medium according to claim 17, wherein each of the two layers constituting the recording medium has a thickness ranging from about 100 Å to about 1 μm.

19. An optical recording medium according to claim 13, comprising at least one layer comprising a monomolecular film of said diacetylene compound or a built-up film thereof and at least one layer of monomolecular film of said polymethine compound or a built-up film thereof.

20. An optical recording medium according to claim 19, wherein the total film thickness of the diacetylene compound layers and the total film thicknesses of the polymethine compound layers are respectively in the range of about 100 Å to about 1 μm.

21. An optical recording medium according to claim 13, wherein a monomolecular film or a mixed monomolecular built-up film is formed from a molecular carrier composed of an organic compound having the polymethine compound.

22. An optical recording medium, comprising a polydiacetylene compound and at least one compound selected from the group consisting of azulenium salt compounds, pyrylium dyes, diene compounds, and croconic methine compounds wherein either said polydiacetylene or at least one compound selected from the group consisting of azulenium salt compounds, pyrylium dyes, diene compounds, and croconic methine compounds has a Langmuir-Blodgett film structure.

23. An optical recording medium according to claim 22, wherein said polydiacetylene compound having a structure unit represented by the formula (I):

$$H(CH_2)_m-C\equiv C-C\equiv C-(CH_2)_n-X \quad (I)$$

wherein X represents a hydrophilic group for forming hydrophilic site, and m and n represent integers.

24. An optical recording medium according to claim 22, wherein said azulenium salt compounds are represented by the formula (II):

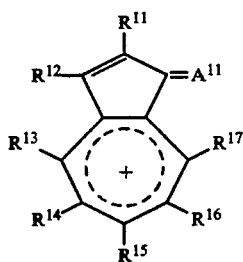

(II)

wherein $R^{11}$ to $R^{17}$ each represent a hydrogen atom, a halogen atom or a monovalent organic radical, and $A^{11}$ represents a divalent organic radical.

25. An optical recording medium according to claim 22, wherein said pyrylium dyes have the following basic structure:

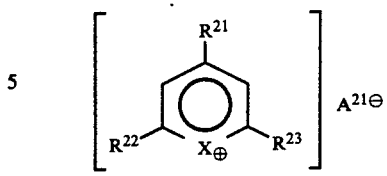

wherein X represents an oxygen atom, a sulfur atom or a selenium atom, $R^{21}$, $R^{22}$ and $R^{23}$ represent various organic radicals and $A^{21\ominus}$ represents an anion.

26. An optical recording medium according to claim 22, wherein said diene compounds are represented by the formula (III) or the formula (IV) shown below:

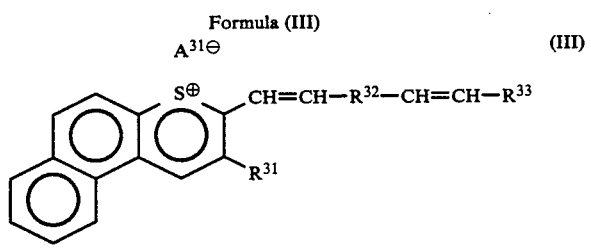

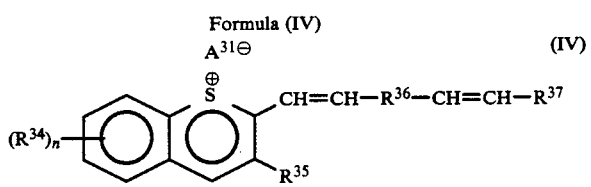

wherein $R^{31}$ represents an alkyl group, a phenyl or styryl group which may have a substituent, $R^{32}$ and $R^{36}$ represent arylene groups which may have a substituent for forming conjugated double bond systems with the two adjacent —CH=CH— groups, $R^{33}$ and $R^{37}$ represent phenyl or naphthyl groups which may have a substituent, $R^{34}$ represents an alkoxy group, $R^{35}$ represents an alkyl group and $A^{31\ominus}$ represents an anion residue.

27. An optical recording medium according to claim 22, wherein said croconic methine compounds have the following basic structure:

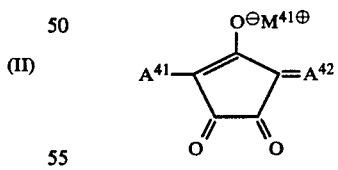

wherein $M^{41\oplus}$ represents a cation and $A^{41}$ and $A^{42}$ represent substituents containing an aromatic ring and/or a heterocyclic ring.

28. An optical recording medium according to claim 22, comprising a mixed monomolecular film or a mixed monomolecular built-up film of said polydiacetylene compound and of the compound selected from the group consisting of azulenium salt compounds, pyrylium dyes, diene compounds, and croconic methine compounds.

29. An optical recording medium according to claim 28, wherein said mixed monomolecular film or mixed monomolecular built-up film has a thickness ranging from about 500 Å to about 2 μm.

30. An optical recording medium according to claim 28, wherein the weight ratio of the polydiacetylene compound to said azulenium salt compound within a recording layer comprising said mixed monomolecular film or mixed monomolecular built-up film is about 1/15 to 15/1.

31. An optical recording medium according to claim 22, comprising a layer containing a monomolecular film of said polydiacetylene compound or a built-up film thereof, and a layer containing the compound selected from the group consisting of azulenium salt compounds, pyrylium dyes, diene compounds, croconic methine compounds.

32. An optical recording medium according to claim 31, wherein each of the two layers constituting the recording medium has a thickness ranging from about 100 Å to about 1 μm.

33. An optical recording medium according to claim 22, comprising at least one layer comprising a monomolecular film of said polydiacetylene compound or a built-up film thereof and at least one layer of a monomolecular film containing the compound selected from the group consisting of azulenium salt compounds, pyrylium dyes, diene compounds, and croconic methines, or a built-up film thereof.

34. An optical recording medium according to claim 33, wherein the total film thicknesses of the polydiacetylene compound layers and the total film thicknesses of the layers of the compound selected from the group consisting of azulenium salt compounds, pyrylium dyes, diene compounds, and croconic methine compounds are respectively in the range of about 100 Å to about 1 μm.

35. An optical recording medium according to claim 22, wherein a monomolecular film or a mixed monomolecular built-up film is formed from a molecular carrier composed of an organic compound having a salt of a compound selected from said group consisting of azulenium salt compounds, pyrylium dyes, diene compounds, and croconic methine compounds.

36. An optical recording medium, comprising a polydiacetylene compound and a polymethine compound represented by the formulas V or VI:

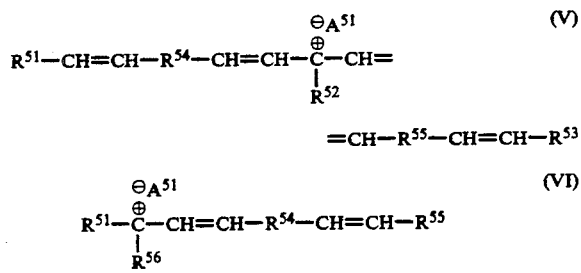

wherein $R^{51}$, $R^{52}$ and $R^{53}$ each independently represent an aryl group which may have a substituent, $R^{54}$ and $R^{55}$ represent arylene groups which may have a substituent for forming conjugated double bond systems with the adjacent two —CH=CH— groups, $R^{56}$ represents hydrogen or an aryl group which may have a substituent and $\ominus A^{51}$ represents an anion residue, wherein either said polydiacetylene compound or said polymethine compound has a Langmuir-Blodgett film structure.

37. An optical recording medium according to claim 36, wherein said polydiacetylene compound has a structure unit represented by the formula (I):

$$H(CH_2)_m\text{—}C\equiv C\text{—}C\equiv C\text{—}(CH_2)_n\text{—}X \qquad (I)$$

wherein X represents a hydrophilic group for forming hydrophilic site, and m and n represent integers.

38. An optical recording medium according to claim 36, comprising a mixed monomolecular film or a mixed monomolecular built-up film of said polydiacetylene compound and said polymethine compound.

39. An optical recording medium according to claim 38, wherein said mixed monomolecular film of mixed monomolecular built-up film has a thickness ranging from about 500 Å to about 2 μm.

40. An optical recording medium according to claim 36, comprising a layer containing a monomolecular film of said polydiacetylene compound or a built-up film thereof, and a layer containing said polymethine compound.

41. An optical recording medium according to claim 40, wherein each of the two layers constituting the recording medium has a thickness ranging from about 100 Å to about 1 μm.

42. An optical recording medium according to claim 36, comprising at least one layer comprising a monomolecular film of said polydiacetylene compound or a built-up film thereof and at least one layer of a monomolecular film of said polymethine compound or a built-up film thereof.

43. An optical recording medium according to claim 42, wherein the total film thicknesses of the polydiacetylene compound layers and the total film thickness of the polymethine compound layers are respectively in the range of about 100 Å to about 1 μm.

44. An optical recording medium according to claim 36, wherein a monomolecular film or a mixed monomolecular built-up film is formed from a molecular carrier composed of an organic compound having the polymethine compound.

45. An optical recording method according to claim 11, wherein either said polydiacetylene compound or said at least one compound selected has a Langmuir-Blodgett film structure.

46. An optical recording method according to claim 11, wherein said polydiacetylene compound has a structure unit represented by the formula (I):

$$H(CH_2)_m\text{—}C\equiv C\text{—}C\equiv C\text{—}(CH_2)_n\text{—}X \qquad (I)$$

wherein x represents a hydrophilic group for forming hydrophilic site, and m and n represent integers.

47. An optical recording method comprising a step of writing onto an optical recording medium by irradiation with a radiation beam corresponding to recording information, the recording medium containing a diacetylene compound and at least one compound selected from the group consisting of (i) azulenium salt compounds represented by the formula (II):

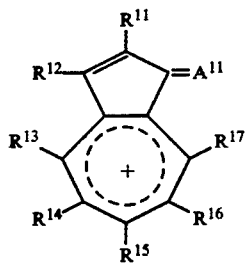

(II)

wherein $R^{11}$ to $R^{17}$ each represent a hydrogen atom, a halogen atom or a monovalent organic radical, and $A^{11}$ represents a divalent organic radical; (ii) diene compounds represented by the formula (III) or the formula (IV) as follows:

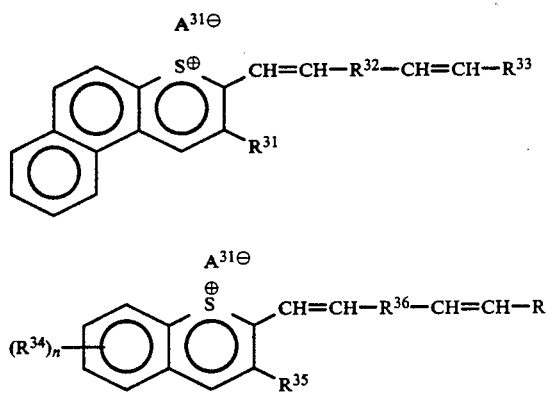

wherein $R^{31}$ represents an alkyl group, a phenyl or styryl group which may have a substituent, $R^{32}$ and $R^{36}$ represent arylene groups which may have a substituent for forming conjugated double bond systems with the two adjacent —CH=CH— groups, $R^{33}$ and $R^{37}$ represent phenyl or naphthyl groups which may have a substituent, $R^{34}$ represents an alkoxy group, $R^{35}$ represents an alkyl group and $A^{31\ominus}$ represents an anion residue; and (iii) croconic methine compounds having the following basic structure:

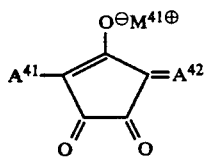

wherein $M^{41\oplus}$ represents a cation and $A^{41}$ and $A^{42}$ represent substituents containing an aromatic ring and-/or a heterocyclic ring, to cause color change of the diacetylene compound.

48. An optical recording method according to claim 47 wherein either said diacetylene or said at least one compound selected from the group consisting of azulenium salt compounds, diene compounds, and croconic methine compounds has a Languir-Blodgett film structure.

49. An optical recording method according to claim 47 wherein said diacetylene compound is represented by the formula (I):

$$H(CH_2)_m-C\equiv C-C\equiv C-(CH_2)_n-X \qquad (I)$$

wherein X represents a hydrophilic group for forming hydrophilic site, and m and n represent integers.

50. An optical recording method comprising a step of writing onto an optical recording medium by irradiating with a radiation beam corresponding to a diacetylene compound and a polymethine compound represented by formulas V or VI to cause color change of the diacetylene compound:

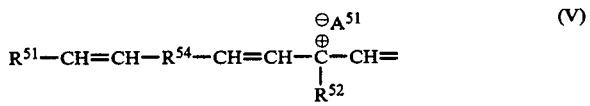

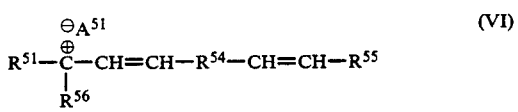

wherein $R^{51}$, $R^{52}$ and $R^{53}$ each independently represent an aryl group which may have a substituent, $R^{54}$ and $R^{55}$ represent arylene groups which may have a substituent for forming conjugated double bond systems with the adjacent two —CH=CH— groups, $R^{56}$ represents hydrogen or an aryl group which may have a substituent and $\ominus A^{51}$ represents and anion residue.

51. An optical recording method according to claim 50 wherein either said diacetylene or said polymethine compounds have a Langmuir-Blodgett film structure.

52. An optical recording method according to claim 50 wherein said diacetylene compound is represented by the formula (I):

$$H(CH_2)_m-C\equiv C-C\equiv C-(CH_2)_n-X \qquad (I)$$

wherein X represents a hydrophilic group for forming hydrophilic site, and m and n represent integers.

* * * * *

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 1

Line 59, "may vary" should be deleted.

COLUMN 3

Line 6, "may" should read --may be--.

COLUMN 4

Line 26, "amionic" should read --anionic--.

COLUMN 5

Formula 1-10, "$O^{\ominus}$" should read --$O^-$--.

COLUMN 7

Formula 1-11, "$O^{\ominus}$" should read --$O^-$--.

COLUMN 18

Lines 27-28, "selenilum" should read --selenium--.

COLUMN 24

Line 53, Insert --Formula 3-1--.
Line 63, Insert --Formula 3-2--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 33

Line 12, "alalkyl" should read --aralkyl--.
Line 45, "etc.," should read --etc.),--.

COLUMN 44

Formula 4-41, "  should read 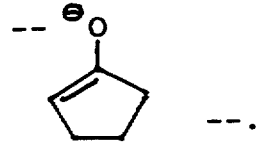 --.

COLUMN 46

Line 2, "radicals" should read --radical--.
Line 7, "$ClSO_3^{\ominus}$," should read --$ClSO_3^{\ominus}$.--.

COLUMN 59

Formula 5-31, " 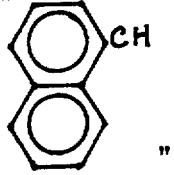 should read 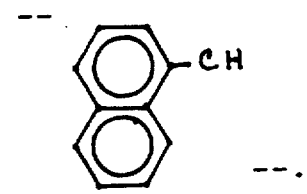 --.

COLUMN 63

Line 12, "are" should be deleted.
Line 42, "FIG. 3C." should read --FIG. 3C).--.
Line 56, "is" should be deleted.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

Page 3 of 17

It is certified that error appears in the above-identified patent and that said Letters Patent is hereby corrected as shown below:

COLUMN 64

Line 2, "pressure $\pi$" should read --pressure $\Pi$--.
    Line 4, "$\pi A=KT$," should read --$\Pi A=KT$,--.
    Line 24, "pressure $\pi$" should read --pressure $\Pi$--.
    Line 28, "pressure $\pi$" should read --pressure $\Pi$--.

COLUMN 66

Line 15, "carbonate," should read --carbonate),--.
    Line 33, "acetonitrrile" should read --acetonitrile--.

COLUMN 67

Line 15, "15 to 15/1," should read --1/15 to 15/1,--.

COLUMN 68

Line 18, "GaBs" should read --GaAs--.
    Line 30, "absorb" should read --absorbs--.

COLUMN 69

Line 44, "compound by" should read --compound represented by--.

COLUMN 70

Line 13, "Example 1-1 to 1-10" should read --Examples 1-1 to 1-10--.
    Line 27, "as O and" should read --as O, and--.
    TABLE 1-1, "Build-up" should read --Built-up--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 71

TABLE 1-1-continued, "Build-up" should read --Built-up--.

COLUMN 73

TABLE 1-2, "TABLE 1-2" should read --TABLE 1-3--.

COLUMN 75

Line 19, "compound by" should read --compound represented by--.

COLUMN 77

Line 1, "as ○," should read --as ◉,--.
    Line 48, "the the" should read --the--.
    Line 49, "example 3-3" should read --example 3-1--.
    Line 62, "EXAMPLE" should read --EXAMPLES--.

COLUMN 78

Line 42, "$V_{12}H_{25}$" should read --$C_{12}H_{25}$--.
    Line 53, "monomolecular" should read --monomolecular film--.

COLUMN 79

Line 3, "as ," should read --as ◉,--.
    Line 4, "as ," should read --as ○,--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 79

Line 9, "for a" should read --for using a--.
Line 31, "homegeneous" should read --homogeneous--.
Line 33, "deacetylene" should read --diacetylene--.
Line 35, "of" (third occurrence) should read --or--.

TABLE 4-2, "                    salt
            100 Å   200 Å   1000 Å   3000 Å   6000 Å "

should read --                    salt
            ‾100 Å‾ ‾200 Å‾ ‾1000 Å‾ ‾3000 Å‾ ‾6000 Å‾ --.

COLUMN 80

Line 21, "DA monomolecular" should read
--DA monomolecular film--.
Line 30, "suffuciently" should read --sufficiently--.
Line 43, "as O," should read --as ⊚,--.

COLUMN 81

Line 13, "example 5-2" should read --example 5-1--.
Line 36, "clealy" should read --clearly--.
Line 42, "by" (second occurrence) should be deleted.
Line 52, "procesure" should read --procedure--.

UNITED STATES PATENT AND TRADEMARK OFFICE
CERTIFICATE OF CORRECTION

PATENT NO. : 5,004,671

DATED : April 2, 1991

INVENTOR(S) : YUKUO NISHIMURA, ET AL.

Page 6 of 17

It is certified that error appears in the above-identified patent and that said Letters Patent is hereby corrected as shown below:

COLUMN 82

Line 12, "part" should read --1 part-- and "thyopyrylium" should read --thiopyrylium--.

COLUMN 83

Line 7, "monomlecular" should read --monomolecular film--.
    Line 28, "as ○," should read --as ⊚,--.
    TABLE 6-1, "Exapmle 6-1" should read --Example 6-1--.

COLUMN 84

Line 28, "by" (second occurrence) should be deleted.
    Line 31, "$C_{12}H_{25}-C=-C\equiv C-C_8H_{16}-COOH$" should read --$C_{12}H_{25}-C\equiv C-C\equiv C-C_8H_{16}-COOH$--.
    Line 33, "of" (third occurrence) should be deleted.

COLUMN 85

Line 15, "DA monomolecular" should read --DA monomolecular film--.
    Line 27, "layer beam" should read --laser beam--.
    Line 37, "as ○," should read --as ⊚,--.

COLUMN 86

Line 42, "by" (second occurrence) should be deleted.
    Line 47, "of" (third occurrence) should be deleted.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 87

Line 37, "DA monomolecular" should read
        --DA monomolecular film--.
    Line 58, "as ○," should read --as ⊙,--.

COLUMN 88

Line 62, "by" (second occurrence) should be deleted.
    Line 67, "of" (third occurrence) should be deleted.

COLUMN 89

Line 68, "$C_{12}H_{23}$" should read --$C_{12}H_{25}$--.

COLUMN 90

Line 60, "as  ," should read --as ⊙,--.
    Line 61, "as  ," should read --as ○,--.

COLUMN 91

Line 12, " ○ one" should read -- ○, one--.
    Line 62, "fiml" should read --film--.

COLUMN 92

Line 1, "By" should read --The--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 93

Line 16, "as ○," should read --as ⊚,--.
Line 17, "as ○," should read --as ○,--.
Line 22, "lutput." should read --output.--.

Line 42, "as ○" should read --as ○,--.

COLUMN 94

Line 42, "glass" should read --carrier--.

COLUMN 95

Line 23, "compount" should read --compound--.
Line 35, "example 11-1," should read --Example 11-1,--.
Line 44, " ⊚ those" should read -- ⊚, those-- and
" ○ and" should read -- ○, and--.
Line 50, "$C_8H_{17}C \equiv C-C \equiv C-C_4H_8-COOH$" should read
--$C_8H_{17}-C \equiv C-C \equiv C-C_4H_8-COOH$--.

COLUMN 96

TABLE 11-1, "C/40AZ/60DA" should read --G/40AZ/60DA--.

COLUMN 97

Line 30, "G/10X(2PL/6DA" should read --G/10X(2PL/6DA);--.
Line 65, " ○ those" should read --⊚, those-- and
" ○ and" should read -- ○, and--.

UNITED STATES PATENT AND TRADEMARK OFFICE
CERTIFICATE OF CORRECTION

PATENT NO. : 5,004,671

DATED : April 2, 1991

INVENTOR(S) : YUKUO NISHIMURA, ET AL.

It is certified that error appears in the above-identified patent and that said Letters Patent is hereby corrected as shown below:

COLUMN 98

Line 1, "layer beam" should read --laser beam--.
    Line 64, "Example 12-5" should read --Example 12-1--.

COLUMN 99

Line 3, "Example 12-8" should read --Example 12-1--.
    Line 10, "Example 12-8" should read --Example 12-1--.

COLUMN 100

Line 38, "builtup" should read --built-up--.

COLUMN 101

Line 61, "compound" should read --formula--.

COLUMN 103

Line 42, "consittution" should read --constitution--.

COLUMN 104

Line 56, "compound" should read --formula--.

COLUMN 105

Line 50, "polyethine" should read --polymethine--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 106

Line 33, "numbers" should read --numerals--.
Line 34, "means." should read --meanings.--.

COLUMN 107

Line 59, "compound" should read --formula--.

COLUMN 108

Line 45, "glass disc" should read --disc substrate--.

COLUMN 109

Line 5, "as ○," should read --as ⊙,--.

COLUMN 110

Line 41, "compound" should read --formula--.

COLUMN 111

Line 57, "as ○," should read --as ⊙,--.

COLUMN 113

Line 29, "in" should read --in Example 17-1.--.
Line 30, "EXAMPLE 17-1" should be deleted.
Line 47, "compound" should read --formula--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 115

Line 31, "as ○," should read --as ⊚,--.

COLUMN 116

Line 2, "EXAMPLE 18-3, 18-4, 18-5" should read
        --EXAMPLES 18-3, 18-4, 18-5--.

COLUMN 117

Line 37, "compound" should read --formula--.
    Line 52, "condition" should read --conditions--.

COLUMN 118

Line 65, "as ○," should read --as ⊚,--.

COLUMN 120

TABLE 19-1,

"Example    3000Å    Example 19-1  ⊚      2.6" should read
  --Example    3000Å    Example 19-1  ⊚  ⊚  2.6--.

Line 55, "compound" should read --formula--.
    Line 60, "condition" should read --conditions--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 121

Line 2, "condition" should read --conditions--.
Line 61, "as ○," should read --as ◉,--.

example
20-1 --                        and

| "Sensitivity | Resolution | should read | --Sensitivity | Resolution |
|---|---|---|---|---|
| ◉ | ◉ | | ◉ | ◉ |
| ◉ | ◉ | | ◉ | ◉ |
| ◉ | ◉ | | ◉ | ◉ |
| ◉ | ◉ | | ◉ | ◉ |
| X | X | | X | X |
| X | X | | ○ | X |
| ◉ | ◉ | | ◉ | ○ |
| ◉ | X | | X | X |
| X | X | | X | X |
| X | ◉ | | ○ | X |
| ◉ | X | | X | ○ |
| X | X | | X | X |
| X | X | | X | X |
| X | X" | | X | --. |

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 122

Line 57, "compound" should read --formula--.
Line 63, "condition" should read --conditions--.

COLUMN 123

Line 5, "condition" should read --conditions--.
Line 19, "EXAMPLE 20- 10" should read --Example 20-10--.
Line 39, "enchanced" should read --enhanced--.
Line 57, "reuslts" should read --results--.

TABLE 20-3,

"Sensitivity Resolution should read --Sensitivity Resolution ... --.

COLUMN 124

Line 62, "molecular" should read --monomolecular--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 125

Line 26, "represneted" should read --represented--.
   Line 65, "as ○," should read --as ⊙,--.

COLUMN 127

Line 17, "compound" should read --formula--.
   Line 23, "condition" should read --conditions--.
   Line 34, "tion" should read --tions--.
   Line 46, "EXAMPLE 20-11" should read --EXAMPLE 21-11--.
   Line 64, "Atfer" should read --After--.

COLUMN 128

Line 21, "TABLE 21-1" should read --TABLE 21-3--.
   Line 59, "mole/liter The" should read --mole/liter. The--.

COLUMN 129

Line 21, "molecular" should read --monomolecular--.

COLUMN 130

Line 27, "as ○," should read --as ⊙,--.
   Line 55, "Exmaple 22-1," should read --Example 22-1,--.

COLUMN 131

Line 27, "compound" should read --formula--.
   Line 33, "condition" should read --conditions--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 131

TABLE 22-2, "Build-up" should read --Built-up--.

COLUMN 132

Line 13, "transfersing" should read --transversing--.

COLUMN 133

Line 27, "molecular" should read --monomolecular--.
Line 36, "254 nm each" should read --254 nm, each--.

COLUMN 134

Line 30, "as ○," should read --as ⊚,--.
Line 67, "(GA-As" should read --(Ga-As--.

COLUMN 135

Line 47, "Exmaple 23-1" should read --Example 23-1--.
Line 49, "compound" should read --formula--.
Line 55, "condition" should read --conditions-- and
"Exmaple 23-1." should read --Example 23-1.--.

COLUMN 136

TABLE 23-2, "Build-up" should read --Built-up--.

COLUMN 138

Line 7, "media," should read --media--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 139

Line 10, "as ○," should read --as ⊚,--.
Line 17, "Example 23-1," should read --Example 24-1,--.
Line 30, "Table 23-1." should read --Table 24-1.--.
TABLE 24-1, "Example
    24-1 "   (second occurrence)
should read  --Example
               24-4 --.

COLUMN 140

Line 13, "compound" should read --formula--.
Line 19, "condition" should read --conditions--.
TABLE 24-2, "Build-up" should read --Built-up--.

COLUMN 142

Line 15, "molec-" should read --monomolec- --.

COLUMN 145

Line 46, "substitutent" should read --substituent--.
Line 49, "substitutent," should read --substituent,--.

COLUMN 146

Line 48, " $\oplus A^{51}$ " should read -- $\ominus A^{51}$ --.

COLUMN 147

Line 38, "having" should read --has--.

UNITED STATES PATENT AND TRADEMARK OFFICE
CERTIFICATE OF CORRECTION

PATENT NO. : 5,004,671
DATED : April 2, 1991
INVENTOR(S) : YUKUO NISHIMURA, ET AL.

It is certified that error appears in the above-identified patent and that said Letters Patent is hereby corrected as shown below:

COLUMN 149

Line 26, "methines," should read --methine compounds,--.
    Line 45, "formulas V or VI:" should read
          --formulas (V) or (VI):--.

COLUMN 150

Line 16, "of" should read --or--.
    Line 59, "x" should read --X--.

COLUMN 152

Line 7, "Languir-Blodgett" should read
          --Langmuir-Blodgett--.

Signed and Sealed this

Thirtieth Day of July, 1996

Attest:

BRUCE LEHMAN

Attesting Officer      Commissioner of Patents and Trademarks